US010128277B2

(12) United States Patent
Kawamura et al.

(10) Patent No.: US 10,128,277 B2
(45) Date of Patent: *Nov. 13, 2018

(54) DISPLAY DEVICE

(71) Applicant: Panasonic Liquid Crystal Display Co., Ltd., Hyogo (JP)

(72) Inventors: Tetsuya Kawamura, Hyogo (JP); Tetsurou Izawa, Hyogo (JP)

(73) Assignee: PANASONIC LIQUID CRYSTAL DISPLAY CO., LTD., Hyogo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 15/880,005

(22) Filed: Jan. 25, 2018

(65) Prior Publication Data

US 2018/0151594 A1 May 31, 2018

Related U.S. Application Data

(63) Continuation of application No. 14/868,958, filed on Sep. 29, 2015, which is a continuation of application No. PCT/JP2013/007602, filed on Dec. 25, 2013.

(30) Foreign Application Priority Data

Mar. 29, 2013 (JP) .................................. 2013-073079

(51) Int. Cl.
*H01L 27/12* (2006.01)
*G02F 1/1345* (2006.01)
(Continued)

(52) U.S. Cl.
CPC .......... *H01L 27/124* (2013.01); *G02F 1/1345* (2013.01); *G02F 1/136286* (2013.01);
(Continued)

(58) Field of Classification Search
CPC ..... H01L 27/124; H01L 27/1248; G09G 3/20; G09G 2330/028; G09G 2300/0426;
(Continued)

(56) References Cited

U.S. PATENT DOCUMENTS 8,994,886 B2 * 3/2015 Sugisaka ............... G02F 1/1345
349/40
2006/0176413 A1 8/2006 Moriya
(Continued)

FOREIGN PATENT DOCUMENTS

JP  05-297404  11/1993
JP  6-160895   6/1994
(Continued)

OTHER PUBLICATIONS

International Search Report dated Apr. 8, 2014 in International (PCT) Application No. PCT/JP2013/007602.

*Primary Examiner* — Abhishek Sarma
(74) *Attorney, Agent, or Firm* — Wenderoth, Lind & Ponack, L.L.P.

(57) ABSTRACT

A display device includes a plurality of gate lines extending in a first direction on the display area, a plurality of source lines extending in a second direction, a plurality of lead-out lines extending in the second direction and for transmitting gate signals to the plurality of gate lines. A plurality of connecting portions each electrically connects one gate line to one lead-out line. The plurality of connecting portions pass through a first insulating layer at a plurality of jointing points which are selected among a plurality of overlapping points where the plurality of lead-out lines and the plurality of gate lines overlap in a plane area.

6 Claims, 45 Drawing Sheets

(51) Int. Cl.
*G02F 1/1362* (2006.01)
*G06T 5/20* (2006.01)
*G09G 3/20* (2006.01)
*G09G 3/36* (2006.01)

(52) U.S. Cl.
CPC ............... *G06T 5/20* (2013.01); *G09G 3/20* (2013.01); *H01L 27/1248* (2013.01); *G02F 2001/13456* (2013.01); *G02F 2201/42* (2013.01); *G09G 3/3648* (2013.01); *G09G 2300/0413* (2013.01); *G09G 2300/0426* (2013.01); *G09G 2330/028* (2013.01)

(58) Field of Classification Search
CPC .......... G09G 2300/0413; G09G 3/3648; G02F 1/1345; G02F 1/136286; G02F 2001/13456; G02F 2201/42; G06T 5/20
See application file for complete search history.

(56) References Cited

U.S. PATENT DOCUMENTS

| | | |
|---|---|---|
| 2012/0026420 A1 | 2/2012 | Saitoh |
| 2012/0057091 A1 | 3/2012 | Kawabata et al. |
| 2013/0235279 A1 | 9/2013 | Sugisaka |
| 2016/0020224 A1* | 1/2016 | Kawamura ....... G02F 1/136286 345/213 |

FOREIGN PATENT DOCUMENTS

| | | |
|---|---|---|
| JP | 2000-164874 | 6/2000 |
| JP | 2000-276110 | 10/2000 |
| JP | 2006-215305 | 8/2006 |
| JP | 2008-66537 | 3/2008 |
| JP | 2012-32608 | 2/2012 |
| WO | 2010/134439 | 11/2010 |
| WO | 2012/070498 | 5/2012 |

* cited by examiner

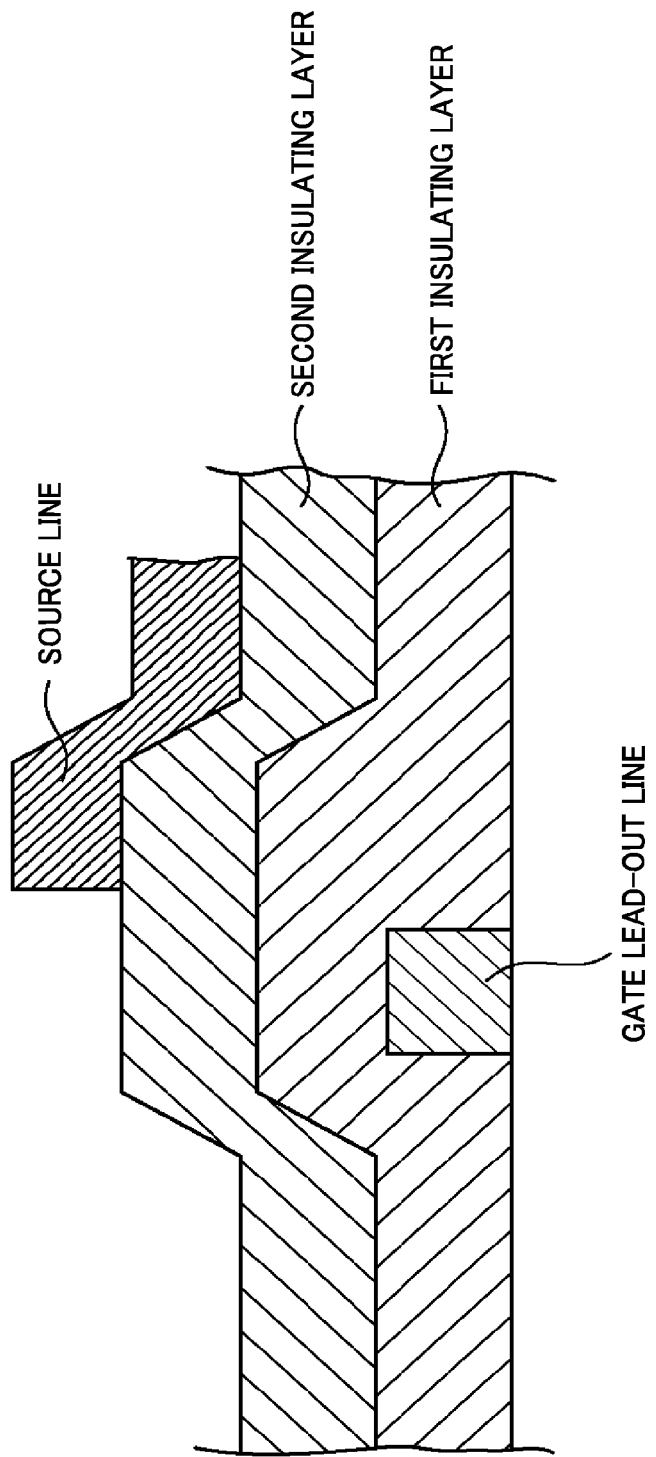

Overlapping point A
[Gate lead-out line : Presence]

Overlapping point B
[Gate lead-out line : Absence]

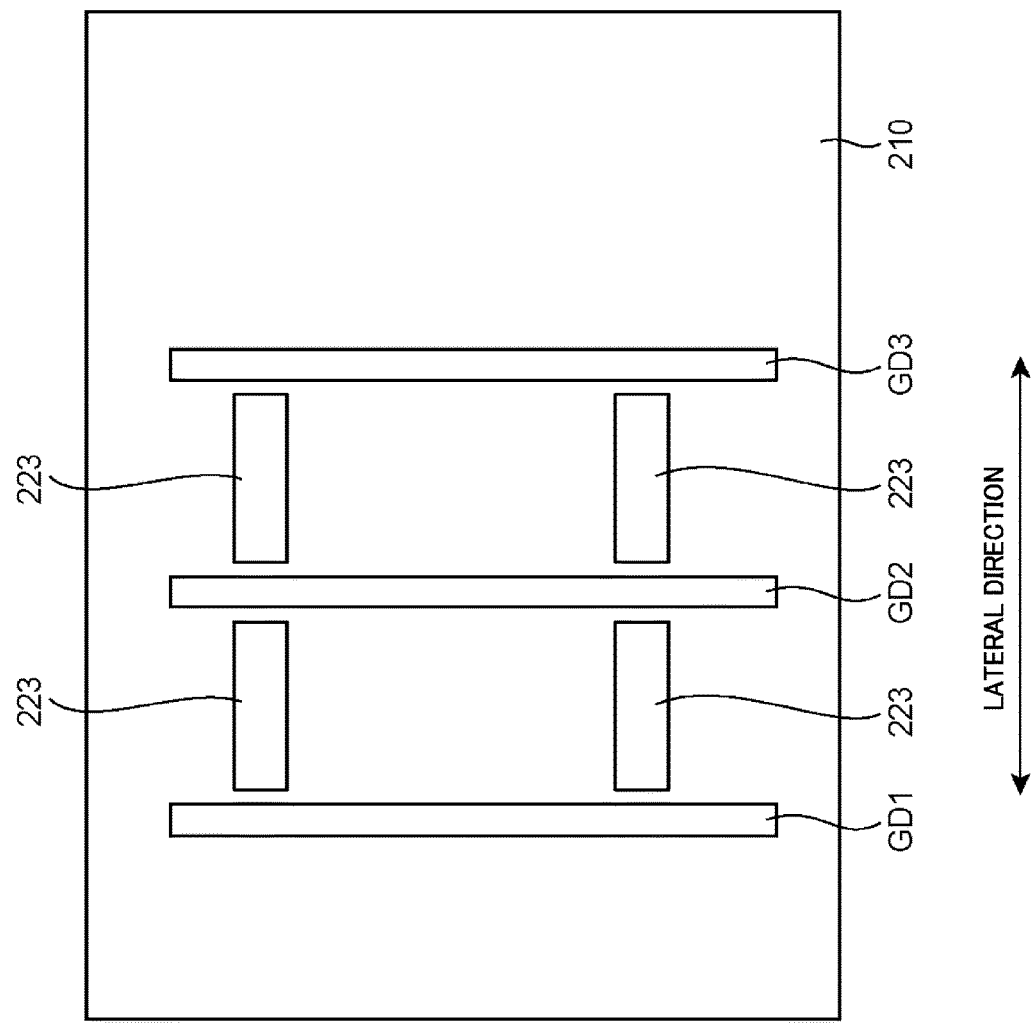

DISPLAY DEVICE

CROSS-REFERENCE TO RELATED APPLICATION

This application is Bypass Continuation of international patent application PCT/JP2013/007602, filed: Dec. 25, 2013 designating the United States of America, the entire disclosure of which is incorporated herein by reference. Priority is claimed based on Japanese patent application JP2013-073079, filed: Mar. 29, 2013. The entire disclosure of Japanese patent application JP2013-073079 is incorporated herein by reference in its entirety.

BACKGROUND

1. Technical Field

This disclosure relates to a display device displaying images.

2. Description of the Related Art

Generally, a display device comprises a substantially rectangular shaped display area where images are displayed and a substantially rectangular shaped housing to hold the display area. The housing includes an outer upper edge, an outer bottom edge which is a side opposite to the outer upper edge, an outer left edge and an outer right edge which is a side opposite to the outer left edge. The outer left edge and the outer right edge extend between the outer upper edge and the outer bottom edge. The outer upper edge, the outer bottom edge, the outer left edge and the outer right edge define an outer boundary of the housing. The housing includes an inner upper edge which is parallel with the outer upper edge, an inner bottom edge which is parallel with the outer bottom edge, an inner left edge which is parallel with the outer left edge and an inner right edge which is parallel with the outer right edge. The inner upper edge, the inner bottom edge, the inner left edge and the inner right edge define an opening in an area surrounded by the outer upper edge, the outer bottom edge, the outer left edge and the outer right edge. The display area is exposed from the opening.

The display device further includes gates lines extending laterally between the inner left edge and the inner right edge, source lines extending vertically between the inner upper edge and the inner bottom edge, a gate drive circuit to output scan signals (gate signals) to the gate lines and a source drive circuit to output image signals (source signals). As the gate lines extend laterally, a typical gate drive circuit is arranged between the outer left edge and the inner left edge and/or the outer right edge and the inner right edge. As the source lines extend vertically, a typical source drive circuit is arranged between the outer upper edge and the inner upper edge and/or between the outer bottom edge and the inner bottom edge (Japanese Unexamined Patent Application Publication No. 2012-32608).

Many users hope for a large display area, while they want a small display device. To meet these contradictory desires of the users, a rectangular shaped area between the outer left edge and the inner left edge, a rectangular shaped area between the outer right edge and the inner right edge, a rectangular shaped area between the outer upper edge and the inner upper edge and/or a rectangular shaped area the outer bottom edge and the inner bottom edge must be designed to be as narrow as possible.

SUMMARY

This disclosure is intended to provide a small display device having a large display area.

In one general aspect, the instant application describes a display device for displaying an image in a display area in accordance with image signals. The display device includes a plurality of gate lines extending in a first direction on the display area, a plurality of source lines extending in a second direction which is different from the first direction, a plurality of lead-out lines extending in the second direction and for transmitting gate signals to the plurality of gate lines, a first insulating layer formed between the plurality of lead-out lines and the plurality of gate lines and a plurality of connecting portions each electrically connecting one of the plurality of gate lines to one of the plurality of lead-out lines. The plurality of connecting portions pass through the first insulating layer at a plurality of jointing points, the jointing points being selected among a plurality of overlapping points where the plurality of lead-out lines and the plurality of gate lines overlap in a plane area, the plane area being defined by the first direction and the second direction.

This application provides a small display device having a big display area.

Objects, features, and advantages of the present disclosure will become more apparent from the following detailed description and the appended drawings.

BRIEF DESCRIPTION OF THE DRAWINGS

In the accompanying drawings:

FIG. 7C is a schematic cross section indicating another positional relationship between the gate lead-out line and the source line.

FIG. 22 is a schematic view of a forming process of the gate lead-out lines.

DETAILED DESCRIPTION

Figure 1:
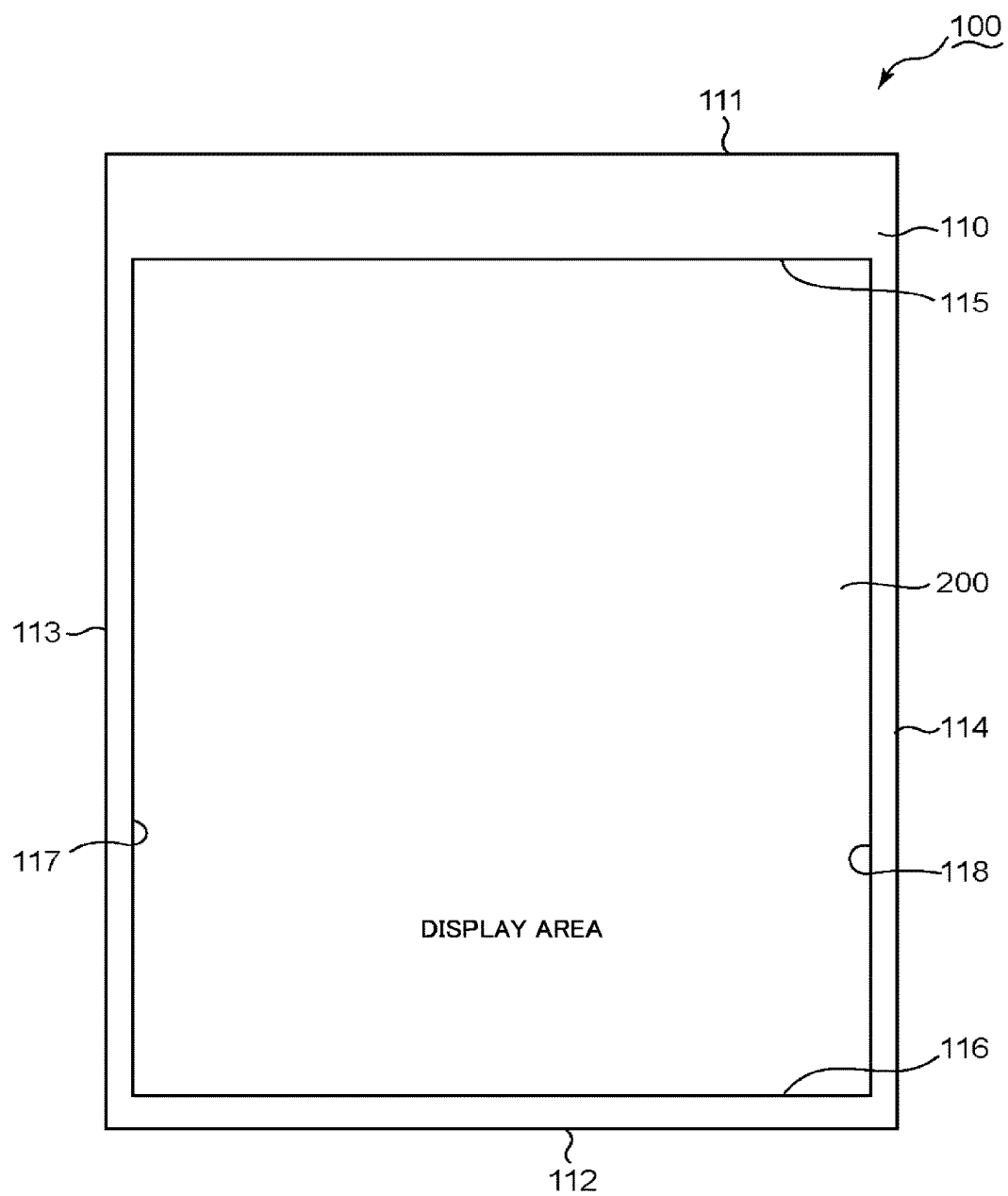
FIG. 1 is a schematic front elevation of an exemplary display device.

Exemplary display devices are described below with reference to the drawings. In the following embodiments, similar constituent elements are assigned with similar reference numerals. Redundant explanation is omitted as appropriate to clarify the description. Configurations, arrangements and shapes shown in the drawings and description relating to the drawings aim to make principles of the embodiments easily understood. Therefore, the principles of the present embodiments are not limited thereto.

It is to be understood that the following disclosure provides many different embodiments, or examples, for implementing different features of the present subject matter. Specific embodiments or examples of components and arrangements are described below to simplify the present disclosure. These are, of course, merely examples and are not intended to be limiting. For example, dimensions of elements are not limited to the disclosed range or values, but may depend upon process conditions and/or desired properties of the device. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity.

Further, spatially relative terms, such as "beneath," "below," "bottom," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. In addition, the term "made of" may mean either "comprising" or "consisting of."

First Embodiment (Basic Principle)

FIG. 1 is a schematic front elevation of an exemplary display device 100. With reference to FIG. 1, the display device 100 is described.

The display device 100 includes a housing 110 and a display panel 200. The display panel 200 may be various devices which can display images. For the display panel 200, a transmissive or reflective liquid crystal panel, or an organic electroluminescence (Electronic Luminescence) panel may be used. The housing 110 supports the display panel 200 properly. In addition, the housing 110 can contain various elements to operate the display panel 200.

The housing 110 includes an outer upper edge 111 extending in a substantially lateral direction at an upper part of the display panel 200, an outer bottom edge 112 extending in a substantially lateral direction at a bottom part of the display panel 200, an outer left edge 113 extending in a substantially vertical direction at a left part of the display panel 200 and an outer right edge 114 extending in a substantially vertical direction at a right part of the display panel 200. The inner upper edge 115, the inner bottom edge 116, the inner left edge 117 and the inner right edge 118 define a boundary of an opening which exposes the display panel 200. A surface of the display panel 200 exposed from the opening is referred as a "display area". Images are displayed in the display area in accordance with image signals input to the display device 100.

The basic principle described with respect to this embodiment contributes to a reduction of elements arranged between the outer left edge 113 and the inner left edge 117 and/or between the outer right edge 114 and the inner right edge 118. Thus, the display device 100 is able to possess a large display area.

Figure 2:
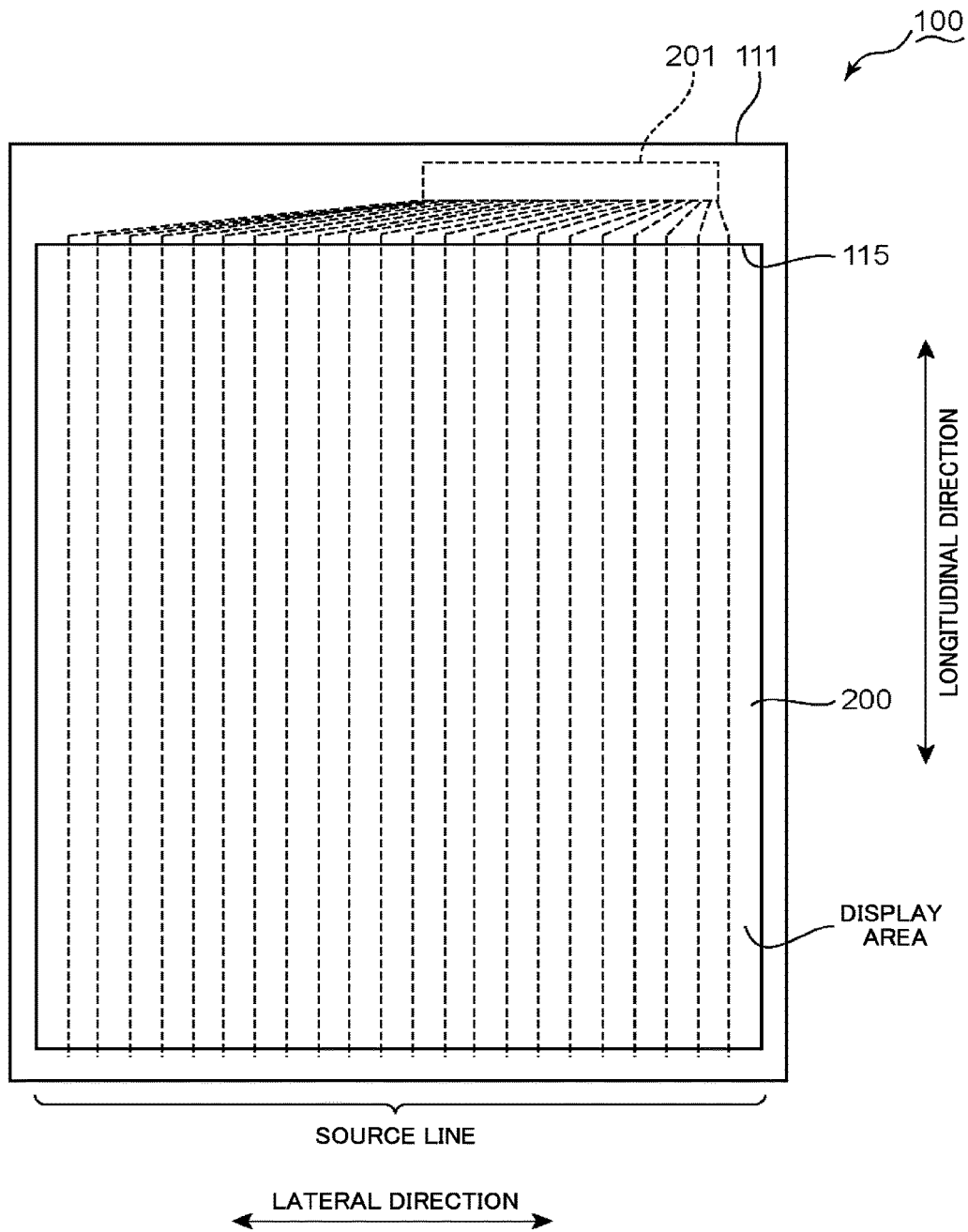
FIG. 2 is a schematic front elevation of the display device shown in FIG. 1.

FIG. 2 is a schematic front elevation of the display device 100. The display device 100 is further described with reference to FIG. 2

The display device 100 is provided with source lines and a source driver 201 which outputs image signals to each source line. Each source line extends in the longitudinal direction on the display area. In addition, the source lines are arranged laterally at substantially the same interval. In the following explanation, image signals which are output from the source driver 201 to each source line are referred as "source signals". In this embodiment, the lateral direction is exemplified as a first direction. The longitudinal direction is exemplified as a second direction.

Figure 3:
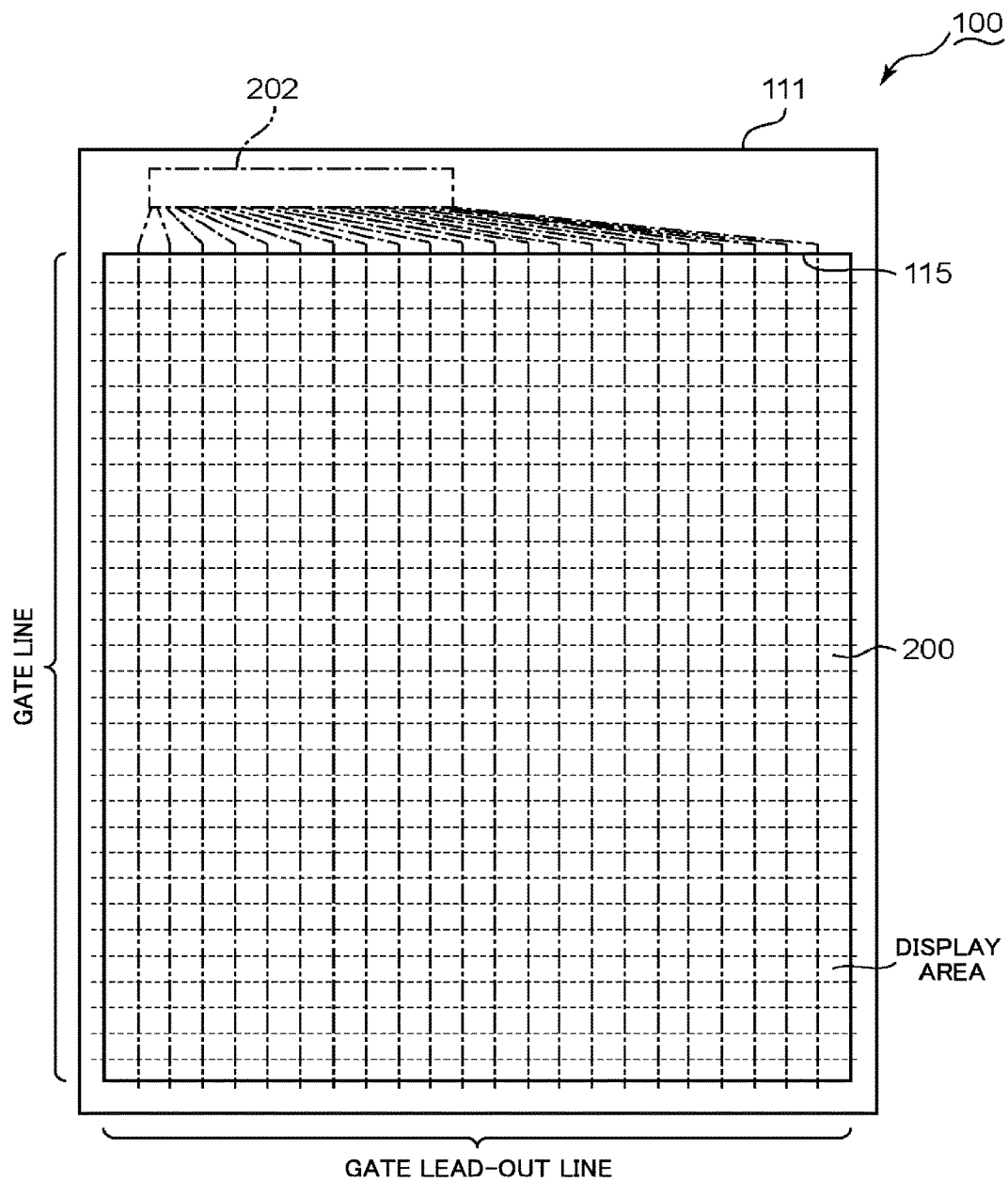
FIG. 3 is a schematic front elevation of the display device shown in FIG. 1.

FIG. 3 is a schematic front elevation of the display device 100. The display device 100 is further described with reference to FIG. 2 and FIG. 3.

The display device 100 further includes gate lines, gate lead-out lines and a gate driver 202. Different from the source lines, each gate line extends laterally on the display area. The gate lines are arranged longitudinally at substantially the same interval. Similar to the source lines, each gate lead-out line extends longitudinally. The gate lead-out lines are arranged laterally at substantially the same interval. The display panel 200 is formed by a laminating process where various layers such as a metal layer and an insulating film are laminated, which is described later. The source lines, the gate lines and the gate lead-out lines are formed in different layers from each other.

The gate driver 202 outputs gate signals as scanning signals to each of the gate lead-out lines. Each of the gate lead-out lines is electrically connected to one of the gate lines. As a result, gate signals are transmitted to each of the gate lines through the gate lead-out lines. The display panel 200 displays an image in the display area in accordance with source signals and gate signals. Conventional image display technologies may be applied to an image display for displaying images in accordance with source signals and gate signals. In this embodiment, the gate lead-out line is exemplified as a lead-out line.

The gate lead-out lines, to which gate signals from the gate driver 202 are input, extend longitudinally similar to the source lines. Thus, similar to the source driver 201, the gate driver 202 can be arranged between the outer upper edge 111 and the inner upper edge 115. According to conventional technologies, the gate driver should be arranged at the left and/or the right side of display area, because the gate driver outputs gate signals directly to the gate lines. Different from the conventional technologies, the area at left and/or right side of the display area can be designed to be narrower, because the gate driver 202 can be arranged between the outer upper edge 111 and the inner upper edge 115. In other words, the display device 100 can be designed so that a display area is laterally longer.

(Positional Relationship Among the Gate Lead-Out Line, the Gate Line and the Source Line)

Figure 4:
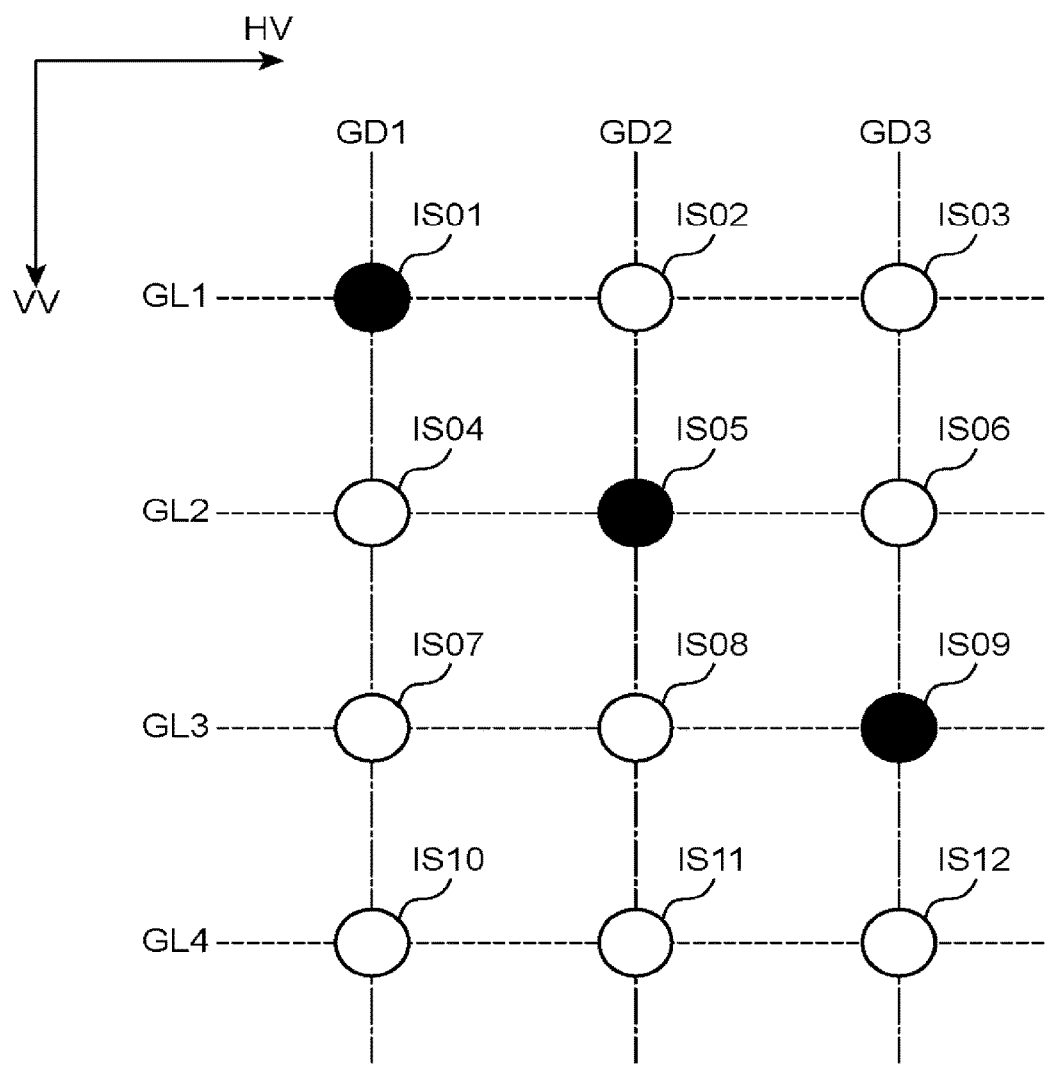
FIG. 4 is a schematic view of the gate lines and the gate lead-out lines of display device shown in FIG. 1.

FIG. 4 is a schematic view of gate lines GL1-GL4 and gate lead-out lines GD1-GD3. The Gate lines GL1-GL4 and the gate lead-out lines GD1-GD3 are described with reference to FIG. 4.

FIG. 4 shows a horizontal vector HV extending laterally and a vertical vector VV extending longitudinally from a start point of the horizontal vector HV. The gate lines GL1-GL4 and the gate lead-out lines GD1-GD3 have twelve instances of overlapping points IS01-IS12 on a plan area prescribed by the horizontal vector HV and the vertical vector VV. The overlapping points IS01, IS05, IS09 are selected as jointing parts where the gate lines GL1-GL3 and the gate lead-out line GD1-GD3 are connected with each other, respectively. At the other overlapping points IS02-IS04, IS06-IS08, IS10-IS12, the gate lines GL1-GL4 are insulated properly from the gate lead-out lines GD1-GD3 with an insulating film interposed therebetween.

Figure 5:
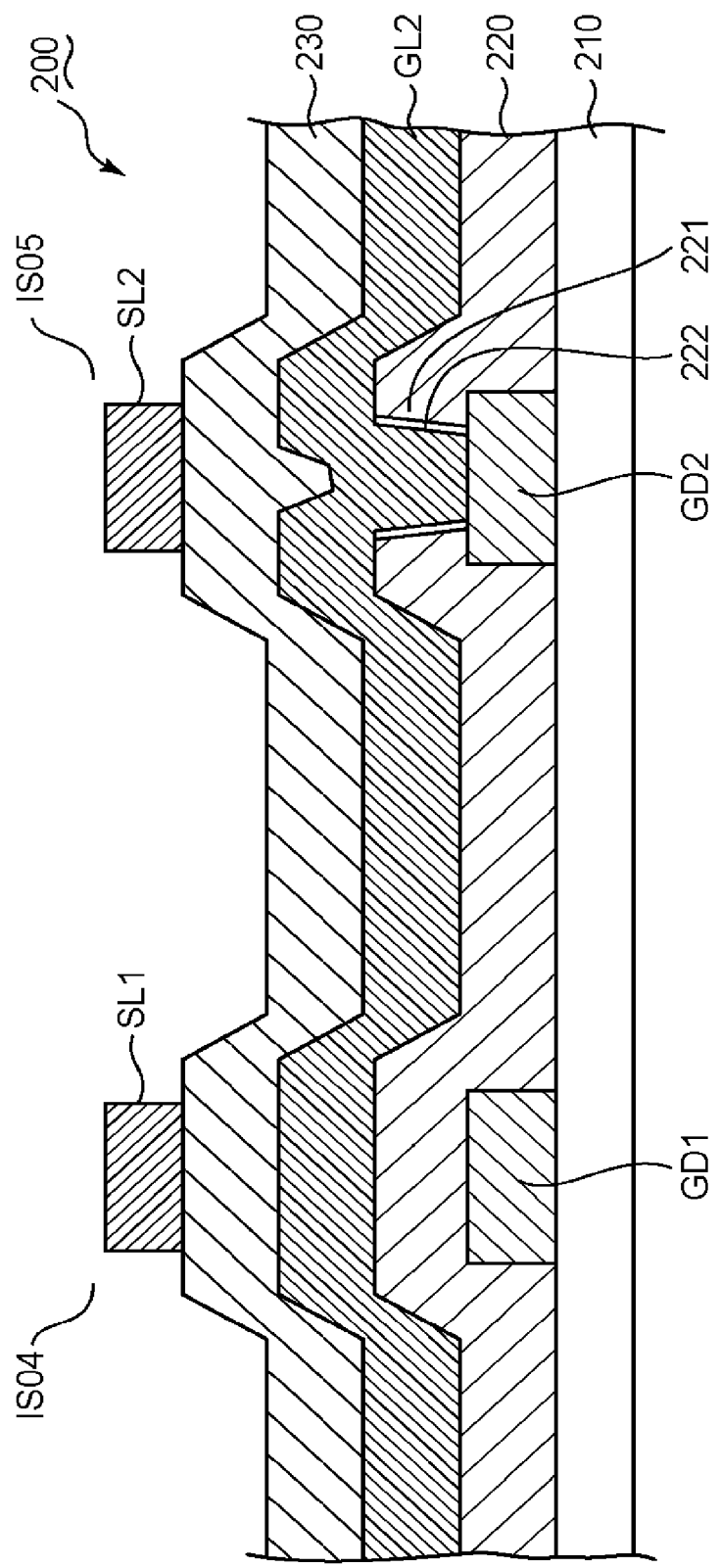
FIG. 5 is a schematic cross section of the display panel of the display device shown in FIG. 1.

FIG. 5 is a schematic cross section of the display panel 200. With reference to FIG. 4 and FIG. 5, the display panel 200 is described.

FIG. 5 is a schematic cross section along gate line GL2 of the display panel 200. The display panel 200 includes a substrate 210, a first insulating film 220 and a second insulating film 230. The gate lead-out lines GD1, GD2 are laminated on the substrate 210. Similarly, other gate lead-out lines are laminated on the substrate 210. The first insulating film 220 covers the substrate 210 and the gate lead-out lines GD1, GD2. Similarly, the other gate lead-out lines are covered by the first insulating film 220. The gate line GL2 is laminated on the first insulating film 220. Similarly, other gate lines are laminated on the first insulating film 220. The second insulating film 230 covers the first insulating film 220 and the gate line GL2. The other gate lines are covered by the second insulating film 230.

FIG. 5 shows source lines SL1, SL2 as the source lines. The source line SL1 is formed along the gate lead-out line GD1 on the second insulating film 230. The source line SL2 is formed along the gate lead out line GD2 on the second insulating film 230. The other source lines are formed along the other gate lead-out lines on the second insulating film 230.

FIG. 5 shows overlapping points IS04, IS05 which are described with reference to FIG. 4. At the overlapping point IS05 selected as the jointing part, a through-hole 221 is formed in the first insulating film 220 which is formed between the gate lead-out line GD2 and the gate line GL2. At other overlapping points (e.g., overlapping point IS01, IS09) selected as the jointing parts, the through-holes are formed. The conductive member used for the gate line GL2 flows into the through-hole 221 and becomes a connection portion 222 across the first insulating film 220. The connection portion 222 electrically connects the gate lead-out line GD2 and the gate line GL2. At other overlapping points selected as the jointing parts, the other connection portions are formed, and the other gate lead-out lines are electrically connected to the other gate lines.

Figure 6:
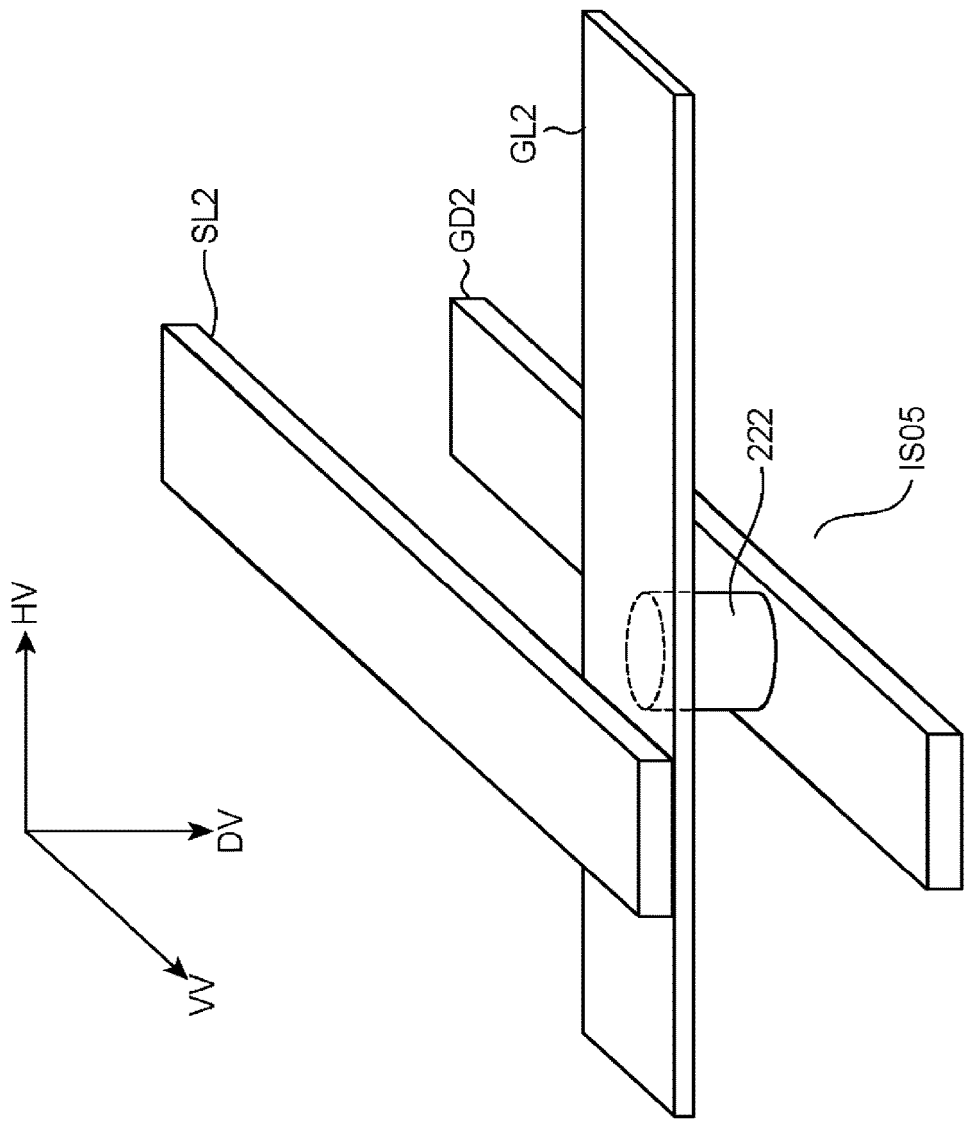
FIG. 6 is a schematic perspective illustration of a gate lead-out line, a gate line and a source line of the display device shown in FIG. 1.

FIG. 6 is a schematic perspective illustration of the gate lead-out line GD2, the gate line GL2 and the source line SL2. With reference to FIG. 5 and FIG. 6, a positional relationship among the gate lead-out line GD2, the gate line GL2 and source line SL2 is described.

FIG. 6 shows a structure around a selected overlapping point IS05 as a jointing part. The explanation regarding the structure in FIG. 6 can be applied for other jointing parts.

FIG. 6 shows a horizontal vector HV extending laterally, a vertical vector VV extending longitudinally from the horizontal vector HV and a depth vector DV extending in a depth direction at right angles to both the horizontal vector HV and the depth vector HV. In this embodiment, the direction indicated by the depth vector DV is exemplified as a third direction.

As shown in FIG. 6, the gate lead-out line GD2 and the source line SL2 extend longitudinally. The source line SL2 is formed at a different position in the depth direction from the gate lead-out line GD2. The gate line GL2 is arranged between the gate lead-out line GD2 and the source line SL2 in a depth direction. Different from the gate lead-out line GD2 and the source line SL2, the gate line GL2 extends laterally. The connection portion 222 is formed between the gate lead-out line GD2 and the gate line GL2. The connection portion 222 transmits gate signals output from the gate lead-out line GD2 to the gate line GL2. The gate signals transmitted to the gate line GL2 propagate laterally.

Figure 7A:
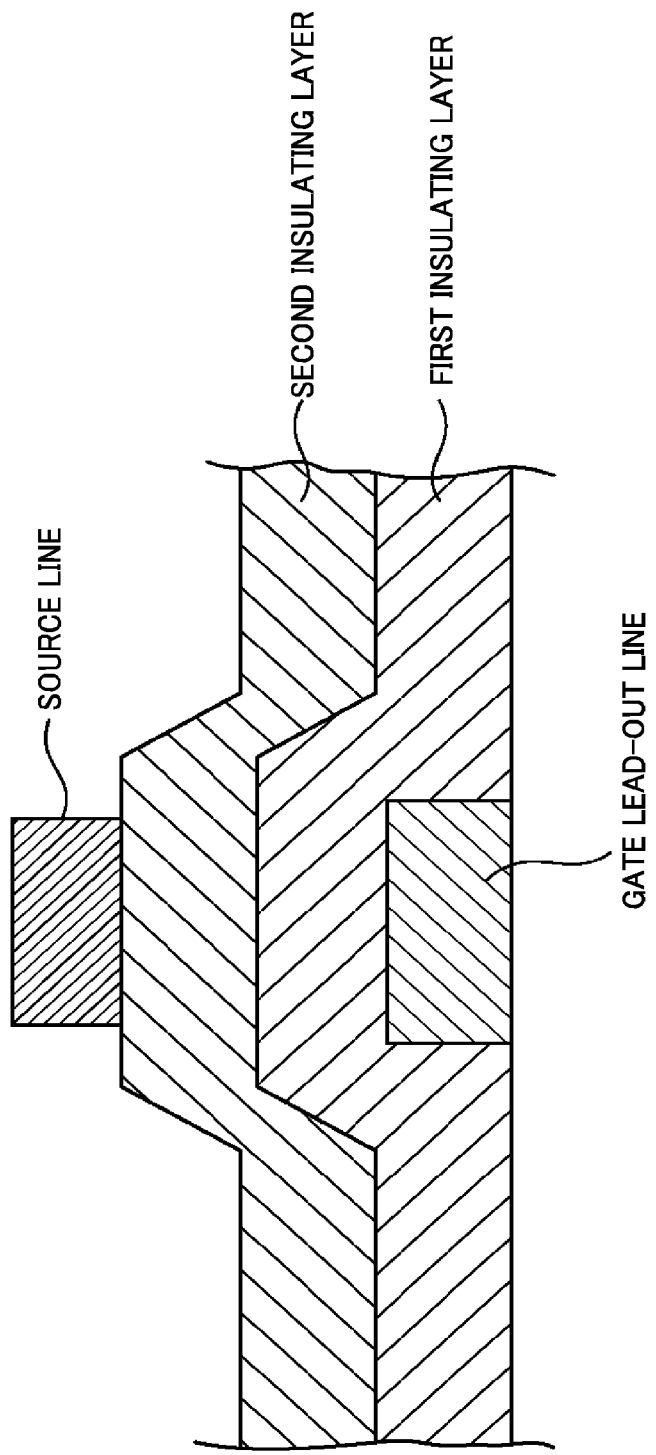
FIG. 7A is a schematic cross section indicating a positional relationship between the gate lead-out line and the source line.
Figure 7B:
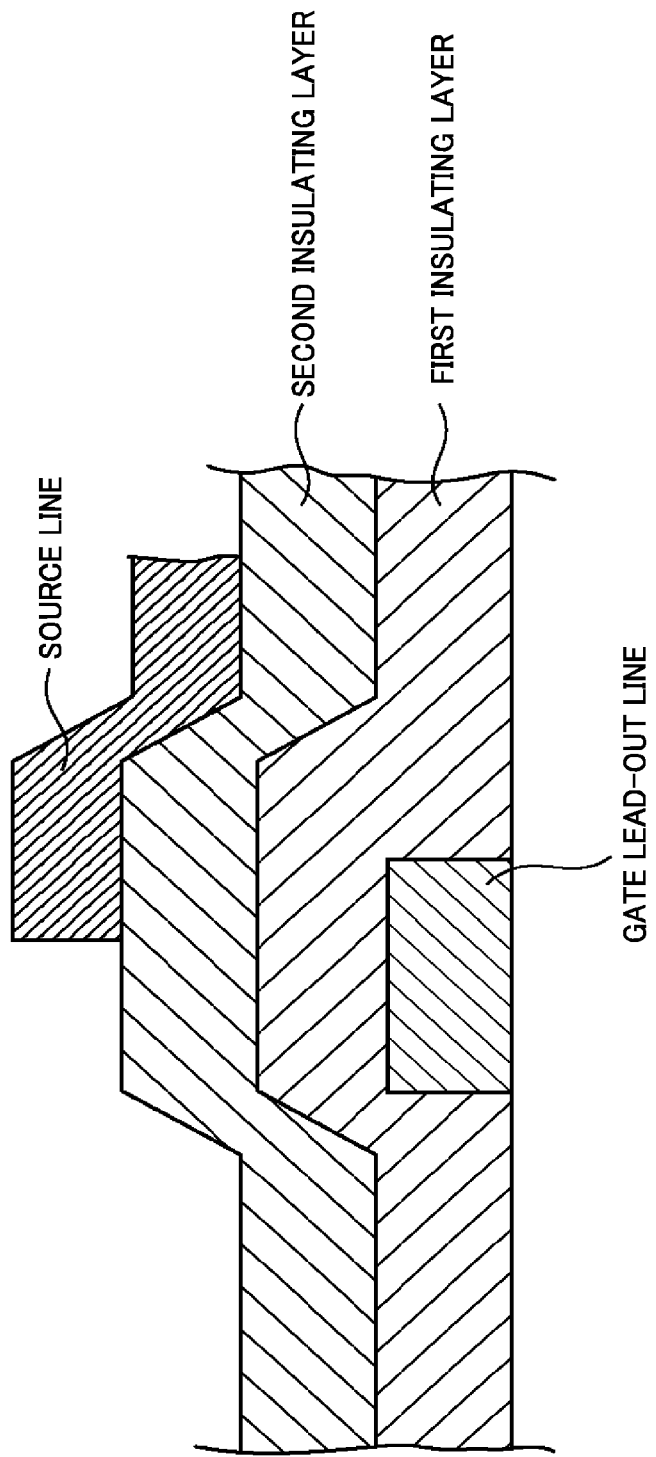
FIG. 7B is a schematic cross section indicating another positional relationship between the gate lead-out line and the source line.

FIG. 7A to FIG. 7C are schematic cross sections indicating various positional relationships between a gate lead-out line and a source line. With reference to FIG. 7A to FIG. 7C, a positional relationship between the gate lead-out line and the source line is described.

FIG. 7A to 7C are lateral cross sections of the gate lead-out line and the source line. A first insulating film and a second insulating film are formed between the gate lead-out line and the source line.

As shown in FIG. 7A, the source line may be formed to totally overlap with the gate lead-out line. In this case, a regional area in plan view occupied by the source line and the gate lead-out line is small. Thus, the structure shown in FIG. 7A is suitable for transmissive liquid crystal panels. If the structure shown in FIG. 7A is applied to transmissive liquid crystal panels, an opening rate of a pixel in liquid crystal panels grows large.

As shown in FIG. 7B, the source line may be formed to partially overlap with the gate lead-out line. In this case, though a regional area in plan view occupied by the source line and the gate lead-out line grows large, a capacitance load between the source line and the gate lead-out line grows small.

As shown in FIG. 7C, the source line may be arranged to be spaced completely away from the gate lead-out line in the first direction. Because the gate lead-out line does not overlap with the source line, a capacitance load between the source line and the gate lead-out line grows very small.

(Laminating Process)

Figure 8:
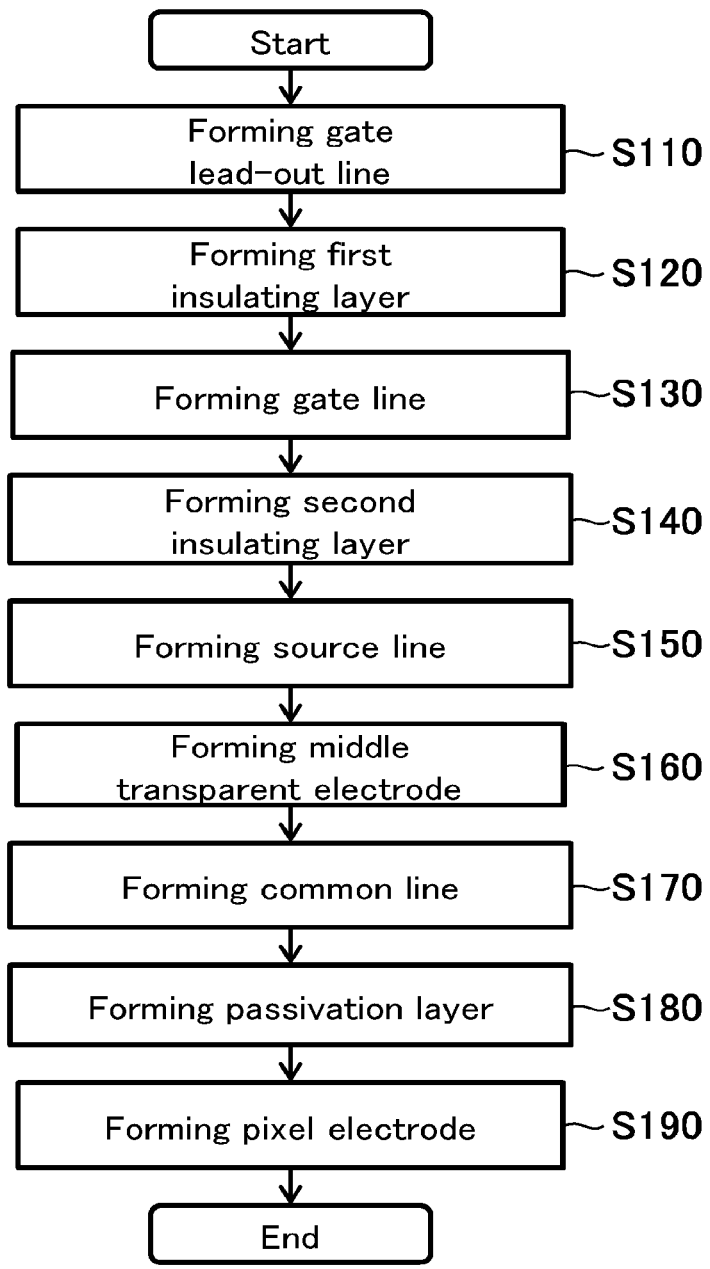
FIG. 8 is a flow chart of a laminating process to produce the display panel of the display device shown in FIG. 1.

FIG. 8 is a schematic flow chart of a laminating process to produce a display panel. With reference to FIG. 8, the laminating process is described.

(Step S110)

In a step S110, a substrate is prepared. Subsequently, gate lead-out lines are formed on the substrate. Subsequently, a step S120 is carried out.

(Step S120)

In the step S120, a first insulating film is laminated. The first insulating film covers the substrate and the gate lead-out lines. A photoresist processing is performed to the first insulating film. As a result, through-holes are formed in the first insulating film. The gate lead-out lines are exposed by the through-holes. A specific area of the first insulating film may be removed, if necessary. As a result, the thickness of the display panel can be reduced. After the photoresist processing, a step S130 is carried out.

(Step S130)

In the step S130, gate lines are formed on the first insulating film. The first insulating film insulates the gate lines from the gate lead-out lines properly. As a layer of the gate lines coats the first insulating film and the through-holes therein, the material of the layer of the gate lines flows into the through-holes. As a result, connection portions which connect the gate lead-out lines to the gate lines are formed. After the forming process of gate lines and connection portions, a step S140 is carried out.

(Step S140)

In the step S140, a second insulating film is laminated. The second insulating film covers the first insulating film and the gate lines. After the forming process of second insulating film, a step S150 is carried out.

(Step S150)

In the step S150, source lines are formed along the gate lead-out lines on the second insulating film. As a result, the second insulating film is formed between the source lines and the gate lead-out lines. The second insulating film insulates the source lines from the gate lead-out lines properly. Because the source lines extend in a direction that is at substantially a right angle to the gate lines and the source lines, an area on the second insulating film will be sectioned into rectangular regions by the source lines and the gate lines. In the following explanation, a substantially rectangular region sectioned by source lines and gate lines is referred to a "pixel region". After the forming process of the second insulating film, a step S160 is carried out.

(Step S160)

In the step S160, a middle transparent electrode is formed. The middle transparent electrode is formed to cover the pixel regions. After the forming process of the middle transparent electrode, a step S170 is carried out.

(Step S170)

In step S170, common lines are formed along the source lines. The common lines are connected to the middle transparent electrode. After the forming process of the common lines, the step S180 is carried out.

(Step S180)

In the step S180, the passivation layer is formed. The passivation layer covers the middle transparent electrode and the common lines. After the forming process of the passivation layer, a step S190 is (Step S190)

In the step S190, pixel electrodes are formed in the pixel regions. As a result, the middle transparent electrode faces the pixel electrodes. Brightness of the pixel regions is determined depending on a difference in voltage between the pixel electrodes and the middle transparent electrode. In this embodiment, the middle transparent electrode is exemplified as a common electrode.

Figure 9:
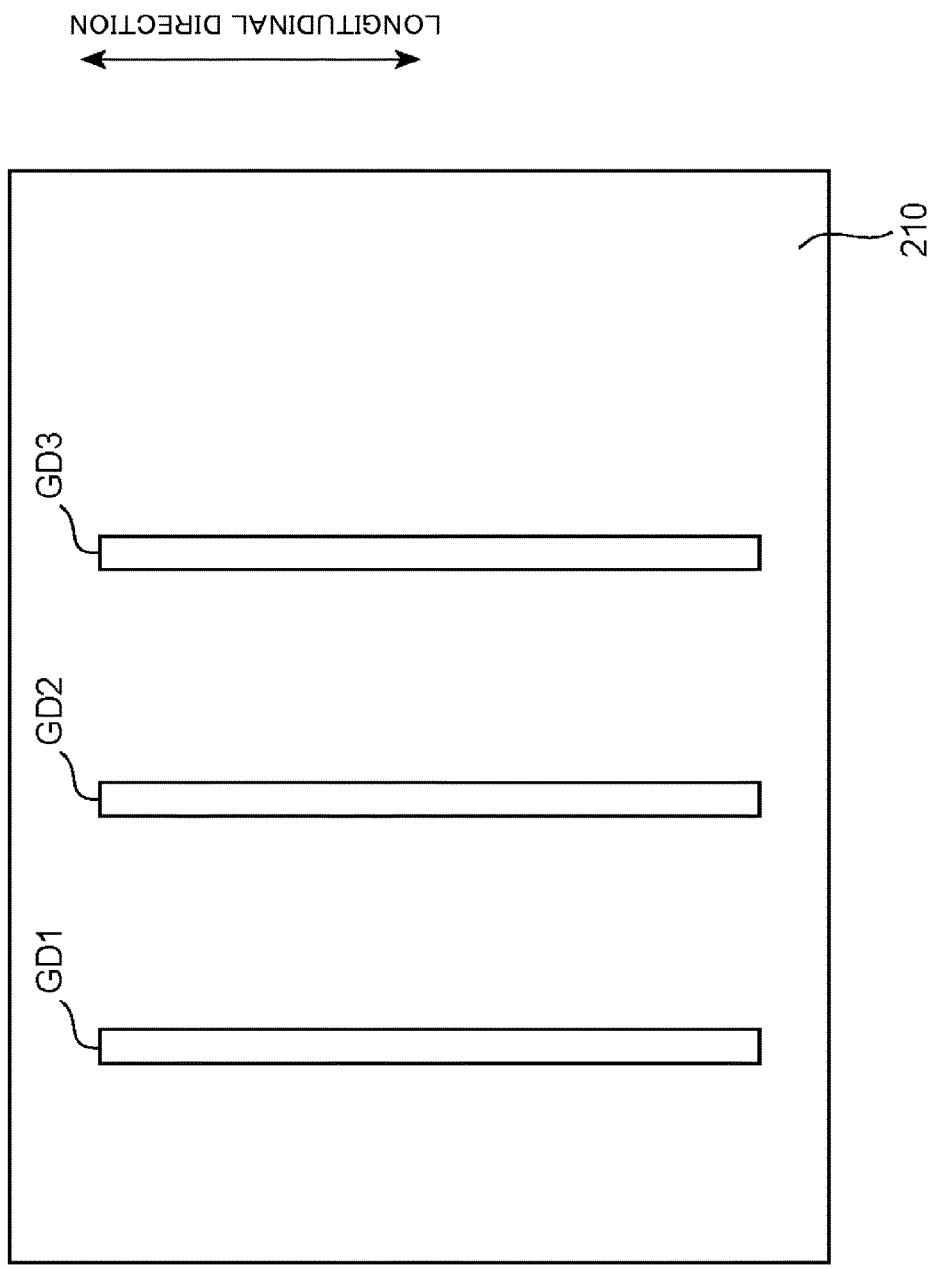
FIG. 9 is a schematic view of a forming process of gate lead-out lines.

FIG. 9 is a schematic view of a forming process of gate lead-out lines (step S110). With reference to FIG. 8 and FIG. 9, the forming process of the gate lead-out lines is described.

A substrate 210 is prepared. Gate lead-out lines GD1, GD2, GD3 are formed to extend longitudinally on the substrate 210.

Figure 10:
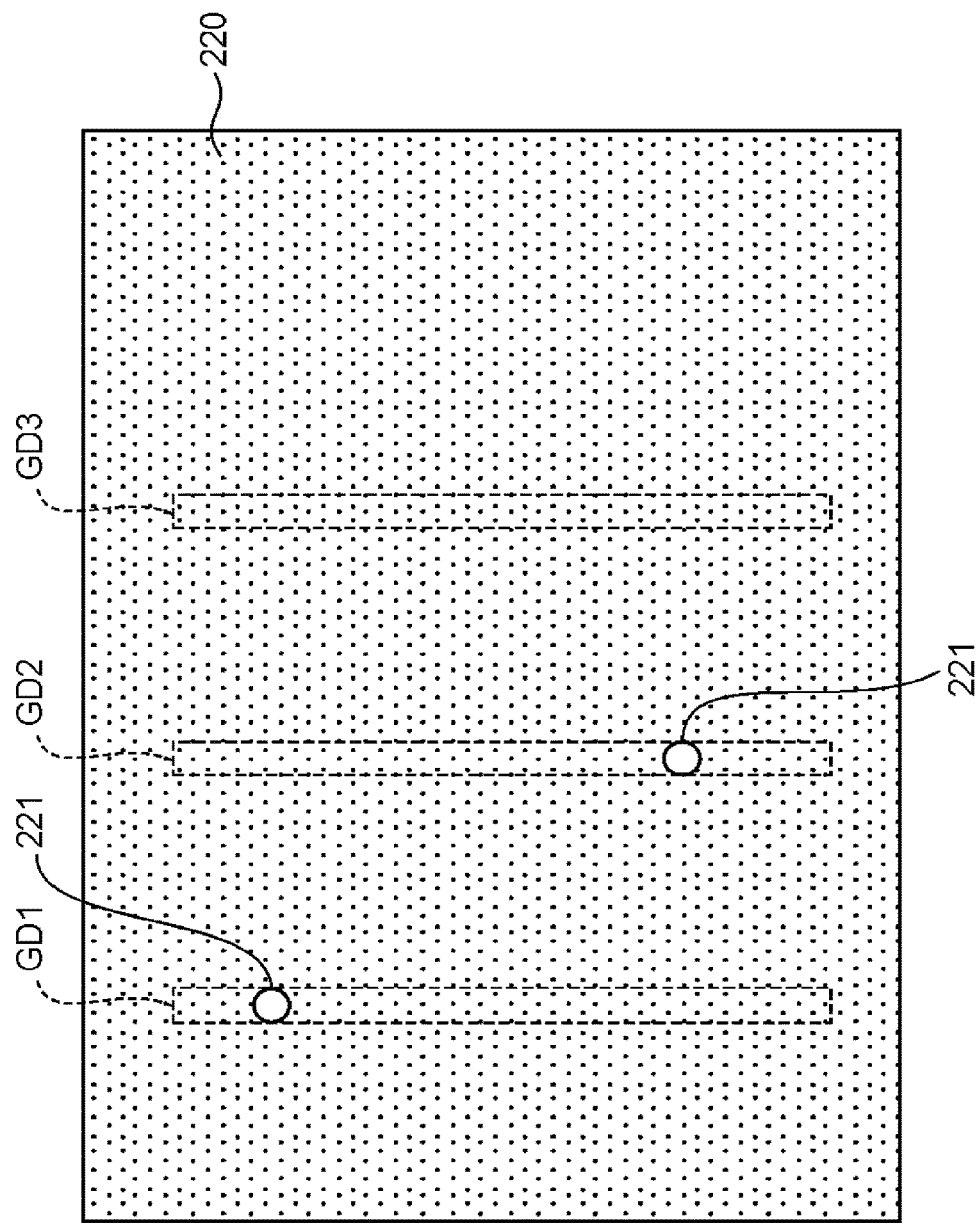
FIG. 10 is a schematic view of a forming process of a first insulating film.

FIG. 10 is a schematic view of a forming process of a first insulating film (step S120). With reference to FIG. 8 to FIG. 10, a forming process of the first insulating film is described.

The first insulating film 220 is formed to cover the whole substrate 210. Subsequently, through-holes 221 are formed to expose some parts of the gate lead-out lines GD1, GD2.

Figure 11:
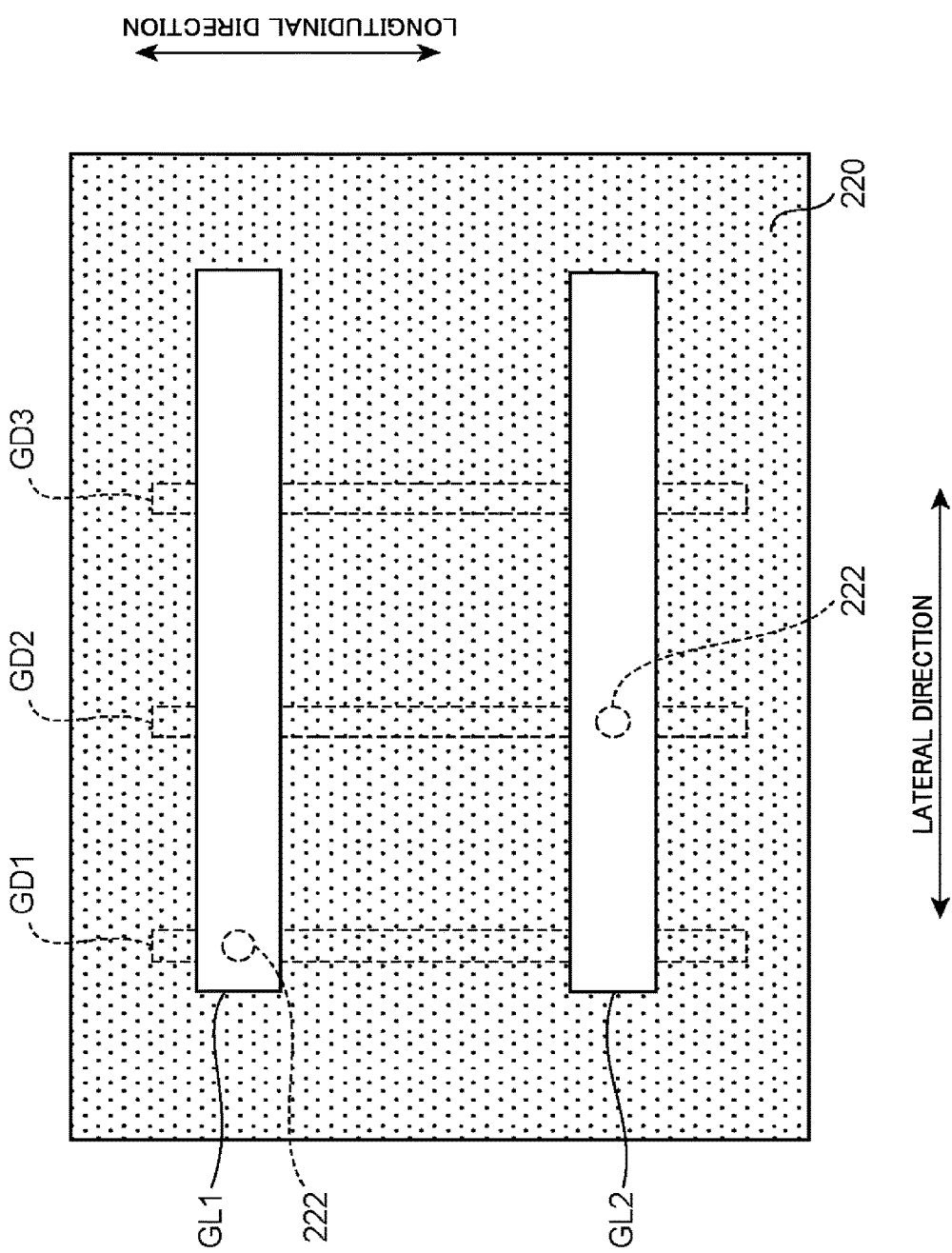
FIG. 11 is a schematic view of a forming process of gate lines.

FIG. 11 is a schematic view of a forming process of gate lines (step S130). With reference to FIG. 8, FIG. 10 and FIG. 11, a forming process of the gate lines is described.

The gate lines GL1, GL2 extending laterally are formed on the first insulating film 220. Positions of the gate lines GL1, GL2 in the longitudinal direction are determined so as to overlap the gate lines GL1, GL2 with the through-holes 221. As a result, a part of the material of the gate lines GL1, GL2 flows into the through-holes 221 and becomes the connection portions 222. The gate line GL1 is electrically connected to the gate lead-out line GD1 at an upper side with one of the connection portions 222. The gate line GL2 is electrically connected to the gate lead-out line GD2 at a bottom side with one of the connection portions 222.

Figure 12:
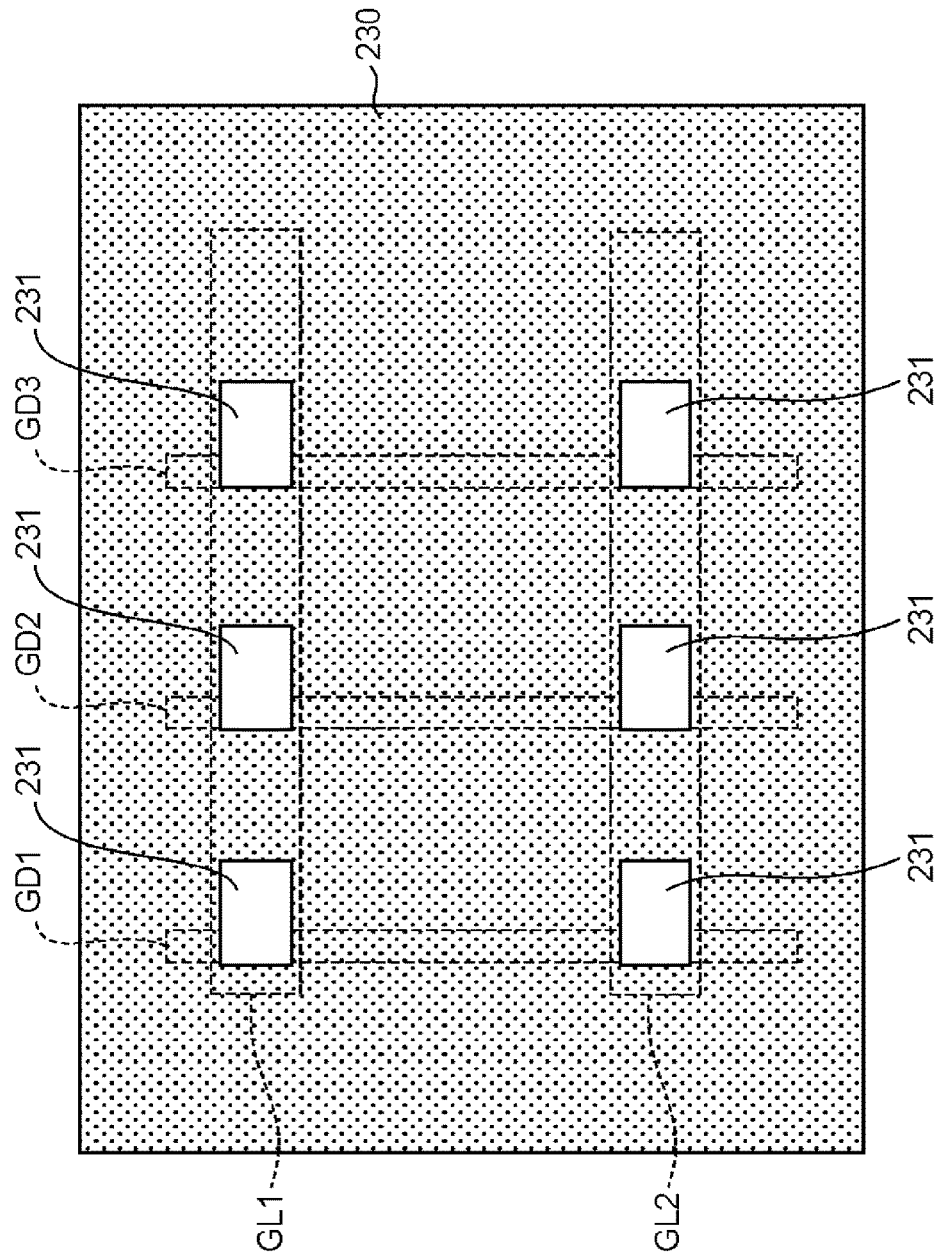
FIG. 12 is a schematic view of a forming process of a second insulating film.

FIG. 12 is a schematic view of a forming process of a second insulating film (step S140). With reference to FIG. 8, FIG. 11 and FIG. 12, the forming process of the second insulating film is described.

Amorphous silicons 231 are formed on the parts where the gate lead-out lines GD1, GD2, GD3 cross the gate lines GL1, GL2. The second insulating film 230 is formed between the amorphous silicons 231 and the gate lines.

Figure 13:
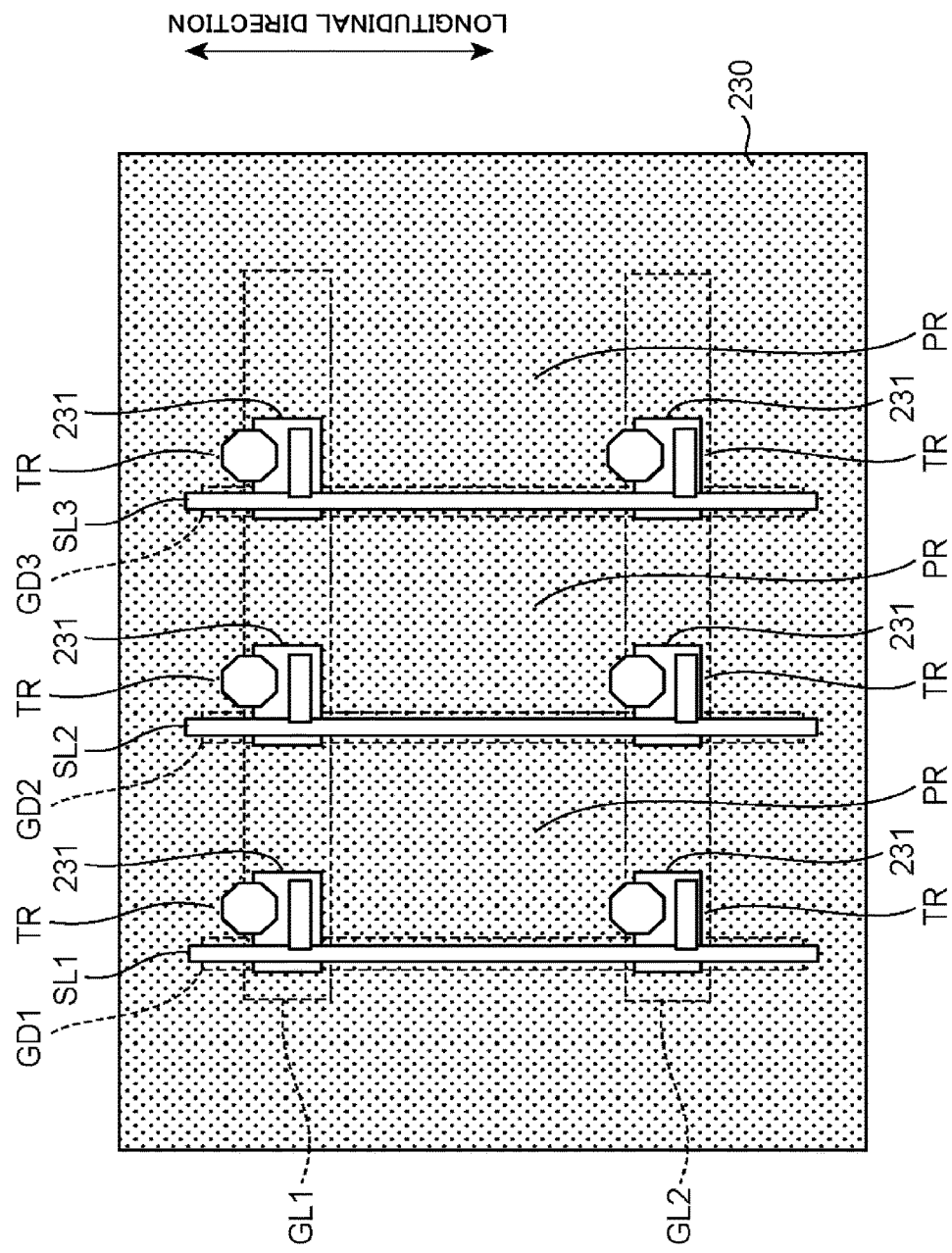
FIG. 13 is a schematic view of a forming process of source lines.

FIG. 13 is a schematic view of a forming process of source lines (step S150). With reference to FIG. 8, FIG. 12 and FIG. 13, the forming process of the source lines is described.

Source lines SL1, SL2, SL3 extending longitudinally are formed on the second insulating film 230 and the amorphous silicons 231. The source line SL1 is laminated over the gate lead-out line GD1 via the second insulating film 230 and the amorphous silicon 231. The source line SL2 is laminated over the gate lead-out line GD2 via the second insulating film 230 and the amorphous silicon 231. The source line SL3 is laminated over the gate lead-out line GD3 via the second insulating film 230 and the amorphous silicon 231. As a result, an area on the second insulating film 230 is sectioned into pixel regions PR defined by the source lines SL1, SL2, SL3 and gate lines GL1, GL2.

Thin film transistors (TFTs) TR are formed on the amorphous silicons 231. TFTs TR are connected to the gate line GL1, GL2 through the amorphous silicons 231. In addition, TFTs TR are connected to the source lines SL1, SL2, SL3. TFTs TR control the writing of source signals from the source lines SL1, SL2, SL3 to the pixel regions PR depending on gate signals which are transmitted from the gate lead-out lines GD1, GD2 to the gate line GL1, GL2.

Figure 14:
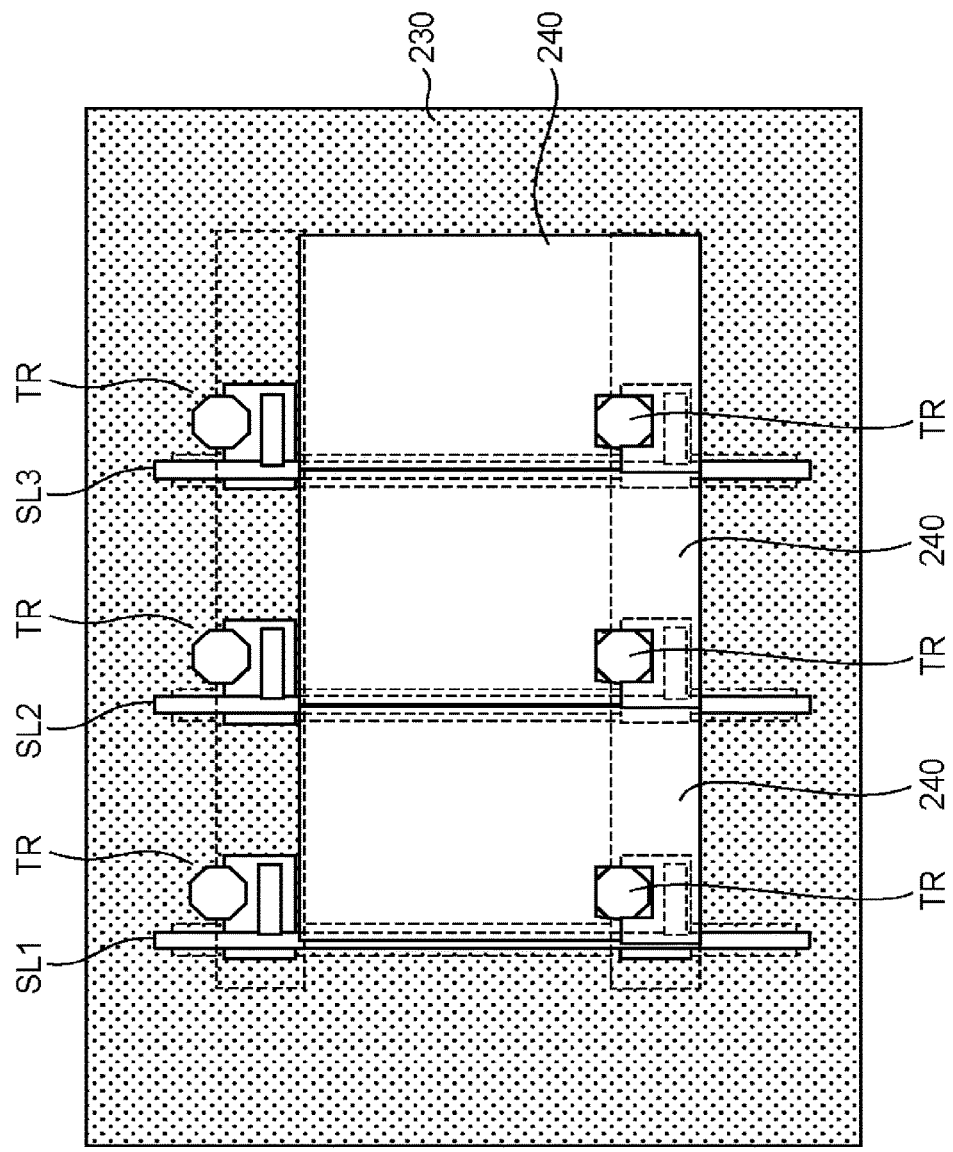
FIG. 14 is a schematic view of a forming process of a middle transparent electrode.

FIG. 14 is a schematic view of a forming process of a middle transparent electrode (step S160). With reference to FIG. 8, FIG. 13 and FIG. 14, the forming process of the middle transparent electrode is described.

A middle transparent electrode 240 is formed to cover the pixel regions PR. An imaginary border between middle transparent electrodes 240 goes along source lines SL1, SL2, SL3. TFTs TR are exposed partially from the middle transparent electrode 240.

Figure 15:
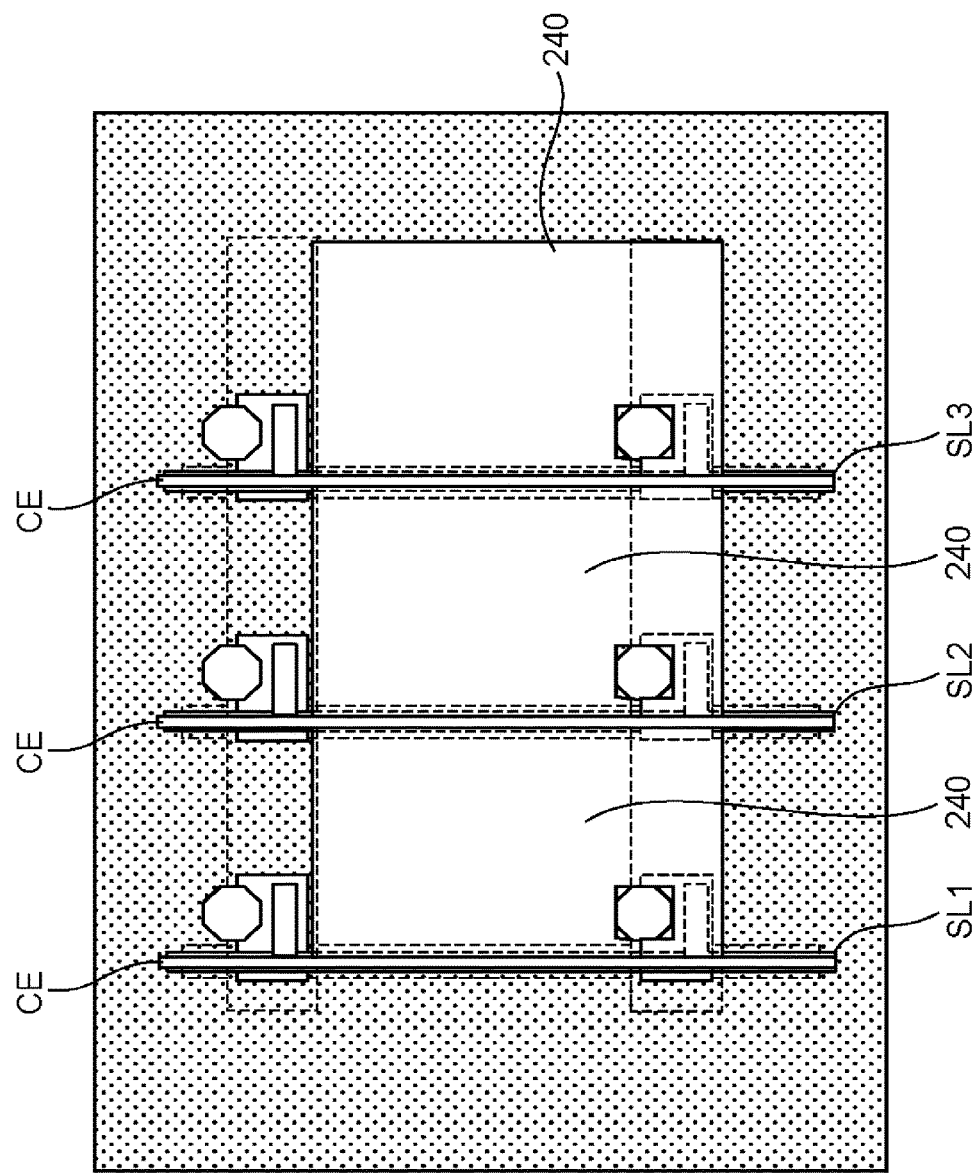
FIG. 15 is a schematic view of a forming process of common lines.

FIG. 15 is a schematic view of a forming process of common lines. (step S170). With reference to FIG. 8, FIG. 14 and FIG. 15, the forming process of the common lines is described.

The common lines CE are formed along the imaginary border between middle transparent electrodes 240. Therefore, the common lines CE go along the source lines SL1, SL2, SL3. The common lines CE are provided for power supply to keep the electric potential of the middle transparent electrode 240 substantially uniform.

Figure 16:
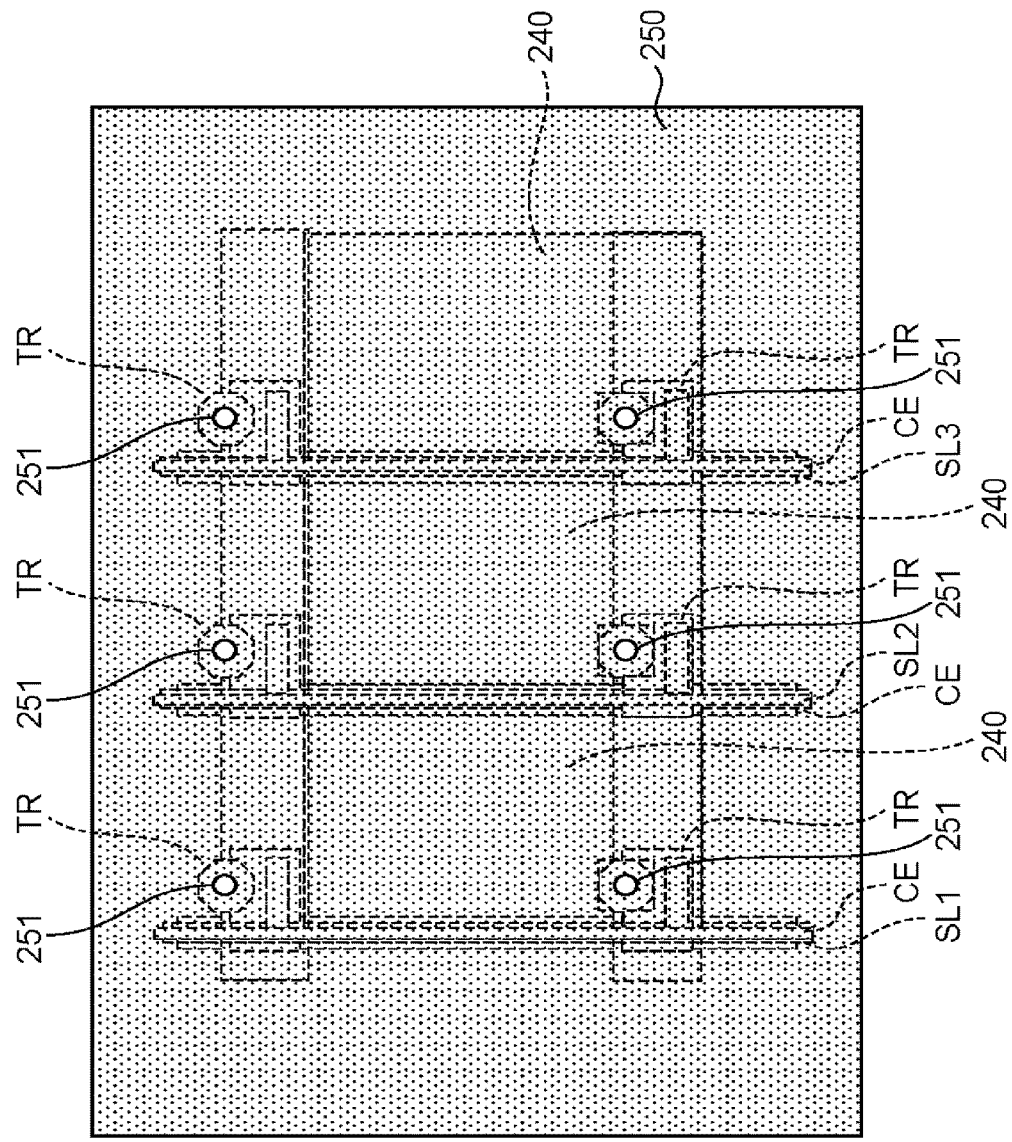
FIG. 16 is a schematic view of a forming process of a passivation layer.

FIG. 16 is a schematic view of a forming process of a passivation layer (step S180). With reference to FIG. 8, FIG. 15 and FIG. 16, the forming process of the passivation layer is described.

The passivation layer 250 is formed to cover the common lines CE, the middle transparent electrode 240, the TFTs TR and the second insulating film 230. Through-holes 251 corresponding to the TFTs TR are formed in the passivation layer 250. The TFTs TR are exposed by the through-holes 251.

Figure 17:
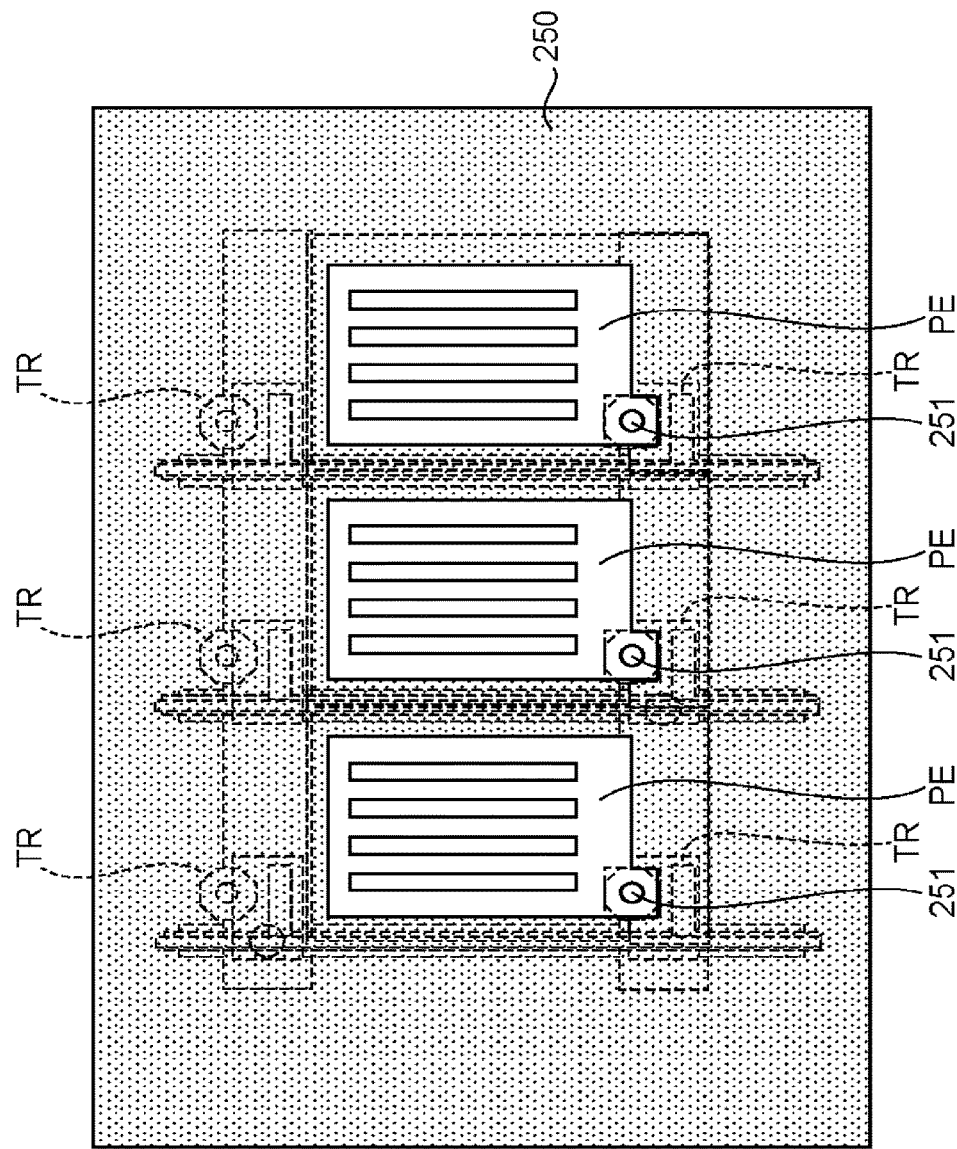
FIG. 17 is a schematic view of a forming process of pixel electrodes.

FIG. 17 is a schematic view of a forming process of pixel electrodes (step S190). With reference to FIG. 8, FIG. 16 and FIG. 17, the forming process of the pixel electrodes is described.

The pixel electrodes PE are formed to face the middle transparent electrode 240 through the passivation layer 250. The pixel electrodes PE are electrically connected to the TFTs by the through-holes 251. The TFTs TR control the writing of source signals to the pixel electrodes PE depending on gate signals.

The laminating process described with reference to FIG. 8 is exemplary. Depending on a kind and the design of display panels, another laminating technology may be used.

Second Embodiment

If the source lines are formed along the gate lead-out lines, regions where the gate lead-out lines and the source lines exist are likely to become thicker than the other regions. In the second embodiment, techniques to reduce a thickness at the region where the gate lead-out lines and the source lines exist are described.

Figure 18:
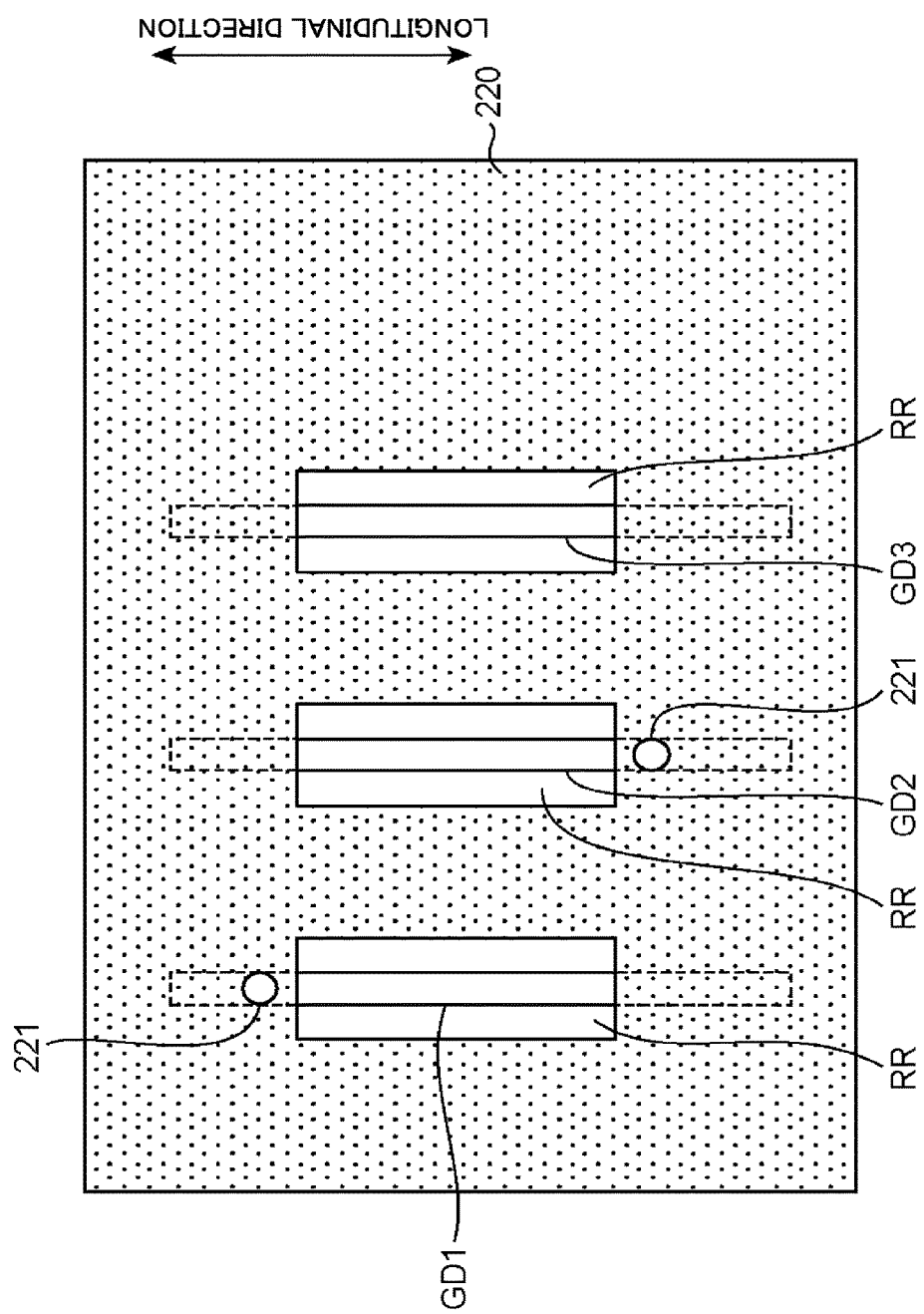
FIG. 18 is a schematic view of a forming process of a first insulating film.

FIG. 18 is a schematic view of a forming process of a first insulating film (step S120). With reference to FIG. 8, FIG. 9 and FIG. 18, the forming process of the first insulating film is described.

The first insulating film 220 is formed to cover the whole substrate 210. Subsequently, through-holes 221 are formed to expose parts of the gate lead-out lines GD1, GD2. At the same step of forming through-holes 221, an insulating film in rectangular regions RR along the gate lead-out lines GD1, GD2, GD3 is removed from the first insulating film 220. As a result, gate lead-out lines GD1, GD2, GD3 are exposed in the rectangular regions RR. The longitudinal length of the rectangle regions RR is determined not to overlap with the gate lines formed in the step S130.

Figure 19:
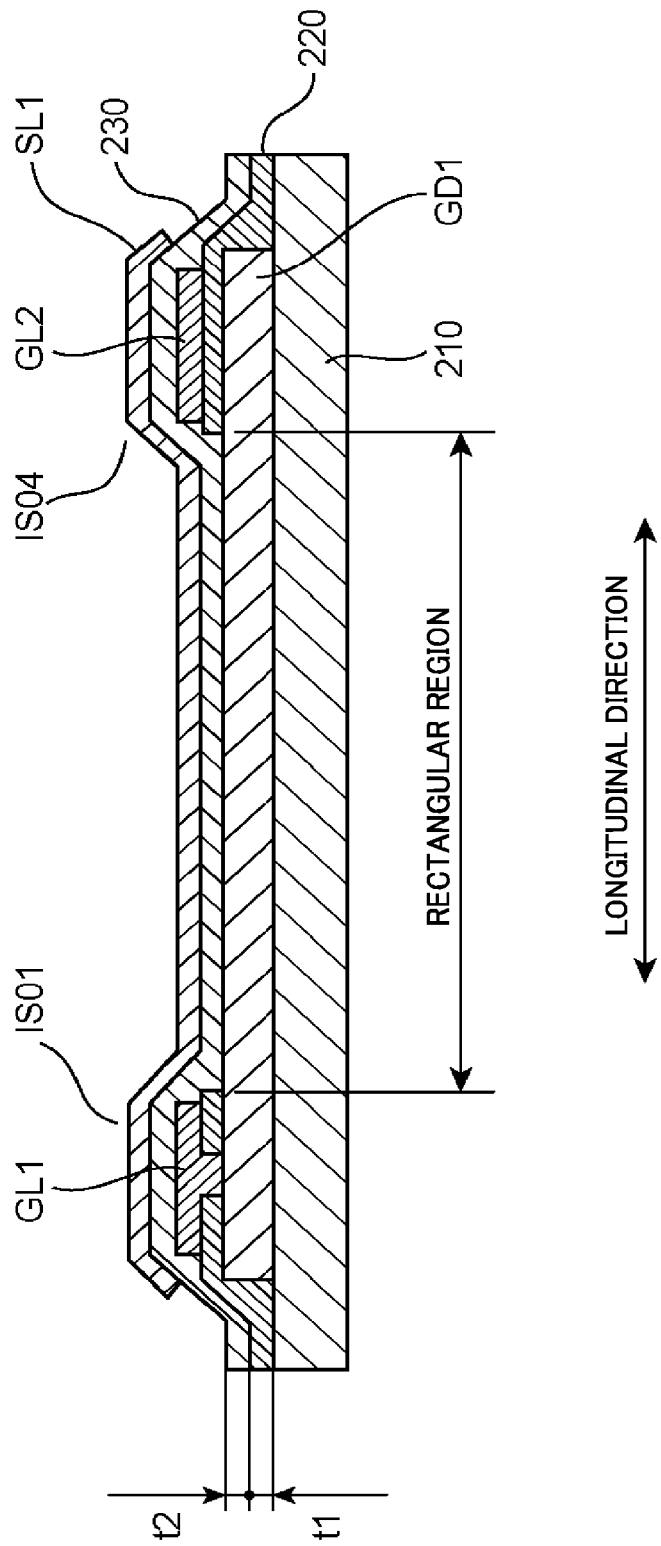
FIG. 19 is a schematic cross section of a laminate along the gate lead-out line.

FIG. 19 is a schematic cross section of a laminating body along the gate lead-out line GD1. With reference to FIG. 8, FIG. 18 and FIG. 19, the structure of the laminating body is described. In addition, the laminating body shown in FIG. 19 is formed through the process of the step S110 to the step S150.

In the step S130, gate lines GL1, GL2 are laminated on the first insulating film 220. Because in the step S120 the longitudinal length of the rectangular region RR is determined properly, the gate lines GL1, GL2 are insulated properly from the gate lead-out lines GD1, GD2, GD3 by the first insulating film 220.

In the step S140, the second insulating film 230 is laminated. In the rectangular region RR, the gate lead out lines GD1, GD2, GD3 are covered by the second insulating film 230.

In the step S150, the source line SL1 is formed along the gate lead-out line GD1. In the rectangular region RR, the source line SL1 is insulated properly from the gate lead-out line GD1 by the second insulating film 230.

The first insulating film 220 and the second insulating film 230 remain at the overlapping point IS01 overlapped by the gate lead-out line GD1 and the gate line GL1. Similarly, the first insulating film 220 and the second insulating film 230 remain at the overlapping point IS04 overlapped by the gate lead-out line GD1 and the gate line GL2. On the other hand, in rectangular region RR formed between the overlapping point IS01 and the overlapping point IS04 which is adjacent to the overlapping point IS01, an insulating film is removed from the first insulating film 220. Thus, in the rectangular region RR between the overlapping point IS01 and the overlapping point IS04, only the second insulating film 230 remains. In this embodiment, the overlapping point IS01 may be exemplified as a first overlapping point. The overlapping point IS04 may be exemplified as a second overlapping point.

If a thickness of the first insulating film 220 is referred to as "t1" (>0) and a thickness of the second insulating film 230 is referred to as "t2" (>0), a total thickness of insulating films at overlapping points IS01, IS04 is referred to as "t1+t2". On the other hand, the total thickness of the insulating films in the rectangular region RR is referred to as "t2". Thus, the total thickness of the insulating films at the overlapping points IS01, IS04 grows bigger than that in the rectangular region RR. In this embodiment, a longitudinal section prescribed by the rectangular region RR is exemplified as a section between the first overlapping point and the second overlapping point.

Third Embodiment

Techniques described in the second embodiment can suppress an increase in the thickness of the display panel by a reduction in the thickness of the insulating films. However, the reduction in the thickness of the insulating films may cause deterioration of insulating properties (e.g., increase in capacitance load of the source lines). In this third embodiment, another technique of reducing the thickness in a region where the gate lead-out line and the source line are formed is described.

Figure 20:
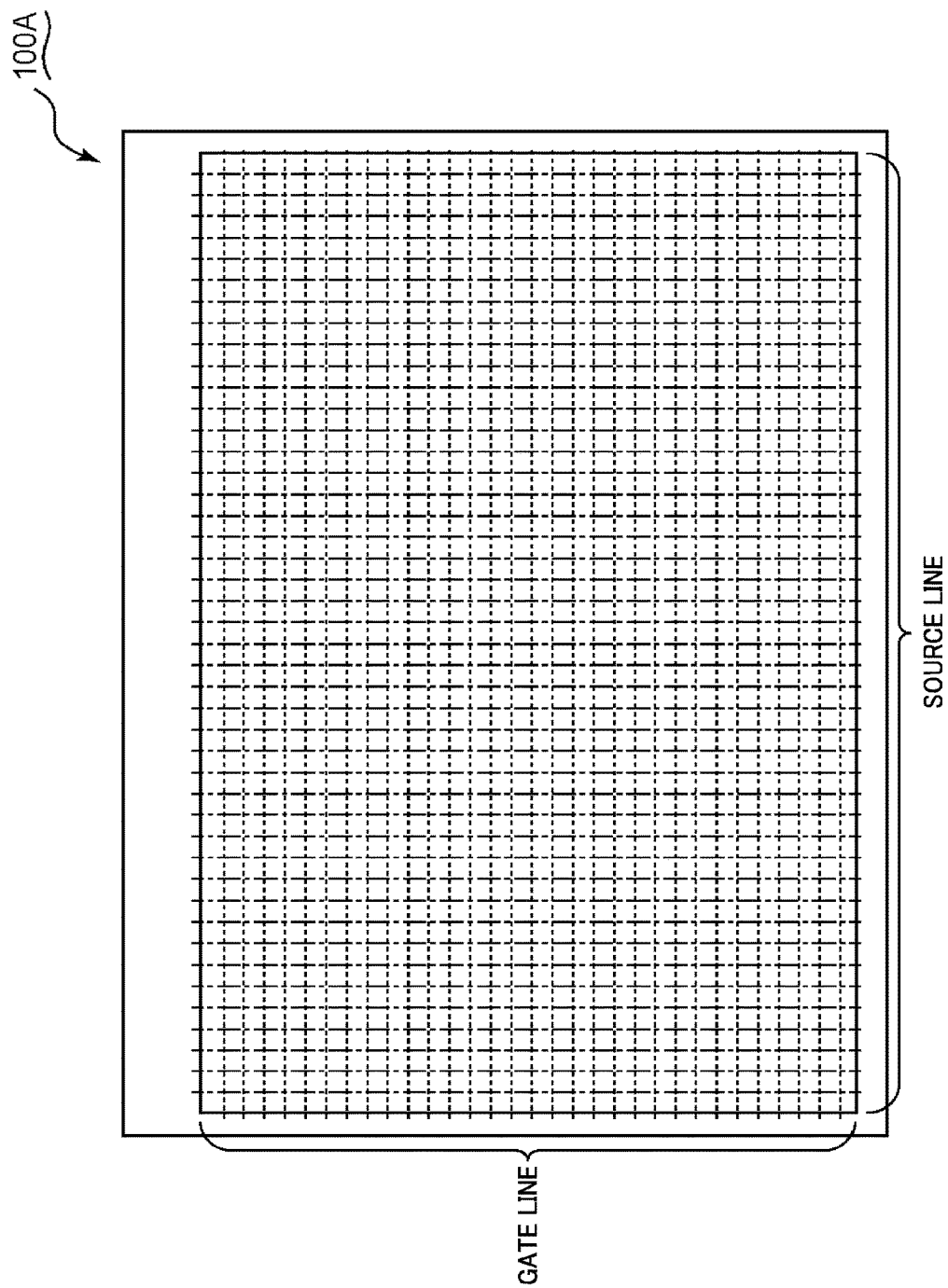
FIG. 20 is a schematic front elevation of another exemplary display device.

FIG. 20 is a schematic front elevation of another exemplary display device 100A. With reference to FIG. 20, the display device 100A is described. The display device 100A is designed based on basic principles described in the first embodiment.

Similar to the first embodiment, the display device 100A includes the gate lines and the source lines extending substantially at a right angle to the gate lines. As a gate lead-out line is formed in accordance with a gate line, gate signals are supplied to each of the gate lines properly. Thus, as the number of the source lines is larger than that of the gate lines, some source lines need not overlap with the gate lead-out lines.

Figure 21A:
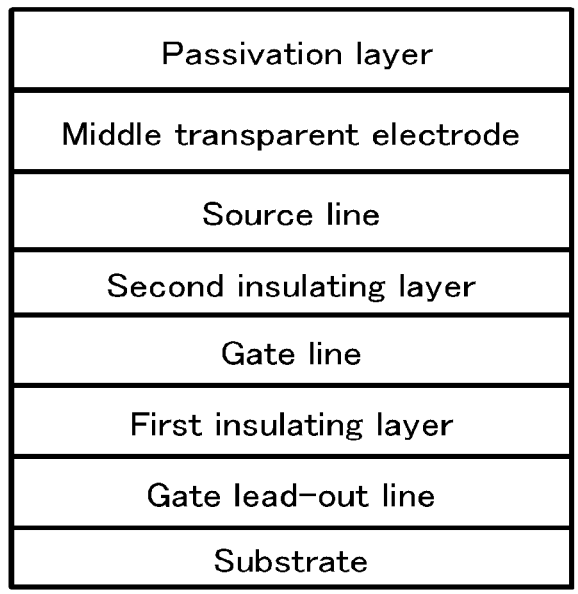
FIG. 21A is a schematic view of the laminated structure of the display panel at an overlapping point where a gate lead-out line is located.
Figure 21B:
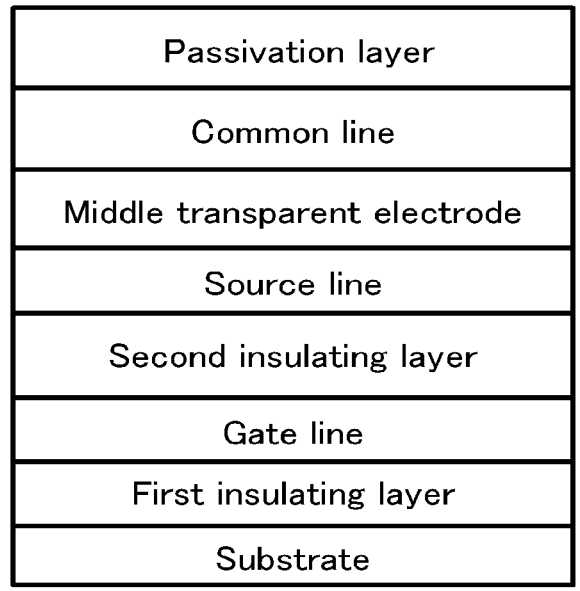
FIG. 21B is a schematic view of the laminated structure of the display panel at another overlapping point where a gate lead-out line is located.

FIG. 21A is a schematic view of the laminated structure of the display panel in an overlapping point A where a gate lead-out line is located. FIG. 21B is a schematic view of the laminated structure of the display panel in another overlapping point B which is spaced apart laterally from the overlapping point A. With reference to FIG. 8, FIG. 21A and FIG. 21B, principles of the third embodiment are described.

As shown in FIG. 21A, when a gate lead-out line exists, a common line is not formed. As shown in FIG. 21B, when a gate lead-out line does not exist, a common line is formed. As a result, the number of layers is the same at both the overlapping point A and the overlapping point B.

A common line is formed laterally spaced apart from a gate lead-out line in step S170 described with reference to FIG. 8. A laminating structure shown in FIG. 21A and FIG. 21B is formed easily.

According to principles of this embodiment, a thickness of layers is reduced properly by laminating one of a gate lead-out line and a common line on at least some numbers of source lines.

Fourth Embodiment

A reduction in resistance for gate signals is preferable from the view point of transmission of the gate signals. In this fourth embodiment, techniques to reduce resistance for gate signals are described.

FIG. 22 is a schematic view of a forming process of the gate lead-out lines (step S110). With reference to FIG. 4, FIG. 8 and FIG. 22, the forming process of the gate lead-out lines is described.

In the forming process of the gate lead-out lines, a substantial rectangle shape of conductive area 223 extending laterally is formed on a substrate 210 in addition to the gate lead-out lines GD1, GD2, GD3. Similar to the gate lead-out lines GD1, GD2, GD3, four conductive areas 223 are formed of conductive material.

A top left conductive area is formed between the overlapping points IS01 and IS02 (referring to FIG. 4). A top right conductive area is formed between the overlapping points IS02 and IS03 (referring to FIG. 4). A bottom left conductive area is formed between the overlapping points IS04 and IS05 (referring to FIG. 4). A bottom right conductive area is formed between the overlapping points IS05 and IS06 (referring to FIG. 4). In addition, the conductive area 223 is separated from the gate lead-out lines GD1, GD2, GD3. In this embodiment, when the overlapping point IS01 is exemplified as a first overlapping point, the overlapping point IS02 may be exemplified as a third overlapping point. If the overlapping point IS02 is exemplified as the first overlapping point, the overlapping point IS03 may be exemplified as a third overlapping point. When the overlapping point IS04 is exemplified as a first overlapping point, the overlapping point IS05 may be exemplified as a third overlapping point. If the overlapping point IS05 is exemplified as a first overlapping point, the overlapping point IS06 may be exemplified as a third overlapping point.

Figure 23:
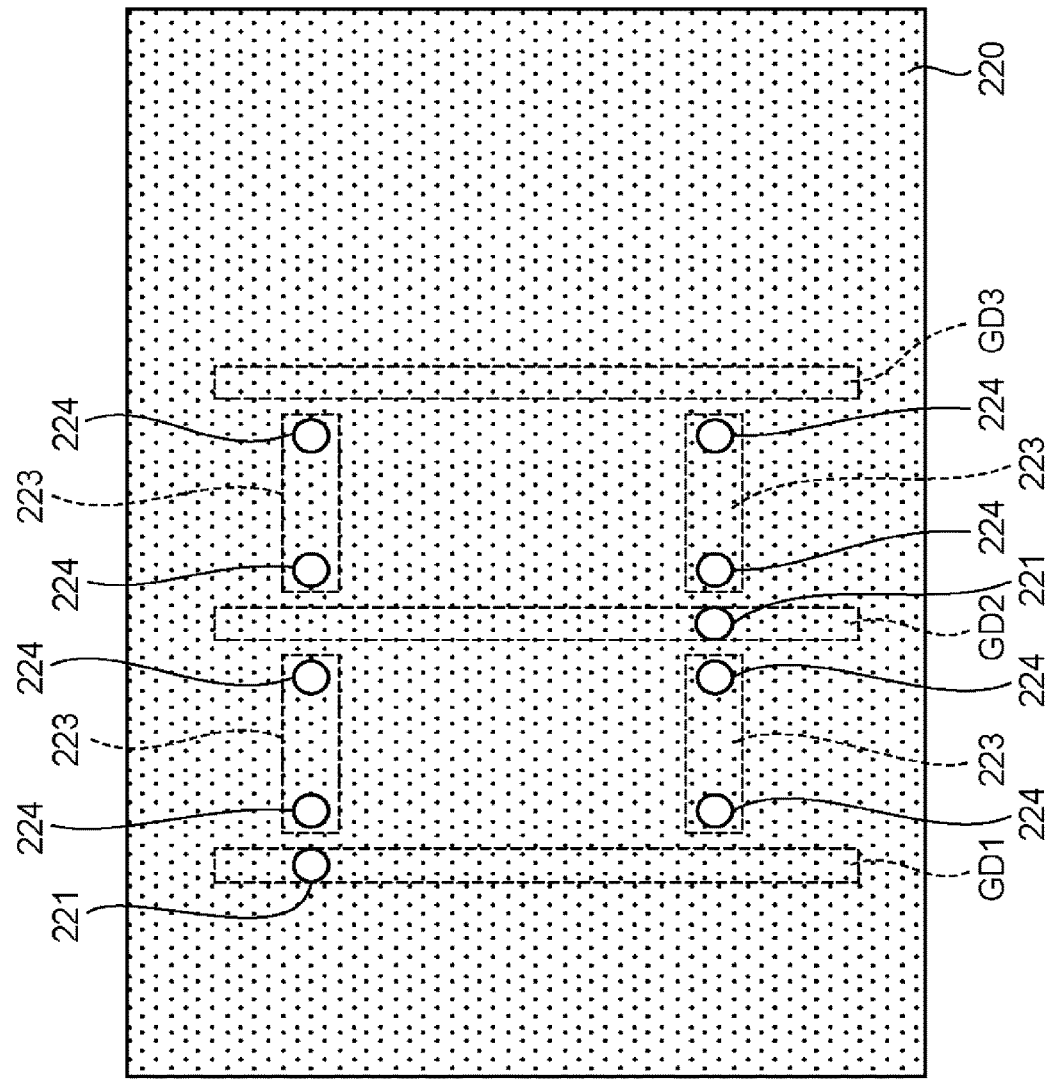
FIG. 23 is a schematic view of a forming process of the first insulating film.

FIG. 23 is a schematic view of a forming process of the first insulating film (step S120). With reference to FIG. 8 and FIG. 23, the forming process of the first insulating film is described.

In addition to the through-holes 221 corresponding to the gate lead-out lines GD1, GD2, the through-holes 224 in which parts of conductive area 223 are exposed from the first insulating film 220 are formed in the first insulating film 220. Two of the through-holes 224 are formed in every conductive area 223.

Figure 24:
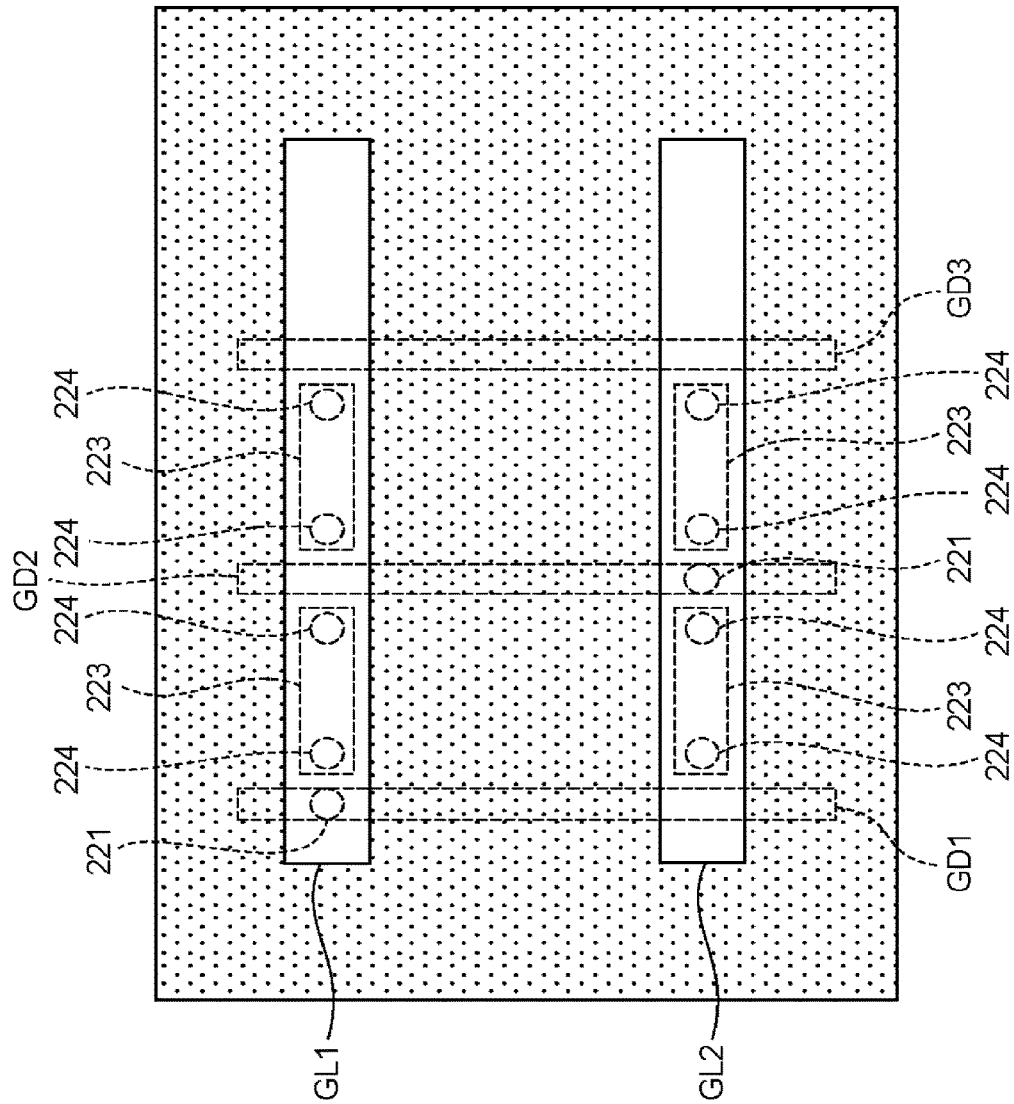
FIG. 24 is a schematic view of a forming process of the gate lines.

FIG. 24 is a schematic view of a forming process of the gate lines (step S130). With reference to FIG. 8 and FIG. 24, the forming process of gate lines is described.

The gate lines GL1, GL2 are formed to cover the through-holes 221, 224 arranged laterally. The gate line GL1 is electrically connected to the conductive area 223 not only via the through-hole 221 but also via the through-hole 224. The gate line GL2 is electrically connected to the conductive area 223 not only via the through-hole 221 but also via the through-hole 224.

Because the conductive area 223 enlarges a sectional area where gate signals passes, the resistance for signals is reduced. In this embodiment, the conductive area 223 is exemplified as the assistant gate line.

Fifth Embodiment

A reduction in fluctuation of resistance for gate signals is preferable from the view point of quality of the image displayed in a display area. In this fifth embodiment, techniques to reduce the fluctuation of the resistance for gate signals are described.

Figure 25:
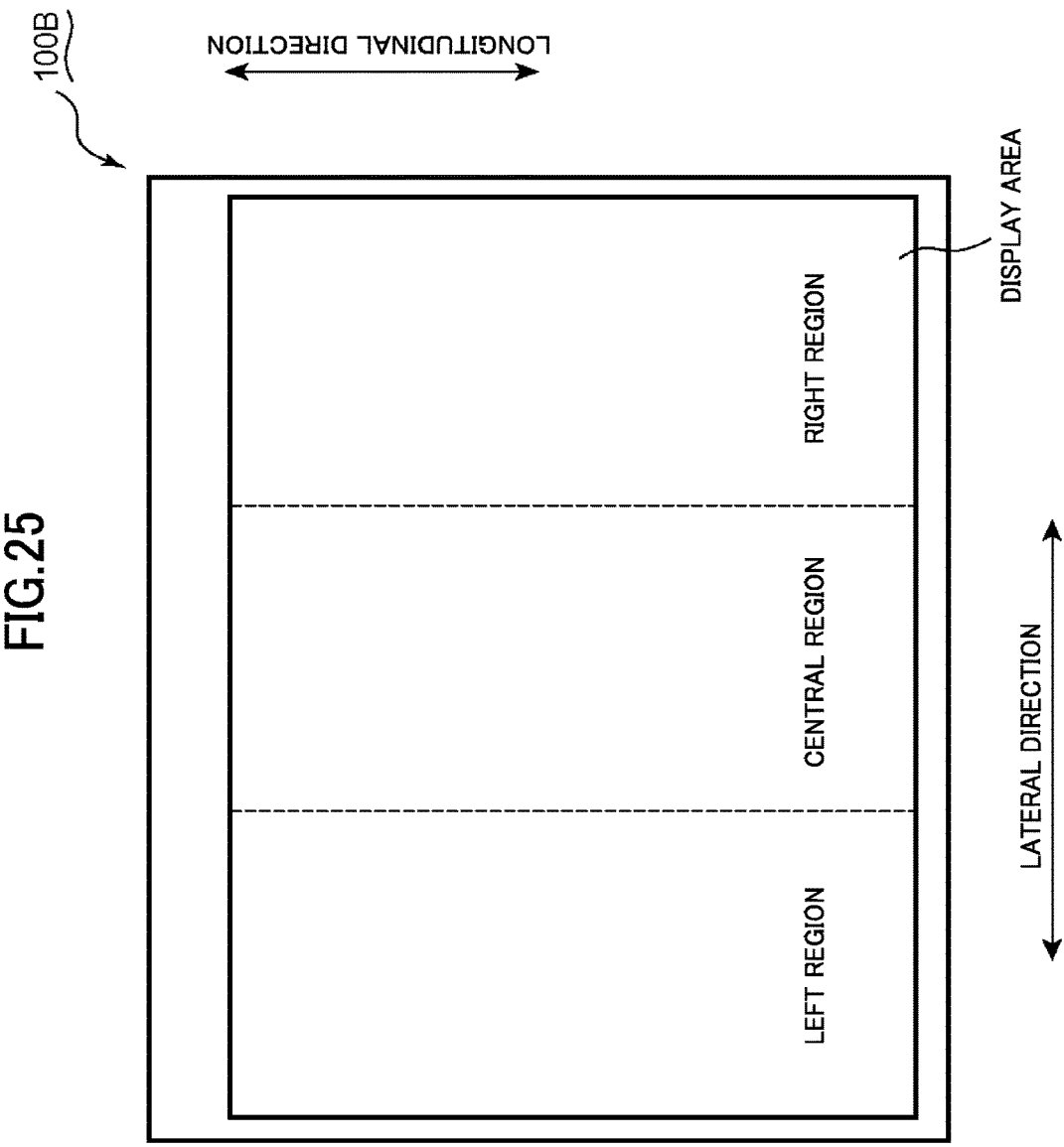
FIG. 25 is a schematic front elevation of another exemplary display device.

FIG. 25 is a schematic front elevation of a display device 100B in the fifth embodiment. With reference to FIG. 25, the display device 100B is described. In addition, the display device 100B is designed based on the basic principles described in the first embodiment.

Similar to the first embodiment, the display device 100B includes a display area to display an image. In FIG. 25, the display area is divided conceptually into three parts, a left region, a right region and a central region between the right and left regions. The left region, the central region and the right region are arranged laterally.

The connection portions where the gate lead-out lines and the gate lines are electrically connected are concentrated in the central region. In other words, the number of connection portions formed in the central region is more than that in the left region or the right region. Because gate signals are transmitted in the gate lines extending laterally, gate signals corresponding to each gate line propagate a distance of about half of a lateral edge of a display area. Thus, the principles of this embodiment can reduce fluctuation in resistance for gate signals. In this embodiment, one of the left region and the right region is exemplified as a first area. The other is exemplified as a third area. The center region is exemplified as a second area.

Sixth Embodiment

A jointing part where the gate lead-out line and the gate line are electrically connected is selected from many overlapping points formed by the gate lead-out lines and the gate lines as described in the first embodiment. The connection portion is formed in the jointing part, and the gate lead-out line and the gate line are connected electrically thereat. As a result of the forming process of a connection portion, the electrical characteristic at the jointing part may differ from that in other overlapping points. The specific electrical characteristic at the jointing parts may affect brightness in the display in a display area. In the sixth embodiment, techniques to buffer against the influence by the jointing parts are described.

Figure 26:
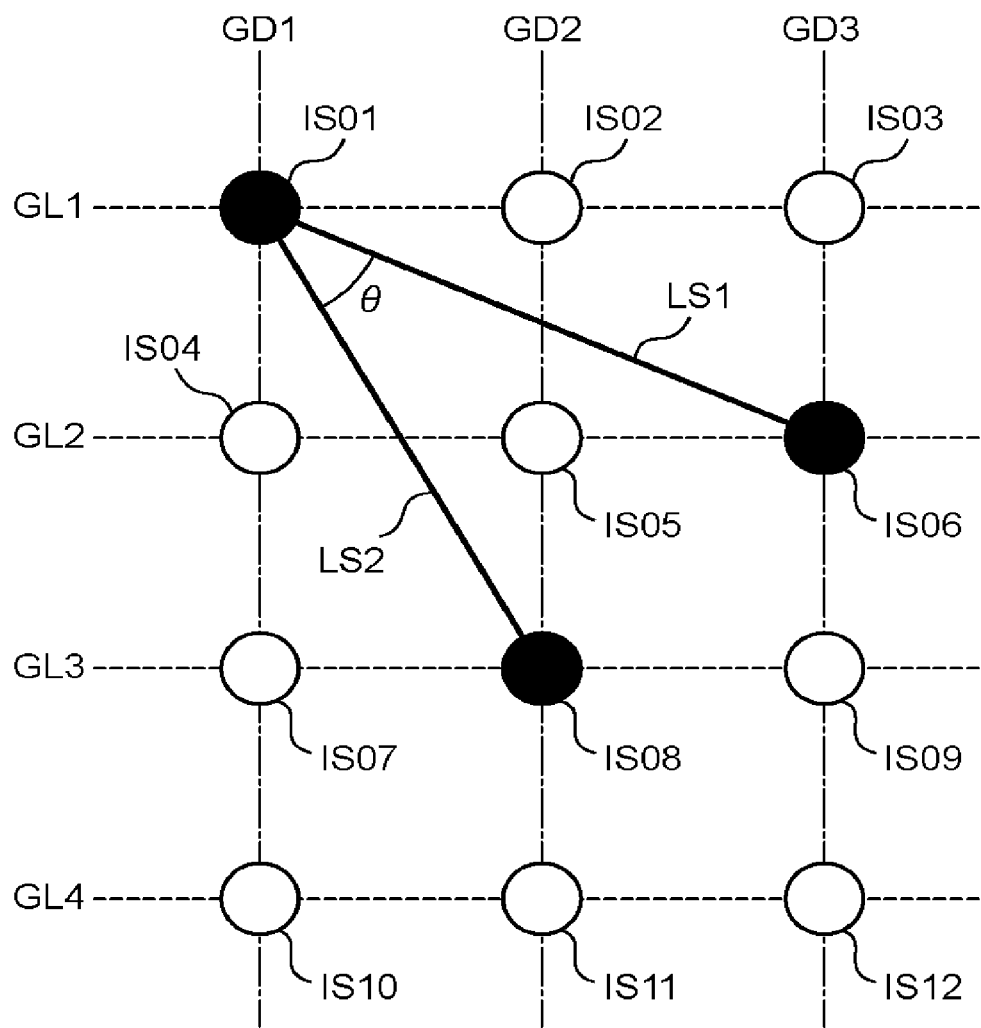
FIG. 26 is a schematic view of the gate lines and the gate lead-out lines.

FIG. 26 is a schematic view of the gate lines GL1, GL2, GL3, GL4 and the gate lead-out lines GD1, GD2, GD3. With reference to FIG. 26, techniques to buffer against the influence by the jointing parts are described.

The gate lines GL1, GL2, GL3, GL4 and the gate lead-out lines GD1, GD2, GD3 have overlapping points IS01-IS12. The overlapping points IS01, IS06, IS08 are selected as jointing parts. At overlapping point IS01, the gate line GL1 is electrically connected to the gate lead-out line GD1. At the overlapping point IS06, the gate line GL2 next to the gate line GL1 is electrically connected to the gate lead-out line GD3. At the overlapping point IS08, the gate line GL3 next to the gate line GL2 is electrically connected to the gate lead-out line GD2 formed between the gate lead-out lines GD1 and GD3.

FIG. 26 shows a line LS1 which links the overlapping point IS06 and the overlapping point IS01 and a line LS2 which links the overlapping point IS01 and the overlapping point IS08. If an angle θ between the line LS1 and LS2 is determined more than "0 degrees" and less than "180 degrees", the jointing parts are not arranged in a straight line. Thus, viewers who view the display area are almost unable to perceive a specific brightness change (excessively high or low brightness) occurring at the jointing parts. In this embodiment, the overlapping point IS01 may be exemplified as a first jointing part. The overlapping point IS06 may be exemplified as a second jointing part. The overlapping point IS08 may be exemplified as a third jointing part. The line LS1 may be exemplified as a first line. The line LS2 may be exemplified as a second line.

The geometric relationship shown in FIG. 26 may be applied to the whole display area. Ideally, jointing parts may be dispersed randomly in a whole display area. As a result, viewers can comfortably view the image displayed in the display area.

Seventh Embodiment

As described in the first embodiment, the source lines are formed along the gate lead-out lines to transmit gate signals to the gate lines. The gate signals propagated along the gate lead-out lines may cause noise in the source lines. In the seventh embodiment, techniques to buffer against interference between the gate lead-out lines and the source lines are described.

Figure 27:
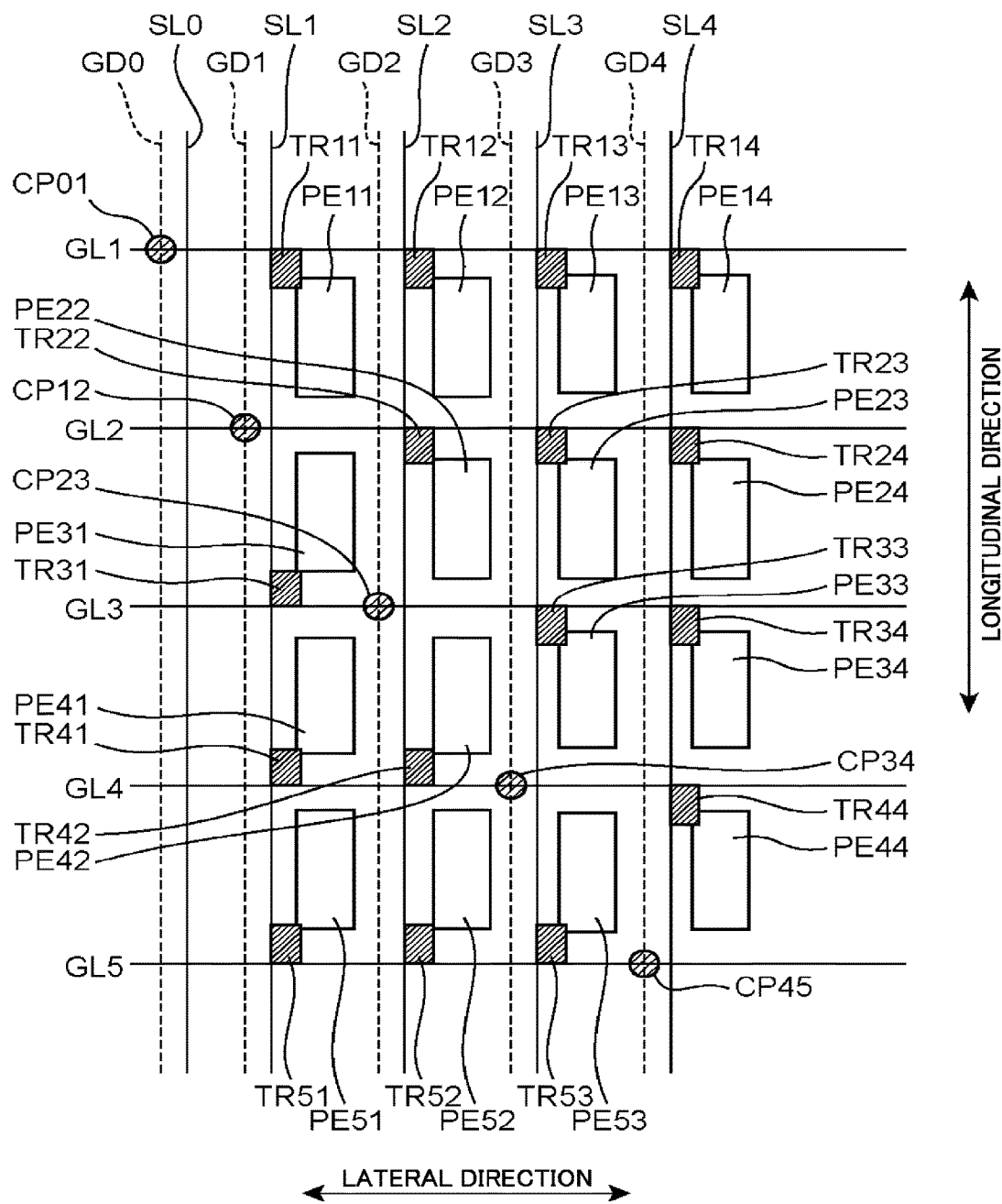
FIG. 27 is a schematic view of an arrangement of the gate lead-out lines, the gate lines and the source lines.

FIG. 27 is a schematic view of an arrangement of the gate lead-out lines, the gate lines and the source lines. With reference to FIG. 8 and FIG. 27, the arrangement of the gate lead-out lines, the gate lines and the source lines is described.

FIG. 27 shows gate lead-out lines GD0-GD4 and source lines SL0-SL4. The source line SL0 extends perpendicularly along the gate lead-out line GD0. The source line SL1 extends perpendicularly along the gate lead-out line GD1. The source line SL2 extends perpendicularly along the gate lead-out line GD2. The source line SL3 extends perpendicularly along the lead-out line GD3. The source line SL4 extends perpendicularly along the gate lead-out line GD4.

The source lines SL0-SL4 are formed in the step S150 described with reference to FIG. 8. Thus, the source lines SL0-SL4 are formed on the same layer altogether. Source signals are output to the source lines SL1 to SL4 as mentioned later. On the other hand, source signals are not output to the source line SL0. An electric potential of the source line SL0 is kept constant. In this embodiment, the source line SL0 is exemplified as a dummy source line.

FIG. 27 shows the gate lines GL1-GL5. A connection portion CP01 is formed at an overlapping point of the gate line GL1 and the gate lead-out line GD0. A connection portion CP12 is formed at an overlapping point of the gate line GL2 and the gate lead-out line GD1. A connection portion CP23 is formed in at overlapping point of the gate line GL3 and the gate lead-out line GD2. A connection portion CP34 is formed at an overlapping point of the gate line GL4 and the gate lead-out line GD3. A connection portion CP45 is formed at an overlapping point of the gate line GL5 and the gate lead-out line GD4. The gate line GL1 receives gate signals from the gate lead-out line GD0 through the connection portion CP01. The gate line GL2 receives gate signals from the gate lead-out line GD1 through the connection portion CP12. The gate line GL3 receives gate signals from the gate lead-out line GD2 through the connection portion CP23. The gate line GL4 receives gate signals from the gate lead-out line GD3 through the connection portion CP34. The gate line GL5 receives gate signals from the gate lead-out line GD4 through the connection portion CP45.

Aforementioned source line SL0 reduces a gap between a capacitance load for the gate line GL1 and a capacitance load for each of the other gate lines GL2-GL5. As a result, a remarkable gap in the property of the light emission between pixels along the gate line GL1 and the other pixels can hardly be observed.

Figure 28:
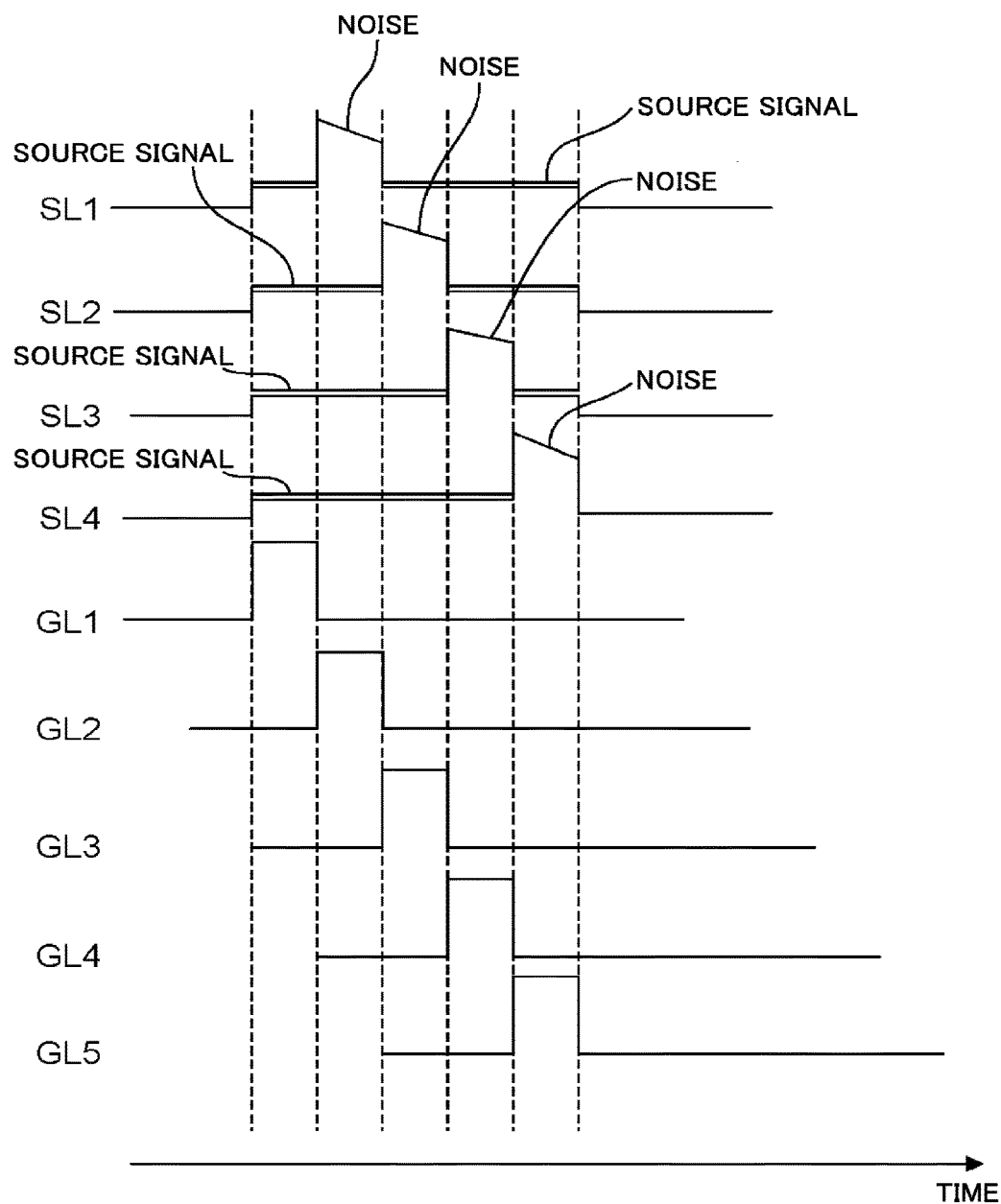
FIG. 28 is a timing chart indicating a relationship between an output of gate signals and an occurrence of noise of the source lines.

FIG. 28 is a timing chart indicating a relationship between an output of gate signals and an occurrence of noise in a source line. With reference to FIG. 27 and FIG. 28, the relationship between the output of gate signals and the occurrence of noise in the source line is described.

The gate line GL1 receives gate signals from the gate lead-out line GD0. Because the gate lead-out line GD0 is spaced apart from the source line SL1, gate signals input into the gate line GL1 barely affect the source line SL1. The gate line GL2 receives gate signals from the gate lead-out line GD1. Because the gate lead-out line GD1 extends along the source line SL1, the gate signals input into the gate line GL2 cause noise for the source signals passing through the source line SL1. The gate line GL3 receives gate signals from the gate lead-out line GD2. Because the gate lead-out line GD2 extends along the source line SL2, gate signals input into the gate line GL3 cause noise for the source signals passing through the source line SL2. The gate line GL4 receives gate signals from the gate lead-out line GD3. Because the gate lead-out line GD3 extends along the source line SL3, the gate signals input into the gate line GL4 cause noise for the source signals passing through the source line SL3. The gate line GL5 receives gate signals from the gate lead-out line GD4. Because the gate lead-out line GD4 extends along the source line SL4, the gate signals input into the gate line GL5 cause noise for the source signals passing through the source line SL4.

FIG. 27 shows TFTs TR11, TR12, TR13, TR14 arranged laterally along the gate line GL1 and pixel electrodes PE11, PE12, PE13, PE14 connected to the TFTs TR11, TR12, TR13, TR14 respectively. The TFT TR11 is electrically connected to the gate line GL1, the source line SL1 and the pixel electrode PE11. The TFT TR11 controls an input of source signals from the source line SL1 to the pixel electrode PE11 in accordance with gate signals input to the gate line GL1. The TFT TR12 is electrically connected to the gate line GL1, the source line SL2 and the pixel electrode PE12. The TFT TR12 controls an input of source signals from the source line SL2 to the pixel electrode PE12 in accordance with gate signals input to the gate line GL1. The TFT TR13 is electrically connected to the gate line GL1, the source line SL3 and the pixel electrode PE13. The TFT TR13 controls an input of source signals from the source line SL3 to the pixel electrode PE13 in accordance with gate signals input to the gate line GL1. The TFT TR14 is electrically connected to the gate line GL1, the source line SL4 and the pixel electrode PE14. The TFT TR14 controls an input of source signals from the source line SL4 to the pixel electrode PE14 in accordance with gate signals input to the gate line GL1. As mentioned above, the pixel electrodes PE11-PE14 can receive source signals properly, because an input of gate signals to the gate line GL1 depends on the gate lead-out line GD0 which is spaced apart from the source lines SL1-SL4.

FIG. 27 shows pixel electrodes PE31, PE22, PE23, PE24 arranged laterally between the gate lines GL2 and GL3 and TFTs TR31, TR22, TR23, TR24 corresponding to the pixel electrodes PE31, PE22, PE23, PE24, respectively. TFT TR31 is electrically connected to the gate line GL3, the source line SL1 and the pixel electrode PE31. TFT TR31 controls an input of source signals from the source line SL1 to the pixel electrode PE31 in accordance with gate signals input into the gate line GL3. As shown in FIG. 28, source signals passing through the source line SL1 are little affected by gate signals supplied to the gate line GL3 while being influenced by gate signals supplied to the gate line GL2. Thus, pixel electrode PE31 can receive source signals properly.

The TFT TR22 is electrically connected to the gate line GL2, the source line SL2 and the pixel electrode PE22. TFT TR22 controls an input of source signals from the source line SL2 to pixel electrode PE22 in accordance with gate signals input into the gate line GL2. The TFT TR23 is electrically connected to the gate line GL2, the source line SL3 and the pixel electrode PE23. TFT TR23 controls an input of source signals from the source line SL3 to the pixel electrode PE23 in accordance with gate signals input into the gate line GL2. The TFT TR24 is electrically connected to the gate line GL2, the source line SL4 and the pixel electrode PE24. TFT TR24 controls an input of source signals from the source line SL4 to pixel electrode PE24 in accordance with gate signals input into the gate line GL2. As mentioned above, pixel electrodes PE31, PE22, PE23, PE24 can receive source signals properly, because the input of gate signals to the gate line GL2 depends on the gate lead-out line GD1 which is spaced apart from the source lines SL2-SL4.

FIG. 27 shows pixel electrodes PE41, PE42, PE33, PE34 arranged laterally between the gate line GL3 and the gate line GL4 and TFTs TR41, TR42, TR33, TR34 corresponding to the pixel electrodes PE41, PE42, PE33, PE34, respectively. TFT TR41 is electrically connected to the gate line GL4, the source line SL1 and the pixel electrode PE41. The TFT TR41 controls an input of source signals from the source line SL1 to the pixel electrode PE41 in accordance with gate signals input into the gate line GL4. As mentioned above, the pixel electrode PE41 can receive source signals properly, because the input of gate signals to the gate line GL4 depends on the gate lead-out line GD3 which is spaced apart from the source line SL1.

The TFT TR42 is electrically connected to the gate line GL4, the source line SL2 and the pixel electrode PE42. The TFT TR42 controls input of source signals from the source line SL2 to the pixel electrode PE42 in accordance with gate signals input into the gate line GL4. As shown in FIG. 28, source signals passing through the source line SL2 are little affected by gate signals supplied to the gate line GL4, while being influenced by gate signals supplied to gate line GL3. Therefore, pixel electrode PE42 can receive source signals properly.

The TFT TR33 is electrically connected to the gate line GL3, the source line SL3 and the pixel electrode PE33. The TFT TR33 controls an input of source signals from the source line SL3 to the pixel electrode PE33 in accordance with gate signals input into the gate line GL3. The TFT TR34 controls an input of source signals from the source line SL4 to the pixel electrode PE34 in accordance with gate signals input into the gate line GL3. As mentioned above, the pixel electrodes PE33, PE34 can receive source signals properly, because the input of gate signals to the gate line GL3 depends on the gate lead-out line GD2 which is spaced apart from the source lines SL3, SL4.

FIG. 27 shows pixel electrodes PE51, PE52, PE53, PE44 arranged laterally between the gate line GL4 and GL5, and TFTs TR51, TR52, TR53, TR44 corresponding to the pixel electrodes PE51, PE52, PE53, PE44, respectively. The TFT TR51 is electrically connected to the gate line GL5, the source line SL1 and the pixel electrode PE51. The TFT TR51 controls an input of source signals from the source line SL1 to the pixel electrode PE51 in accordance with gate signals input into the gate line GL5. The TFT TR52 is electrically connected to the gate line GL5, the source line SL2 and the pixel electrode PE52. The TFT TR52 controls an input of source signals from the source line SL2 to the pixel electrode PE52 in accordance with gate signals input into the gate line GL5. The TFT TR53 is electrically connected to the gate line GL5, the source line SL3 and the pixel electrode PE53. The TFT TR53 controls an input of source signals from the source line SL3 to the pixel electrode PE53 in accordance with gate signals input into the gate line GL5. As shown in FIG. 28, source signals passing through the source lines SL1-SL3 are little affected by gate signals supplied to the gate line GL5. Therefore, the pixel electrodes PE51-PE53 can receive source signals properly.

The TFT TR44 is electrically connected to the gate line GL4, the source line SL4 and the pixel electrode PE44. The TFT TR44 controls an input of source signals from the source line SL4 to the pixel electrode PE44 in accordance with gate signals input into the gate line GL4. As mentioned above, the pixel electrode PE44 can receive source signals properly, because the input of gate signals to the gate line GL4 depends on the gate lead-out line GD3 which is spaced apart from the source lines SL4.

In this embodiment, the region where the pixel electrode PE42 is arranged may be exemplified as a first pixel region. The region where the pixel electrode PE33 is arranged may be exemplified as a second pixel region. The region where pixel electrode PE53 is arranged may be exemplified as a third pixel region. The region where pixel electrode PE52 is arranged may be exemplified as a fourth pixel region.

In this embodiment, the gate lead-out line GD3 may be exemplified as a first lead-out line. The connection portion CP34 may be exemplified as a first connection portion.

In this embodiment, the gate line GL4 may be exemplified as a first gate line. The gate line GL3 may be exemplified as a second gate line. The gate line GL5 may be exemplified as a third gate line.

In this embodiment, source line SL3 may be exemplified as a first source line. The source line SL2 may be exemplified as a second source line. The source line SL4 may be exemplified as a third source line.

In this embodiment, the pixel electrode PE42 may be exemplified as a first pixel electrode. The pixel electrode PE33 may be exemplified as a second pixel electrode. The pixel electrode PE53 may be exemplified as a third pixel electrode. The pixel electrode PE52 may be exemplified as a fourth pixel electrode.

In this embodiment, the TFT TR42 may be exemplified as a first TFT. The TFT TR33 may be exemplified as a second TFT. The TFT TR53 may be exemplified as a third TFT. The TFT TR52 may be exemplified as a fourth TFT.

In this embodiment, the group including the gate line GL4 and the source line SL2 may be exemplified as a first pair. The group including the gate line GL3 and the source line SL2 may be exemplified as a second pair. The group including the gate line GL3 and the source line SL3 may be exemplified as a third pair. The group including the gate line GL3 and the source line SL4 may be exemplified as a fourth pair. The group including the gate line GL4 and the source line SL4 may be exemplified as a fifth pair. The group including the gate line GL5 and the source line SL4 may be exemplified as a sixth pair. The group including the gate line GL5 and the source line SL3 may be exemplified as a seventh pair. The group including the gate line GL5 and the source line SL1 may be exemplified as an eighth pair.

In this embodiment, the TFT TR42 exemplified as the first TFT is electrically connected to the group including the gate line GL4 and the source line SL2. The first TFT may be electrically connected to the group including the gate line GL3 and the source line SL3 alternatively.

In this embodiment, the TFT TR33 exemplified as the second TFT is electrically connected to the group including the gate line GL3 and the source line SL3.

In this embodiment, the TFT TR53 exemplified as the third TFT is electrically connected to the group including the gate line GL5 and the source line SL3.

In this embodiment, the TFT TR52 exemplified as the fourth TFT is electrically connected to the group including the gate line GL5 and the source line SL2.

If the first TFT is electrically connected to a group including the gate line GL3 and the source line SL3, the second TFT should be electrically connected to a group including the gate line GL3 and the source line SL4 or a group including the gate line GL4 and the source line SL4.

The above-mentioned arrangement of the TFTs may be determined according to the following conditions.

The TFT is arranged so that if a connection portion is formed between a gate line and a gate lead-out line, source signals from a source line formed along the gate lead-out line are not supplied to a pixel electrode in accordance with gate signals from the gate line. On the other hand, the TFT may be arranged so that source signals are supplied to a pixel electrode in accordance with gate signals from a gate line adjacent to the gate line where a connection portion is formed. The TFT may be arranged so that source signals from the source line adjacent to a source line along a gate lead-out line where a connection portion is formed are supplied to the pixel electrode alternatively. If the TFT is arranged so that these conditions are met, the interference between a gate lead-out line and a source line is buffered properly.

A pixel electrode is arranged in a rectangular region sectioned by gate lines and source lines (or gate lead-out lines). A connection portion where a gate line is electrically connected to a gate lead-out line is formed in one corner out of four corners in the rectangle region. If the above-mentioned conditions are met, one corner is selected as an overlapping point where a TFT and a source line connect to each other from corners (overlapping points of a gate line and a source line (a gate lead-out line)) of the rectangular region except a connection portion. In other words, the interference between a gate lead-out line and a source line is buffered properly, because a TFT is not connected to a source line at the overlapping point selected as a connection portion.

Figure 29:
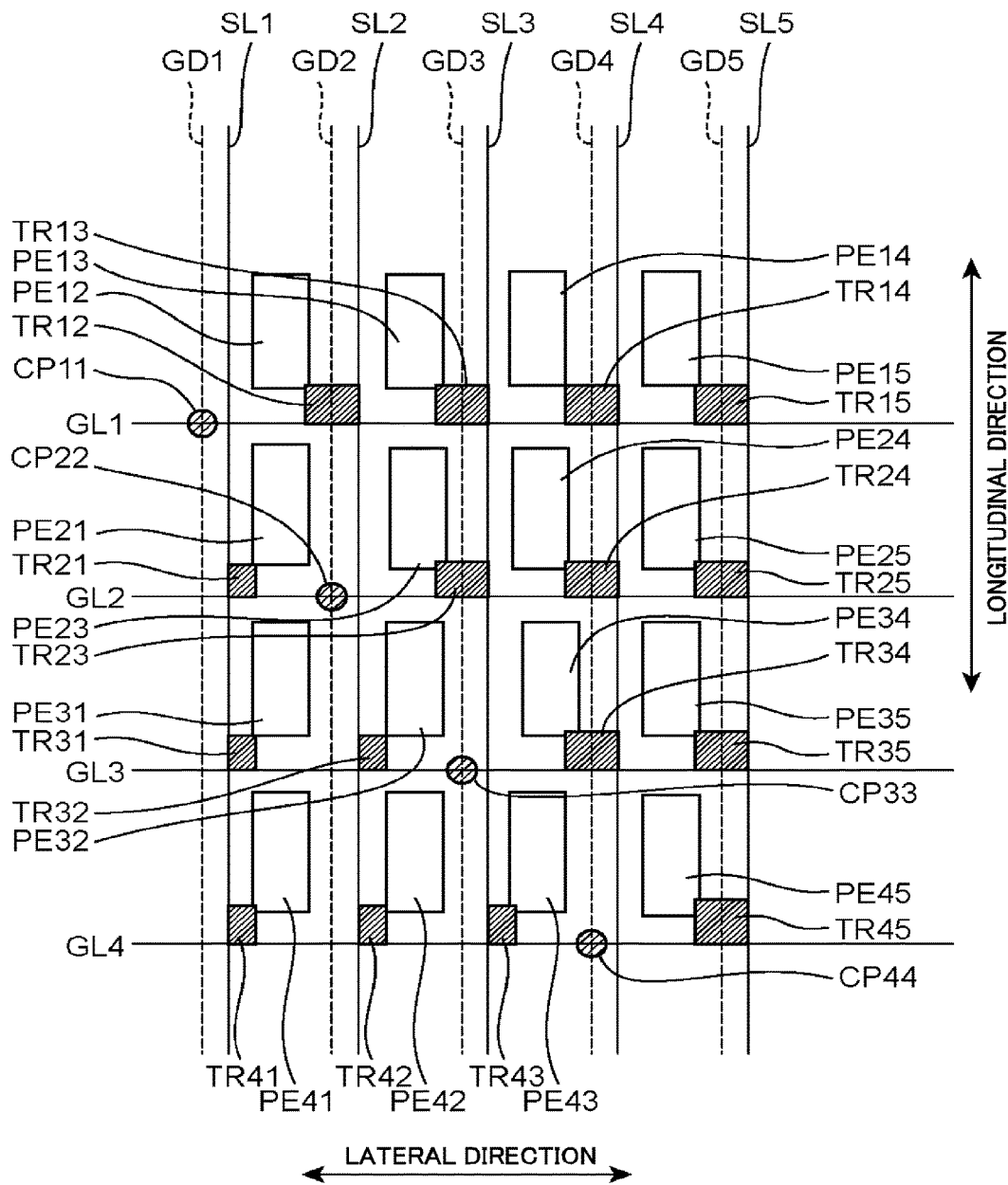
FIG. 29 is a schematic view indicating another arrangement of the gate lead-out lines, the gate lines and the source lines.

FIG. 29 is a schematic view indicating another arrangement of gate lead-out lines, gate lines and source lines. With reference to FIG. 29, the arrangement of the gate lead-out lines, the gate lines and the source lines is described. In addition, the arrangement shown in FIG. 29 is based on principles described with reference to FIG. 27 and FIG. 28.

FIG. 27 shows the gate lead-out lines GD1-GD5 and source lines SL1-SL5. The source line SL1 extends perpendicularly along the gate lead-out line GD1. The source line SL2 extends perpendicularly along the gate lead-out line GD2. The source line SL3 extends perpendicularly along the gate lead-out line GD3. The source line SL4 extends perpendicularly along the gate lead-out line GD4. The source line SL5 extends perpendicularly along the gate lead-out line GD5.

FIG. 29 shows the gate lines GL1-GL4. The connection portion CP11 is formed at the overlapping point of the gate line GL1 and the gate lead-out line GD1. The connection portion CP22 is formed at the overlapping point of the gate line GL2 and the gate lead-out line GD2. A connection portion CP33 is formed at the overlapping point of the gate line GL3 and the gate lead-out line GD3. A connection portion CP44 is formed at the overlapping point of the gate line GL4 and the gate lead-out line GD4. The gate line GL1 receives gate signals from the gate lead-out line GD1 through the connection portion CP11. The gate line GL2 receives gate signals from the gate lead-out line GD2 through the connection portion CP22. The gate line GL3 receives gate signals from the gate lead-out line GD3 through the connection portion CP33. The gate line GL4 receives gate signals from the gate lead-out line GD4 through the connection portion CP44.

Figure 30:
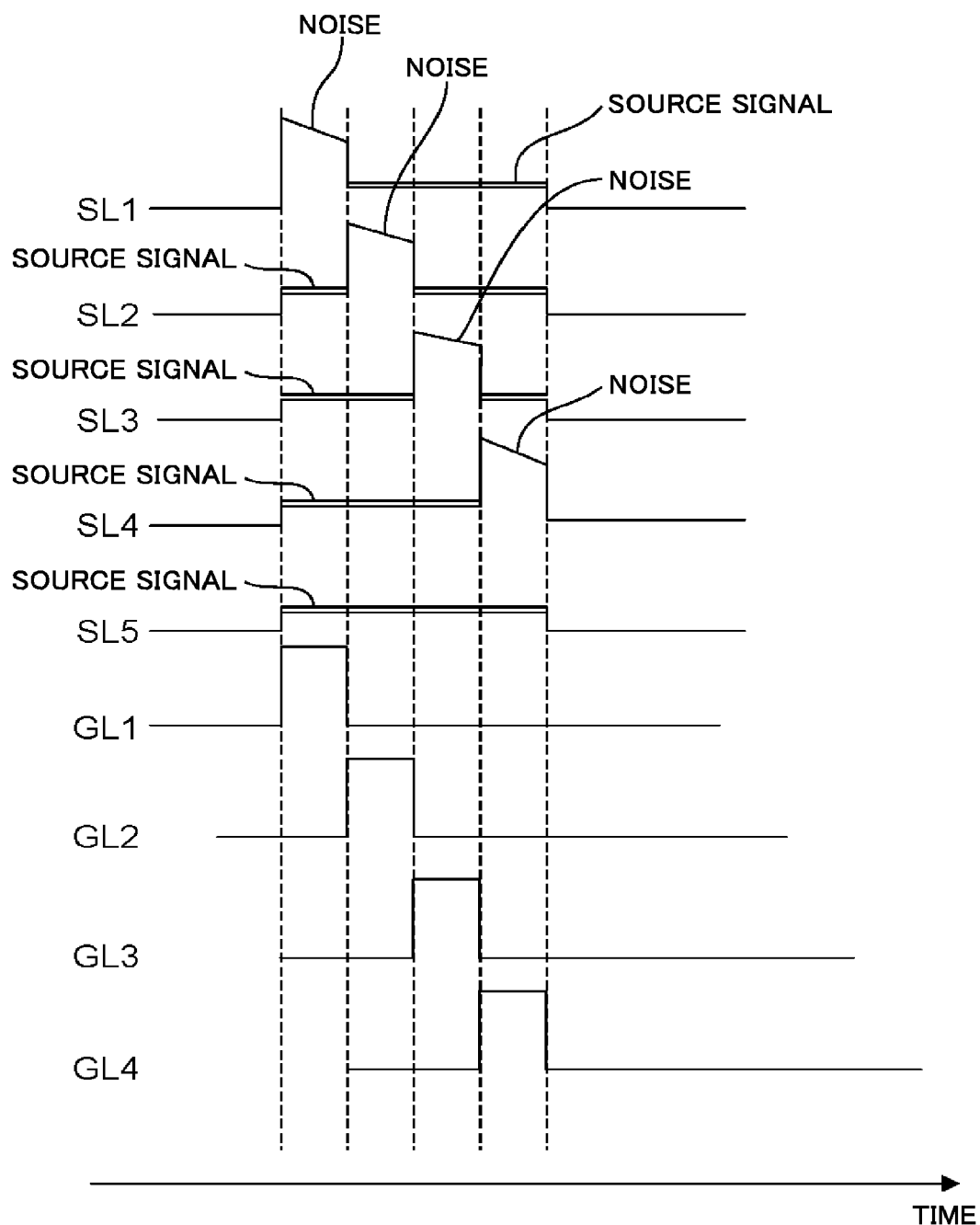
FIG. 30 is a timing chart indicating a relationship between an output of gate signals and an occurrence of noise of the source lines.

FIG. 30 is a timing chart indicating a relationship between an output of gate signals and an occurrence of noise in source lines. With reference to FIG. 29 and FIG. 30, the relationship between the output of gate signals and an occurrence of noise in a source line is described.

The gate line GL1 receives gate signals from the gate lead-out line GD1. Because the gate lead-out line GD1 extends along the source line SL1, gate signals input into the gate line GL1 cause noise for the source signals passing through the source line SL1. The gate line GL2 receives gate signals from the gate lead-out line GD2. Because the gate lead-out line GD2 extends along the source line SL2, the gate signals input into the gate line GL2 cause noise for the source signals passing through the source line SL2. The gate line GL3 receives gate signals from the gate lead-out line GD3. Because the gate lead-out line GD3 extends along the source line SL3, gate signals input into the gate line GL3 cause noise for the source signals passing through the source line SL3. The gate line GL4 receives gate signals from the gate lead-out line GD4. Because the gate lead-out line GD4 extends along the source line SL4, gate signals input into the gate line GL4 cause noise for the source signals passing through the source line SL4. In addition, source signals passing through the source line SL5 are little affected by gate signals supplied to the gate line GL1-GL5.

FIG. 29 shows TFTs TR12, TR13, TR14, TR15 arranged laterally along the gate line GL1 and pixel electrodes PE12, PE13, PE14, PE15 connected to the TFTs TR12, TR13, TR14, TR15, respectively. The TFT TR12 is electrically connected to the gate line GL1, the source line SL2 and the pixel electrode PE12. The TFT TR12 controls an input of source signals from the source line SL2 to pixel electrode PE12 in accordance with gate signals input to the gate line GL1. The TFT TR13 is electrically connected to the gate line GL1, the source line SL3 and the pixel electrode PE13. The TFT TR13 controls input of source signals from the source line SL3 to the pixel electrode PE13 in accordance with gate signals input to the gate line GL1. The TFT TR14 is electrically connected to the gate line GL1, the source line SL4 and the pixel electrode PE14. The TFT TR14 controls an input of source signals from the source line SL4 to pixel electrode PE14 in accordance with gate signals input to the gate line GL1. The TFT TR15 is electrically connected to the gate line GL1, the source line SL5 and the pixel electrode PE15. The TFT TR15 controls an input of source signals from the source line SL5 to the pixel electrode PE15 in accordance with gate signals input to the gate line GL1. As mentioned above, pixel electrodes PE12-PE15 can receive source signals properly, because the input of gate signals to the gate line GL1 depends on gate lead-out line GD1 which is spaced apart from the source lines SL2-SL5.

FIG. 29 shows pixel electrodes PE21, PE23, PE24, PE25 arranged laterally between the gate line GL1 and the gate line GL2, and TFTs TR21, TR23, TR24, TR25 corresponding to the pixel electrodes PE21, PE23, PE24, PE25, respectively. The TFT TR21 is electrically connected to the gate line GL2, the source line SL1 and the pixel electrode PE21. The TFT TR21 controls an input of source signals from the source line SL1 to the pixel electrode PE21 in accordance with gate signals input into the gate line GL2. As shown in FIG. 30, source signals passing through the source line SL1 are little affected by gate signals supplied to the gate line GL2. Therefore, the pixel electrode PE21 can receive source signals properly.

The TFT TR23 is electrically connected to the gate line GL2, the source line SL3 and the pixel electrode PE23. The TFT TR23 controls an input of source signals from the source line SL3 to pixel electrode PE23 in accordance with gate signals input into the gate line GL2. The TFT TR24 is electrically connected to the gate line GL2, the source line SL4 and the pixel electrode PE24. The TFT TR24 controls an input of source signals from the source line SL4 to pixel electrode PE24 in accordance with gate signals input into the gate line GL2. The TFT TR25 is electrically connected to the gate line GL2, the source line SL5 and the pixel electrode PE25. The TFT TR25 controls an input of source signals from the source line SL5 to the pixel electrode PE25 in accordance with gate signals input into the gate line GL2. As mentioned above, pixel electrodes PE23-PE25 can receive source signals properly, because the input of gate signals to the gate line GL2 depends on the gate lead-out line GD2 which is spaced apart from the source lines SL3-SL5.

FIG. 29 shows pixel electrodes PE31, PE32, PE34, PE35 arranged laterally between the gate line GL2 and GL3, and TFTs TR31, TR32, TR34, TR35 corresponding to the pixel electrodes PE31, PE32, PE34, PE35 respectively. The TFT TR31 is electrically connected to the gate line GL3, the source line SL1 and the pixel electrode PE31. The TFT TR31 controls an input of source signals from the source line SL1 to the pixel electrode PE31 in accordance with gate signals input into the gate line GL3. As mentioned above, the pixel electrodes PE31 can receive source signals properly, because an input of gate signals to the gate line GL3 depends on the gate lead-out line GD3 which is spaced apart from the source lines SL1.

The TFT TR32 is electrically connected to the gate line GL3, the source line SL2 and the pixel electrode PE32. The TFT TR32 controls an input of source signals from the source line SL2 to the pixel electrode PE32 in accordance with gate signals input into the gate line GL3. As shown in FIG. 30, source signals passing through the source line SL2 is little affected by gate signals supplied to the gate line GL3. Therefore, the pixel electrode PE32 can receive source signals properly.

The TFT TR34 is electrically connected to the gate line GL3, the source line SL4 and the pixel electrode PE34. The TFT TR34 controls an input of source signals from the source line SL4 to the pixel electrode PE34 in accordance with gate signals input into the gate line GL3. The TFT TR35 controls an input of source signals from the source line SL5 to the pixel electrode PE35 in accordance with gate signals input into the gate line GL3. As mentioned above, pixel electrodes PE34, PE35 can receive source signals properly, because an input of gate signals to the gate line GL3 depends on the gate lead-out line GD3 which is spaced apart from the source lines SL4, SL5.

FIG. 29 shows pixel electrodes PE41, PE42, PE43, PE45 arranged laterally between the gate line GL3 and GL4, and TFTs TR41, TR42, TR43, TR45 corresponding to the pixel electrodes PE41, PE42, PE43, PE45 respectively. The TFT TR41 is electrically connected to the gate line GL4, the source line SL1 and the pixel electrode PE41. The TFT TR41 controls an input of source signals from the source line SL1 to the pixel electrode PE41 in accordance with gate signals input into the gate line GL4. The TFT TR42 is electrically connected to the gate line GL4, the source line SL2 and the pixel electrode PE42. The TFT TR42 controls input of source signals from the source line SL2 to the pixel electrode PE42 in accordance with gate signals input into the gate line GL4. The TFT TR43 is electrically connected to the gate line GL4, the source line SL3 and the pixel electrode PE43. The TFT TR43 controls an input of source signals from the source line SL3 to the pixel electrode PE43 in accordance with gate signals input into the gate line GL4. As shown in FIG. 30, source signals passing through the source line SL1-SL3 are little affected by gate signals supplied to the gate line GL4. Therefore, the pixel electrode PE41-PE43 can receive source signals properly.

The TFT TR45 is electrically connected to the gate line GL4, the source line SL5 and the pixel electrode PE45. The TFT TR45 controls an input of source signals from the source line SL5 to the pixel electrode PE45 in accordance with gate signals input into the gate line GL4. As mentioned above, the pixel electrodes PE45 can receive source signals properly, because the input of gate signals to the gate line GL4 depends on the gate lead-out line GD4 which is spaced apart from the source line SL5.

Eighth Embodiment

The source lines are formed along the gate lead-out lines to transmit gate signals to the gate lines as described in the first embodiment. The overlap between source lines and gate lead-out lines may cause a delay of gate signals propagated along the gate lead-out lines. In the eighth embodiment, techniques to buffer the delay of gate signals propagated along the gate lead-out lines are described.

Figure 31:
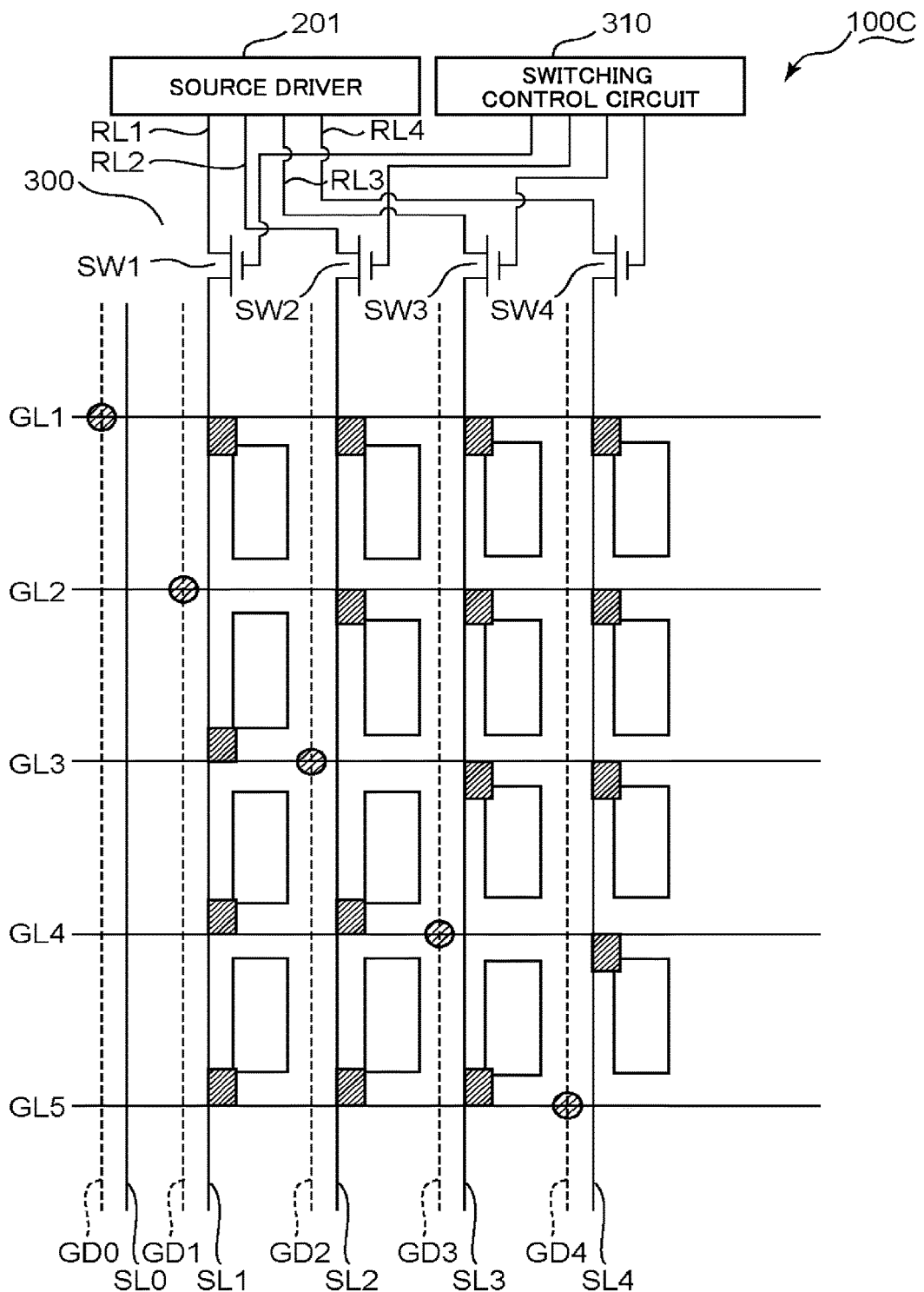
FIG. 31 is a schematic view of another exemplary display device.

FIG. 31 is a schematic view of a display device 100C of the eighth embodiment. With reference to FIG. 27 and FIG. 31, the display device 100C is described.

The display device 100C includes the gate lines GL1-GL5, the gate lead-out lines GD0-GD4 and the source lines SL0-SL4. The arrangement of the gate lines GL1-GL5, the gate lead-out lines GD0-GD4 and the source lines SL0-SL4 is designed based on the seventh embodiment (refer to FIG. 27). Thus, an explanation in the seventh embodiment is referred regarding the gate line GL1-GL5, the gate lead-out line GD0-GD4 and source line SL0-SL4.

The display device 100C further includes a source driver 201, a relay circuit 300 connecting between the source driver 201 and the gate lead-out lines GD0-GD4, and a switching control circuit 310 controlling the relay circuit 300. The relay circuit 300 includes a relay line RL1 connecting between the source line SL1 and the source driver 201, a relay line RL2 connecting between a source line SL2 and the source driver 201, a relay line RL3 connecting between the source line SL3 and the source driver 201 and a relay line RL4 connecting between the source line SL4 and the source driver 201. The relay circuit 300 further includes a switch element SW1 corresponding to the relay line RL1, a switch element SW2 corresponding to the relay line RL2, a switch element SW3 corresponding to the relay line RL3 and a switch element SW4 corresponding to the relay line RL4.

The switch element SW1 switches connection between the relay line RL1 and the source line SL1 or disconnection between the relay line RL1 and the source line SL1 under the control of the switching control circuit 310. The switch element SW2 switches connection between the relay line RL2 and the source line SL2 or disconnection between the relay line RL2 and the source line SL2 under the control of the switching control circuit 310. The switch element SW3 switches connection between the relay line RL3 and the source line SL3 or disconnection between the relay line RL3 and the source line SL3 under the control of the switching control circuit 310. The switch element SW4 switches connection between the relay line RL4 and the source line SL4 or disconnection between the relay line RL4 and the source line SL4 under the control of the switching control circuit 310.

While the switch element SW1 is switched to disconnect between the relay line RL1 and the source line SL1, a high resistance value for source signals output from the source driver 201 to the source line SL1 is accomplished. While the switch element SW2 is switched to disconnect between the relay line RL2 and the source line SL2, a high resistance value for source signals output from the source driver 201 to the source line SL2 is accomplished. While the switch element SW3 is switched to disconnect between the relay line RL3 and the source line SL3, a high resistance value for source signals output from the source driver 201 to the source line SL3 is accomplished. While the switch element SW4 is switched to disconnect between the relay line RL4 and the source line SL4, a high resistance value for source signals output from the source driver 201 to the source line SL4 is accomplished. In this embodiment, a high resistance value during the time when the switch elements SW1-SW4 are switched to disconnection between the relay lines RL1-RL4 and the source lines SL1-SL4 is exemplified as a first resistance value. The relay circuit 300 and switching control circuit 310 is exemplified as an adjusting portion.

While the switch element SW1 connects between the relay line RL1 and the source line SL1, a low resistance value for source signals output from the source driver 201 to the source line SL1 is accomplished. While the switch element SW2 connects between the relay line RL2 and the source line SL2, a low resistance value for source signals output from the source driver 201 to the source line SL2 is accomplished. While the switch element SW3 connects between the relay line RL3 and the source line SL3, a low resistance value for source signals output from the source driver 201 to the source line SL3 is accomplished. While the switch element SW4 connects between the relay line RL4 and the source line SL4, a low resistance value for source signals output from the source driver 201 to the source line SL4 is accomplished. In this embodiment, a low resistance value during the time when the switch elements SW1-SW4 connect the source lines SL1-SL4 and the relay lines RL1-RL4 is exemplified as a second resistance value.

While gate signals are output to the gate lead-out line GD1, the switch element SW1 disconnects between the relay line RL1 and the source line SL1. During this period, the other switch elements SW2-SW4 connect the relay lines RL2-RL4 and the source lines SL2-SL4 respectively. In this case, the gate lead-out line GD1 is exemplified as a first lead-out line. One of the gate lead-out lines GD2-GD4 is exemplified as a second lead-out line.

While gate signals are output to the gate lead-out line GD2, the switch element SW2 disconnects the relay line RL2 and the source line SL2. During this period, the other switch elements SW1, SW3 and SW4 connect the relay lines RL1, RL3 and RL4 and the source lines SL1, SL3 and SL4 respectively. In this case, the gate lead-out line GD2 is exemplified as a first lead-out line. One of the gate lead-out lines GD1, GD3 and GD4 is exemplified as a second lead-out line.

While gate signals are output to the gate lead-out line GD3, the switch element SW3 disconnects the relay line RL3 and the source line SL3. During this period, the other switch elements SW1, SW2 and SW4 connect the relay lines RL1, RL2 and RL4 to the source lines SL1, SL2 and SL4 respectively. In this case, the gate lead-out line GD3 is exemplified as a first lead-out line. One of the gate lead-out lines GD1, GD2 and GD4 is exemplified as a second lead-out line.

While gate signals are output to the gate lead-out line GD4, the switch element SW4 disconnects between the relay line RL4 and the source line SL4. During this period, the other switch elements SW1-SW3 connect the relay lines RL1-RL3 and the source lines SL1-SL4 respectively. In this case, the gate lead-out line GD4 is exemplified as a first lead-out line. One of the gate lead-out lines GD1-GD4 is exemplified as a second lead-out line.

Figure 32:
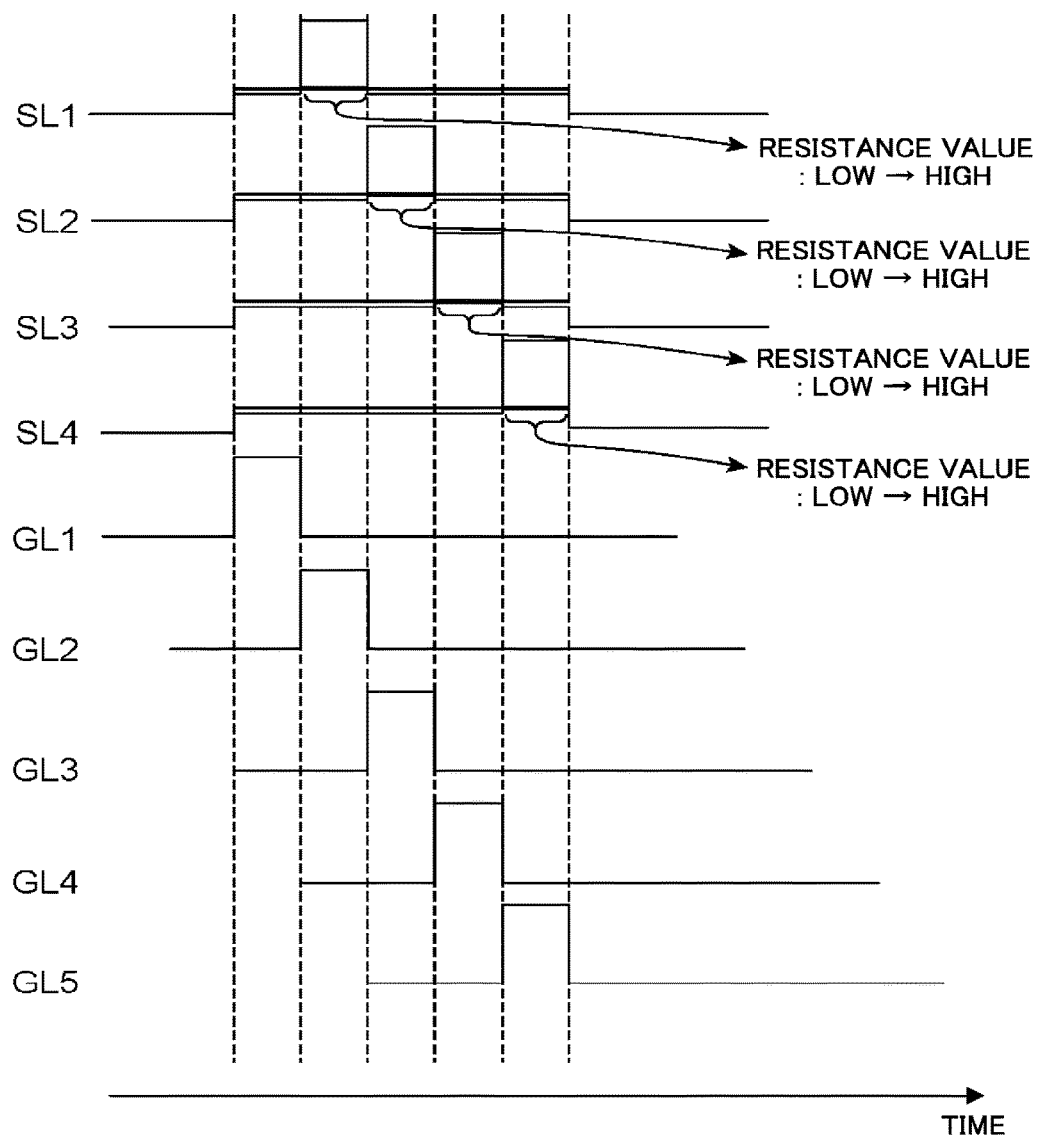
FIG. 32 is a timing chart indicating a timing of a switch of resistance value.

FIG. 32 is a schematic timing chart indicating a switch of resistance value. With reference to FIG. 31 and FIG. 32, a switching timing of resistance value is described.

In synchronization with the output of gate signals to the gate line GL2, the resistance value for source signals supplied to source line SL1 increases. As a result, a pulsatile noise corresponding to gate signals supplied to the gate line GL2 occurs. The fluctuation of the electric potential difference between the source line SL1 and the gate lead-out line GD1 which corresponds to the gate line GL2 may decrease by the noise. As a result, the delay of gate signals supplied to the gate line GL2 becomes small.

In synchronization with the output of gate signals to the gate line GL3, the resistance value for source signals supplied to source line SL2 increases. As a result, a pulsatile noise corresponding to gate signals supplied to the gate line GL3 occurs. The fluctuation of the electric potential difference between the source line SL2 and the gate lead-out line GD2 which corresponds to the gate line GL3 may decrease by the noise. As a result, the delay of gate signals supplied to the gate line GL3 becomes small.

In synchronization with the output of gate signals to the gate line GL4, the resistance value for source signals supplied to source line SL3 increases. As a result, a pulsatile noise corresponding to gate signals supplied to the gate line GL4 occurs. The fluctuation of the electric potential difference between the source line SL3 and the gate lead-out line GD3 which corresponds to the gate line GL4 may decrease by the noise. As a result, the delay of gate signals supplied to the gate line GL4 becomes small.

In synchronization with the output of gate signals to the gate line GL5, the resistance value for source signals supplied to source line SL4 increases. As a result, a pulsatile noise corresponding to gate signals supplied to the gate line GL5 occurs. The fluctuation of the electric potential difference between the source line SL4 and the gate lead-out line GD4 which corresponds to the gate line GL5 may decrease by the noise. As a result, the delay of gate signals supplied to the gate line GL5 becomes small.

The above-mentioned switching control of resistance value barely affects a write of source signals under the principle described in the seventh embodiment. Thus, the principle in this embodiment is preferably available with the principle in the seventh embodiment.

Figure 33:
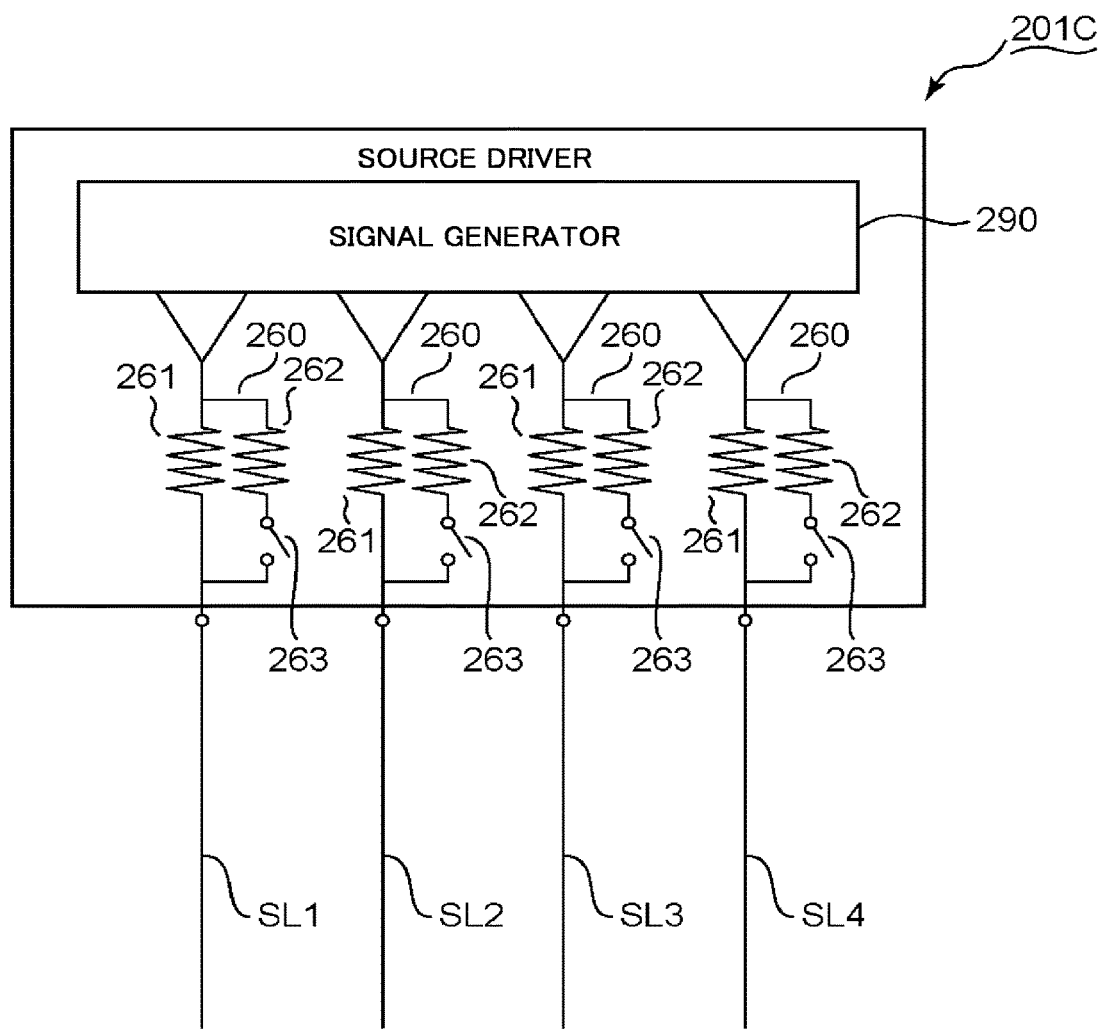
FIG. 33 is a schematic view of another source driver.

FIG. 33 is a schematic view of another source driver 201C which is available in place of the source driver 201. With reference to FIG. 32 and FIG. 33, alternative source driver 201C is described.

The source driver 201C includes a signals generator 290 generating source signals and output circuits 260 outputting source signals to source lines SL1-SL4. Each output circuit 260 includes a first resistance element 261, a second resistance element 262 and a switch element 263. The second resistance element 262 has a higher resistance value than the first resistance element 261. The switch element 263 is connected in series to the second resistance element 262. When the switch element 263 switches "on", the output circuit 260 becomes a parallel circuit of the first resistance element 261 and the second resistance element 262. When the switch element 263 switches "off", the output circuit 260 becomes a circuit with only the first resistance element 261.

The source driver 201C may achieve a high resistance value or a low resistance value by the switch element 263. As a result, the switching control of resistance value described with FIG. 32 is accomplished.

Ninth Embodiment

The delay of gate signals can be buffered without the switching control of the resistance value. In this ninth embodiment, techniques to buffer the delay of gate signals are described.

Figure 34:
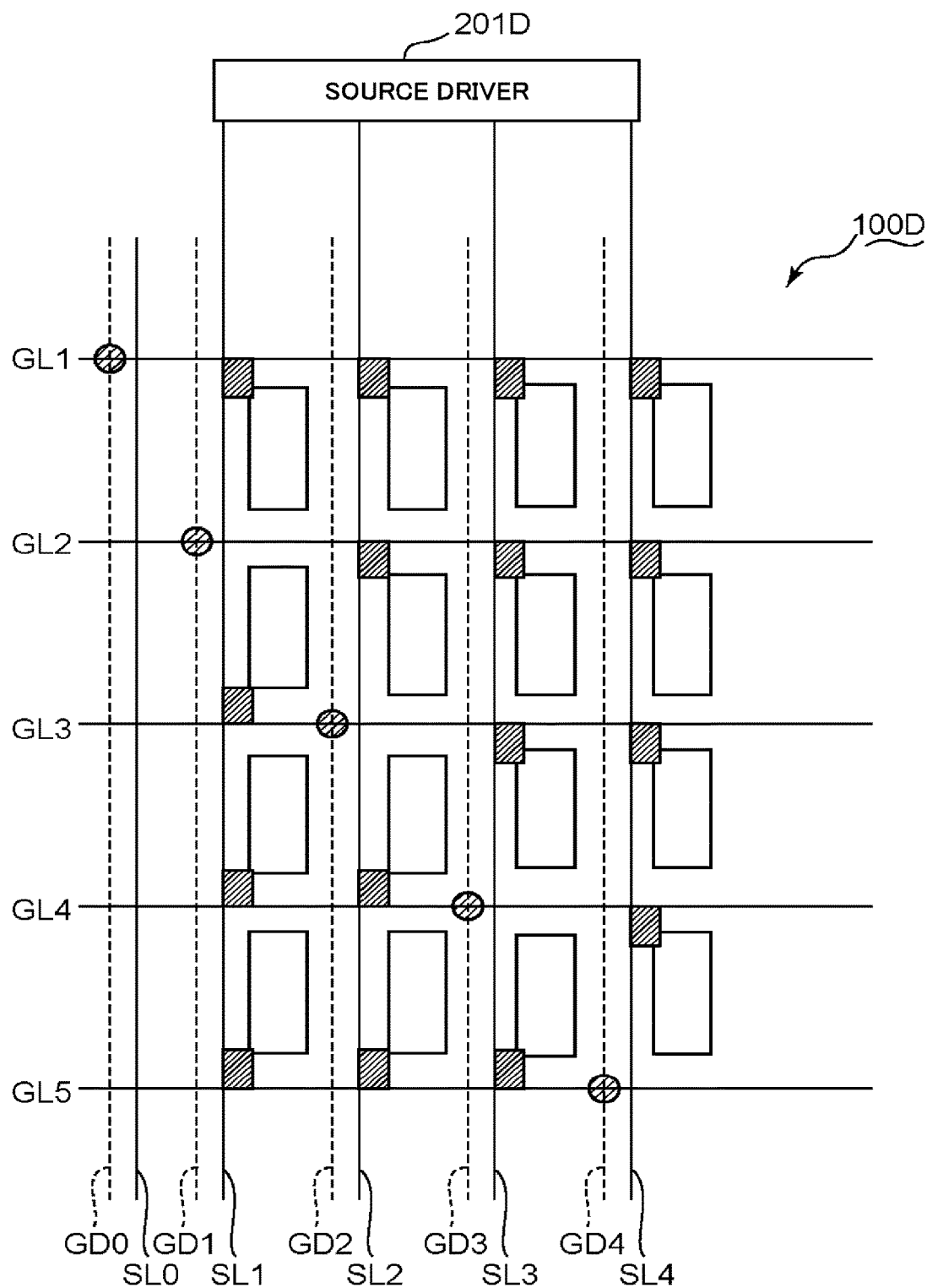
FIG. 34 is a schematic view of another exemplary display device.

FIG. 34 is a schematic view of a display device 100D in the ninth embodiment. With reference to FIG. 27 and FIG. 34, the display device 100D is described.

The display device 100D includes the gate lines GL1-GL5, the gate lead-out lines GD0-GD4 and the source lines SL0-SL4. The arrangement of the gate lines GL1-GL5, the gate lead-out lines GD0-GD4 and the source lines SL0-SL4 is designed based on the seventh embodiment (refer to FIG. 27). Thus, the description in the seventh embodiment is referred to the gate lines GL1-GL5, the gate lead-out lines GD0-GD4 and the source lines SL0-SL4 in this embodiment.

The display device 100D further includes a source driver 201D. The source driver 201D outputs not only source signals but also pulse signals which are synchronized with pulsatile gate signals. In this embodiment, the pulsatile gate signals output to the gate lines GL1-GL5 through gate lead-out lines GD0-GD4 are exemplified as gate pulse signals.

Figure 35:
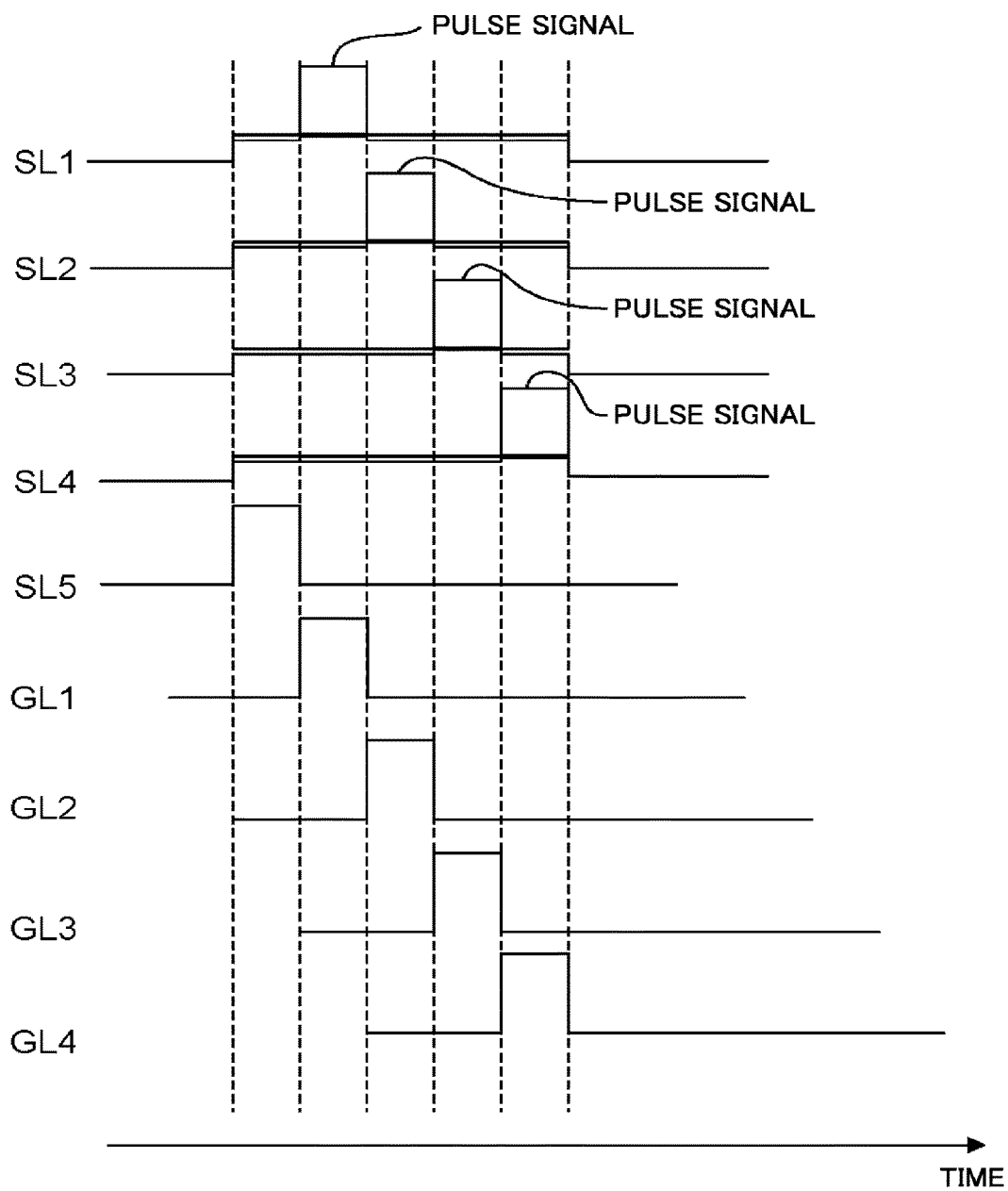
FIG. 35 is a timing chart indicating an output of pulse signals from a source driver.

FIG. 35 is a timing chart indicating an output of the pulse signals from a source driver 201D. With reference to FIG. 34 and FIG. 35, an output timing of the pulse signals from the source driver 201D is described.

The source driver 201D outputs pulse signals which are the substantial same wave pattern of gate signals. In synchronization with the output of the gate signals to the gate line GL2. A difference in electric potential between the source line SL1 and the gate lead-out line GD1 corresponding to the gate line GL2 decreases by pulse signals. As a result, the delay of gate signals supplied to the gate line GL2 becomes small.

The source driver 201D outputs pulse signals which are the substantial same wave pattern of gate signals. In synchronization with the output of gate signals to the gate line GL3. A difference in electric potential between the source line SL2 and the gate lead-out line GD2 corresponding to the gate line GL3 decreases by the pulse signals. As a result, the delay of gate signals supplied to the gate line GL3 becomes small.

The source driver 201D outputs the pulse signals which have the substantial same wave pattern as gate signals in synchronization with an output of the gate signals to the gate line GL4. A difference in electric potential between the source line SL3 and the gate lead-out line GD3 corresponding to the gate line GL4 decreases by the pulse signals. As a result, the delay of gate signals supplied to the gate line GL4 becomes small.

The above-mentioned switching control of resistance value barely affects a write of source signals under the principle described in the seventh embodiment. Thus, the principle in this embodiment is preferably available with the principle in the seventh embodiment. In this embodiment, one of the gate lead-out lines GD1-GD3 is exemplified as a first lead-out line. The other one of the gate lead-out lines GD1-GD3 is exemplified as second lead-out line.

Tenth Embodiment

The number of source lines may be formed more than that of gate lines as described in the third embodiment (refer to FIG. 20). When the number of gate lines is less than that of source lines, the number of gate lead-out lines which transmit gate signals to the gate lines is less than that of source lines. Because the source lines are formed along the gate lead-out lines in a region where the gate lead-out lines are formed, the conditional difference of the existence or non-existence of the gate lead-out lines causes unevenness in capacitance load against each source line. In this embodiment, techniques to reduce the unevenness in the capacitance load caused by the conditional difference of the existence or non-existence of the gate lead-out line are described.

Figure 36:
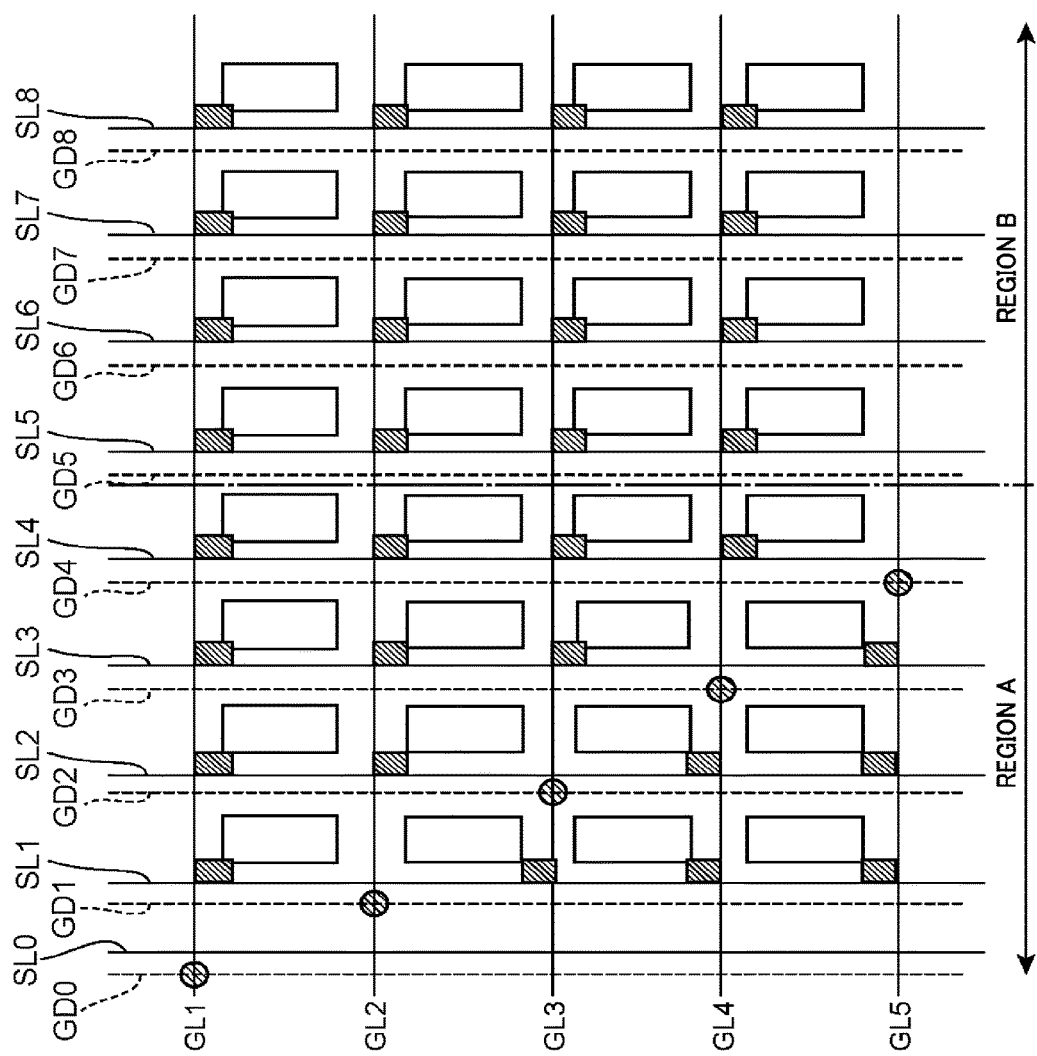
FIG. 36 is a schematic view indicating an arrangement of the gate lead-out lines, the gate lines and the source lines.

FIG. 36 is a schematic view indicating an arrangement of gate lead-out lines, gate lines and source lines. With reference to FIG. 8, FIG. 27 and FIG. 36, the arrangement of the gate lead-out lines, the gate lines and the source lines is described.

FIG. 36 shows a region A and a region B on the right side of the region A. A structure of the region A is the same as that shown in FIG. 27. The gate lines GL1-GL5 extend laterally not only in the region A but also in the region B. As described above with reference to FIG. 27, the gate lines GL1-GL5 receive gate signals through the gate lead-out lines GD0-GD4.

In the region B, the source lines SL5-SL8 and the gate lead-out lines GD5-GD8 are formed. Similar to the source lines SL1-SL4, source signals are output to the source lines SL5-SL8. Different from the gate lead-out line GD0-GD4, gate signals are not output to the gate lead-out line GD5-GD8. The gate lead-out lines GD0-GD8 are formed in the same step S110 as described with reference to FIG. 8. Thus, these gate lead-out lines GD0-GD8 are formed in the same layer. In this embodiment, each of the gate lead-out lines GD5-GD8 is exemplified as a dummy lead-out line.

In the step S150 described with reference to FIG. 8, the source line SL5 is formed along the gate lead-out line GD5. The source line SL6 is formed along the gate lead-out line GD6. The source line SL7 is formed along the gate lead-out line GD7. The source line SL8 is formed along the gate lead-out line GD8. Thus, a positional relationship between the gate lead-out lines GD5-GD8 and the source lines SL5-SL8 in the region B corresponds substantially to the positional relationship between the gate lead-out lines GD0-GD4 and source lines SL0-SL4 in the region A.

As mentioned above, as gate signals are not output to the gate lead-out lines GD5-GD8, the electric potential of the gate lead-out lines GD5-GD8 is kept substantially uniform. Because the gate lead-out lines GD5-GD8 are arranged close to the source lines SL5-SL8 respectively, the difference in capacitance load between the source lines SL5-SL8 and the source lines SL0-SL4 decreases. According to the principles in this embodiment, the unevenness in capacitance load becomes small, because a source line is formed overlapping with one of gate lead-out line and dummy lead-out line which gate signals are not output to.

Note that although in this embodiment all the source lines are formed along one of the gate lead-out lines and the dummy gate lead-out lines, it is not confined to these implementations. In other words, an effect of this embodiment can be achieved if at least some lines of source lines are formed along one of the gate lead-out lines and the dummy gate lead-out lines. Take one example, among all the source lines formed in the display area, every source line connected to the pixel corresponding to the color filter of one same hue (e.g., red) may be formed along one of the gate lead-out lines and the dummy gate lead-out lines, and the other source lines connected to the pixels corresponding to the color filter of the other hues (e.g., green and blue) may not be formed along one of the gate lead-out lines and the dummy gate lead-out lines. In this case, a difference in the capacitance load between the source lines connected to the pixels corresponding to the color filter of one hue and the source lines connected to the pixels corresponding to the color filter of the other hues may occur. However, an electric voltage applied to the source lines can be revised easily, if the difference in capacitance load among all the source lines connected to pixels corresponding to the color filter of the same hue becomes small.

Eleventh Embodiment

In above-mentioned various embodiments, the gate lines are formed after the forming process of the gate lead-out lines. However, the gate lines may be formed before the forming process of the gate lead-out lines.

Figure 37:
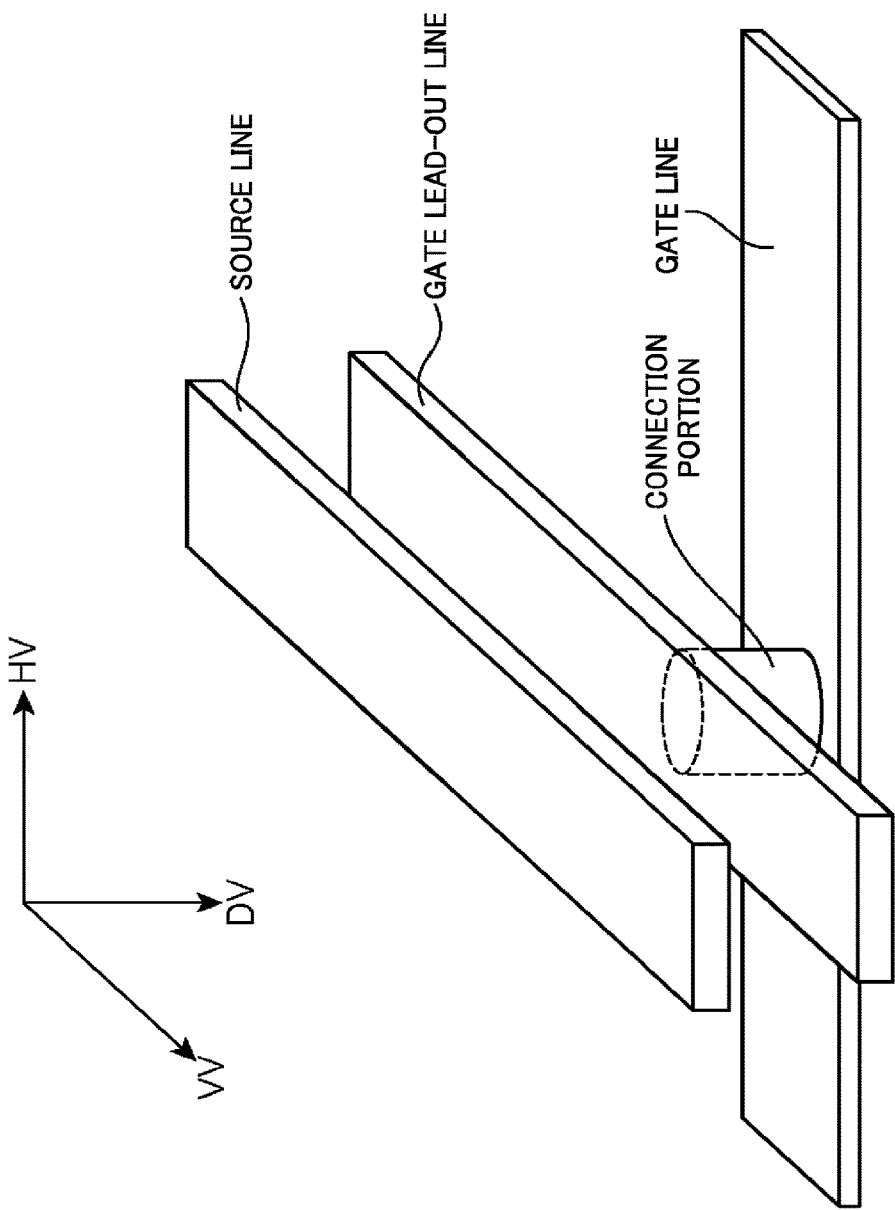
FIG. 37 is a schematic perspective view of the gate lead-out line, the gate line and the source line.

FIG. 37 is a schematic perspective view of a gate lead-out line, a gate line and a source line. With reference to FIG. 8 and FIG. 37, a positional relationship among the gate lead-out line, the gate line and the source line is described.

When the step S110 and the step S130 described with reference to FIG. 8 are replaced, the gate lead-out line is formed between the gate line and the source line. Similar to the above-mentioned various embodiments, the gate lead-out line is formed along the source line. The gate line extends substantially at a right angle to a direction in which the gate lead-out line and the source line extend.

Similar to the first embodiment, a connection portion is formed in a proper position between the gate line and the gate lead-out line. Because the gate line and the gate lead-out line are connected electrically, gate signals are transmitted properly through the gate lead-out line to the gate line.

As the principles in the eleventh embodiment clearly show, the principles in above-mentioned various embodiments are not limited to the forming process order of the gate lead-out line, the gate line and the source line at all. Thus, people who have ordinary skill in the art can make various changes based on the above-mentioned various disclosures. The changed display devices are also within the scope of the principle of this embodiment.

Twelfth Embodiment

In the fourth embodiment, techniques to reduce resistance in gate lines are described. The similar techniques to reduce resistance may be applied to the gate lead-out lines. In this embodiment, techniques to reduce resistance of the gate lead-out lines are described.

Figure 38:
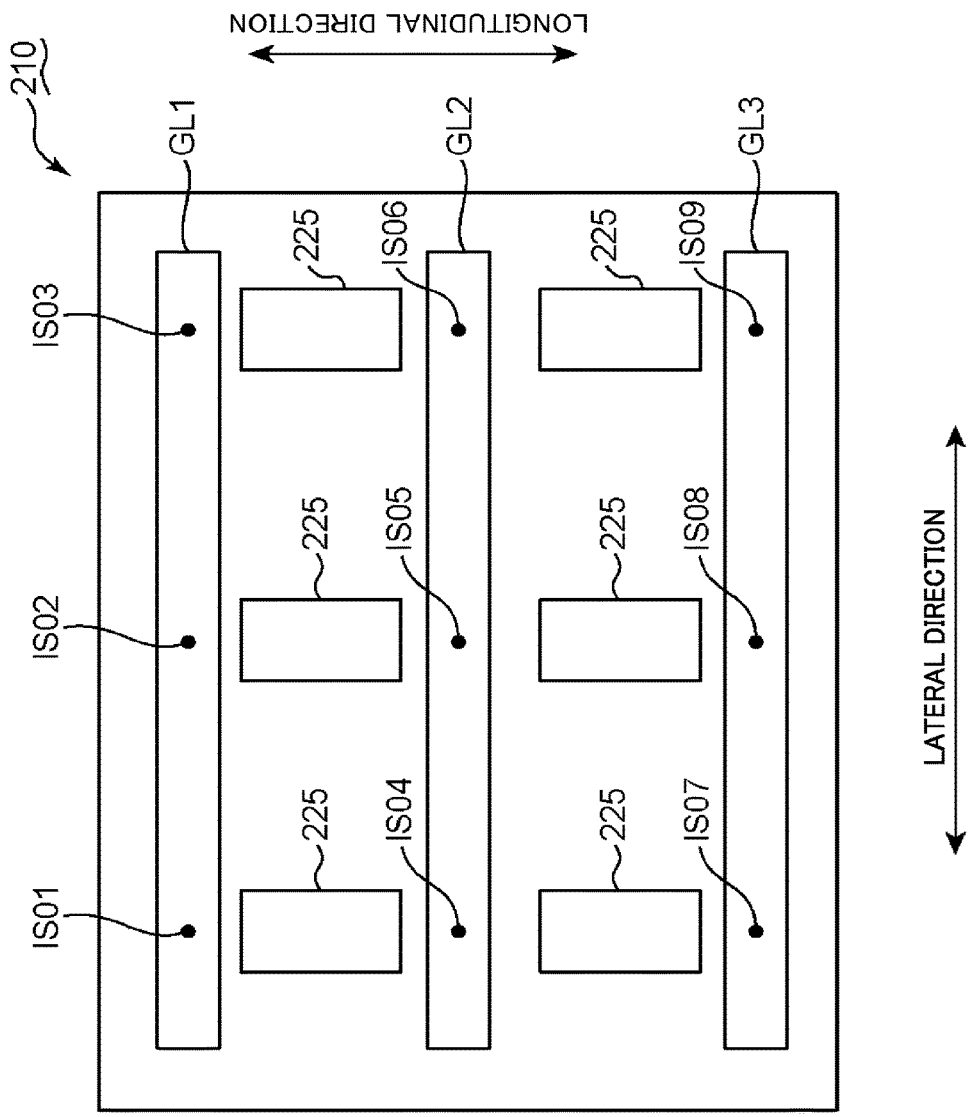
FIG. 38 is a schematic plan view of a substrate.

FIG. 38 is the schematic plan view of a substrate 210. With reference to FIG. 4 and FIG. 38, techniques to reduce resistance of the gate lead-out lines are described.

Based on the principles of the eleventh embodiment, gate lines GL1, GL2 and GL3 are formed on the substrate 210. Overlapping points IS01-IS09 described with reference to FIG. 4 are shown in FIG. 38. The overlapping points IS01-IS03 are arranged laterally in line. The overlapping points IS04-IS06 are arranged laterally in line. The overlapping points IS07-IS09 are arranged laterally in line. The overlapping points IS01, IS04 and IS07 are arranged longitudinally in line. The overlapping points IS02, IS05 and IS08 are arranged longitudinally in line. The overlapping point IS03, IS06 and IS09 are arranged longitudinally in line. The overlapping points IS01, IS05 and IS09 are selected as the jointing parts as shown in FIG. 4.

FIG. 38 shows six conductive areas 225 formed with gate lines GL1, GL2 and GL3 in one step. One of six conductive areas 225 extends between the overlapping point IS01 and S04. Another one of six conductive areas 225 extends between overlapping point IS04 and IS07. Another one of six conductive areas 225 extends between overlapping point IS02 and IS05. Another one of six conductive areas 225 extends between overlapping point IS05 and IS08. Another one of six conductive areas 225 extends between overlapping point IS03 and IS06. The other one of six conductive areas 225 extends between overlapping point IS06 and IS09. Each conductive area 225 functions as an assistant lead-out line to reduce resistance of the gate lead-out lines GD1, GD2 and GD3.

Figure 39:
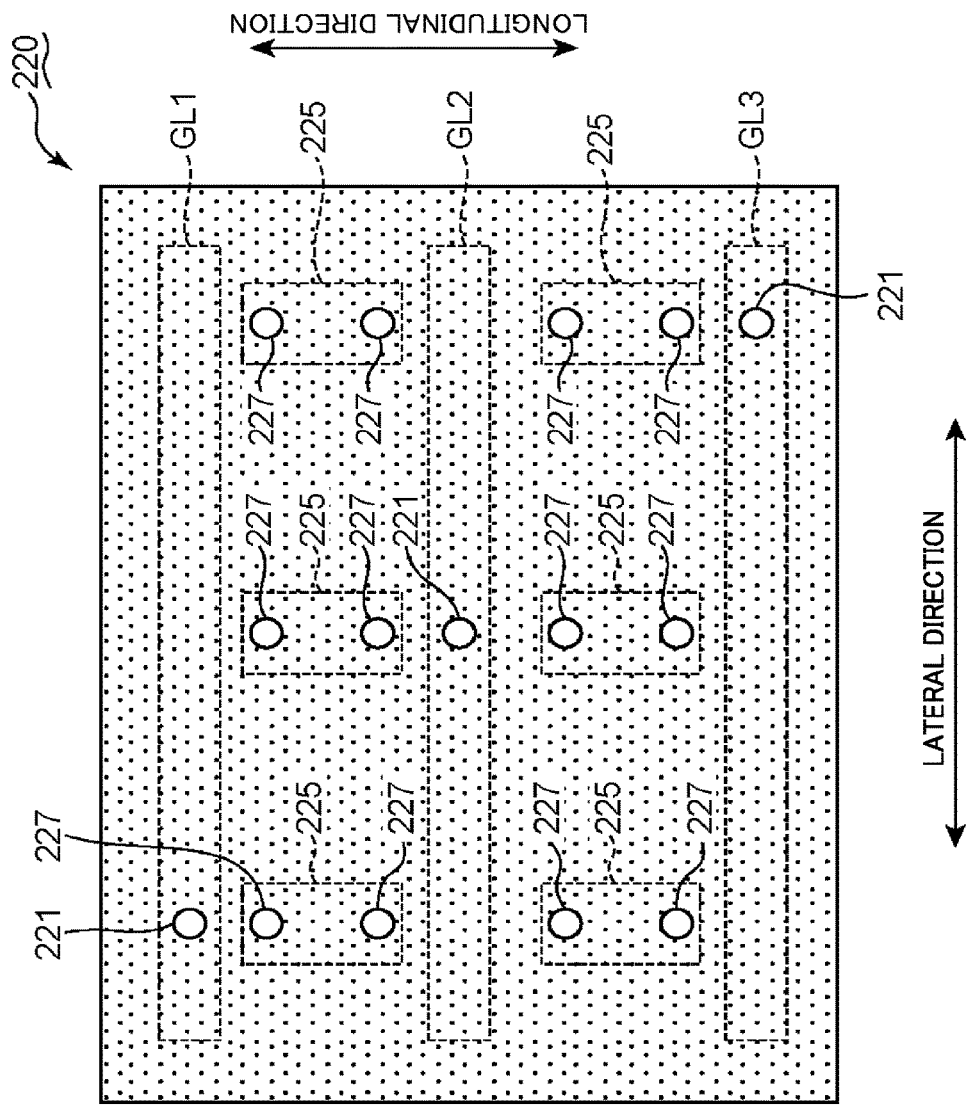
FIG. 39 is a schematic plan view of the first insulating film laminated on the substrate after the forming process of the gate lines and the conductive area.

FIG. 39 is a schematic plan view of the first insulating film 220 laminated on the substrate 210 after the forming process of the gate lines GL1, GL2, GL3 and the conductive areas 225. With reference to FIG. 4, FIG. 38 and FIG. 39, techniques to reduce resistance of the gate lead-out lines are further described.

Through-holes 221 are formed corresponding to the overlapping points IS01, IS05, IS09 selected as the jointing parts. Two through-holes 227 are arranged in line in every conductive area 225. The two through-holes 227 are arranged longitudinally in line.

Figure 40:
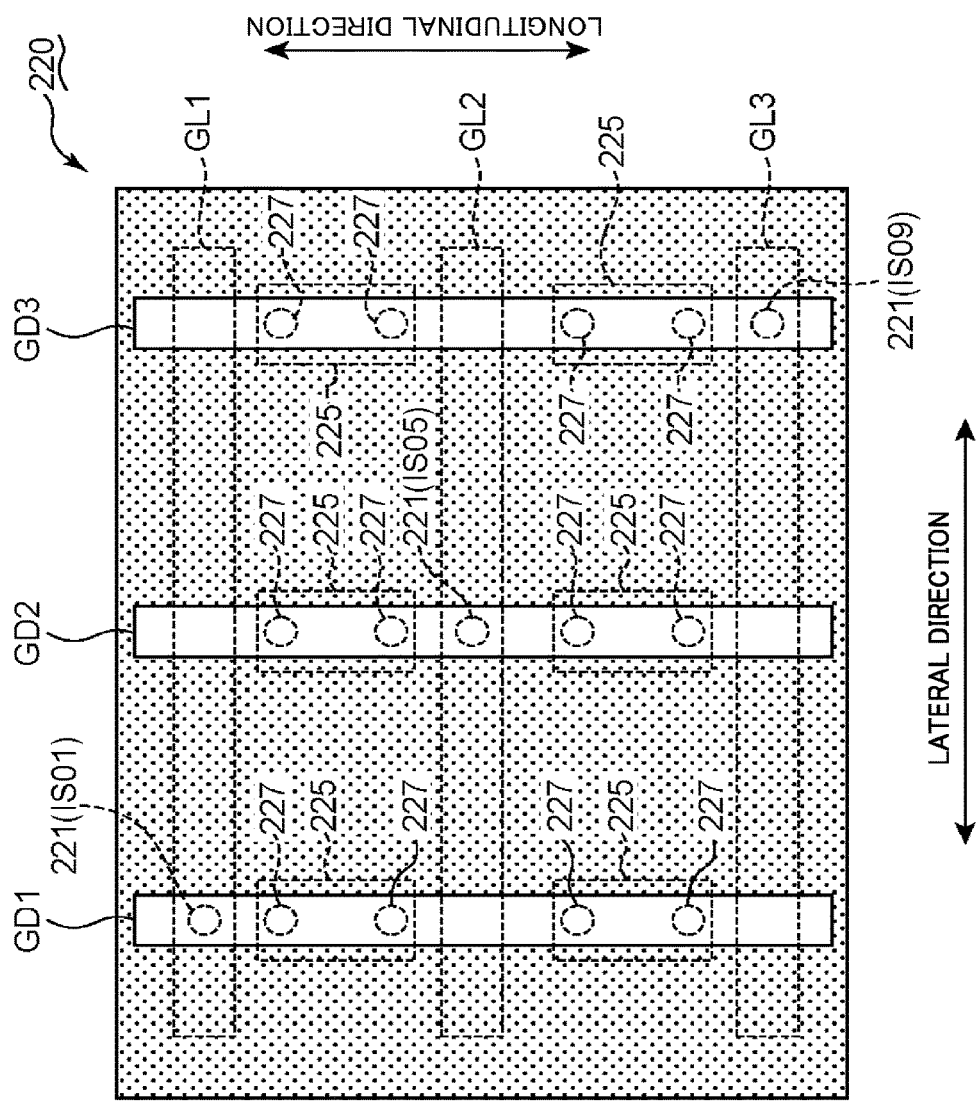
FIG. 40 is a schematic plan view of the first insulating film after a forming process of through-holes.

FIG. 40 is a schematic plan view of the first insulating film 220 after the forming process of through-holes 221, 227. With reference to FIG. 4 and FIG. 40, techniques to reduce resistance in gate lead-out lines are further described.

The gate lead-out lines GD1, GD2, GD3 extending longitudinally are laminated on the first insulating film 220. The Gate lead-out line GD1 is electrically connected to the gate line GL1 through the through-hole 221 formed corresponding to the overlapping point IS01. In addition, the gate lead-out line GD1 is electrically connected to the conductive area 225 through the through-holes 227 arranged longitudinally in line with the through-hole 221 formed corresponding to the overlapping point IS01. The gate lead-out line GD2 is electrically connected to the gate line GL2 through the through-hole 221 formed corresponding to the overlapping point IS05. In addition, the gate lead-out line GD2 is electrically connected to the conductive area 225 through the through-holes 227 arranged longitudinally in line with the through-holes 221 formed corresponding to the overlapping point IS05. The gate lead-out line GD3 is electrically connected to the gate line GL3 through the through-hole 221 formed corresponding to the overlapping point IS09. In addition, the gate lead-out line GD3 is electrically connected to the conductive area 225 through the through-holes 227 arranged longitudinally in line with the through-hole 221 formed corresponding to the overlapping point IS09.

Because the conductive areas 225 can enlarge sectional regions where gate signals pass through, resistance for gate signals decreases.

Thirteenth Embodiment

In the tenth embodiment, some parts of conductive lines formed in the step of the forming process of the gate lead-out lines are used as the gate lead-out lines, and the other parts are used as the dummy lead-out lines. Similarly, some parts of the conductive lines formed in the forming process of the gate lead-out lines may be used as the common lines.

Figure 41:
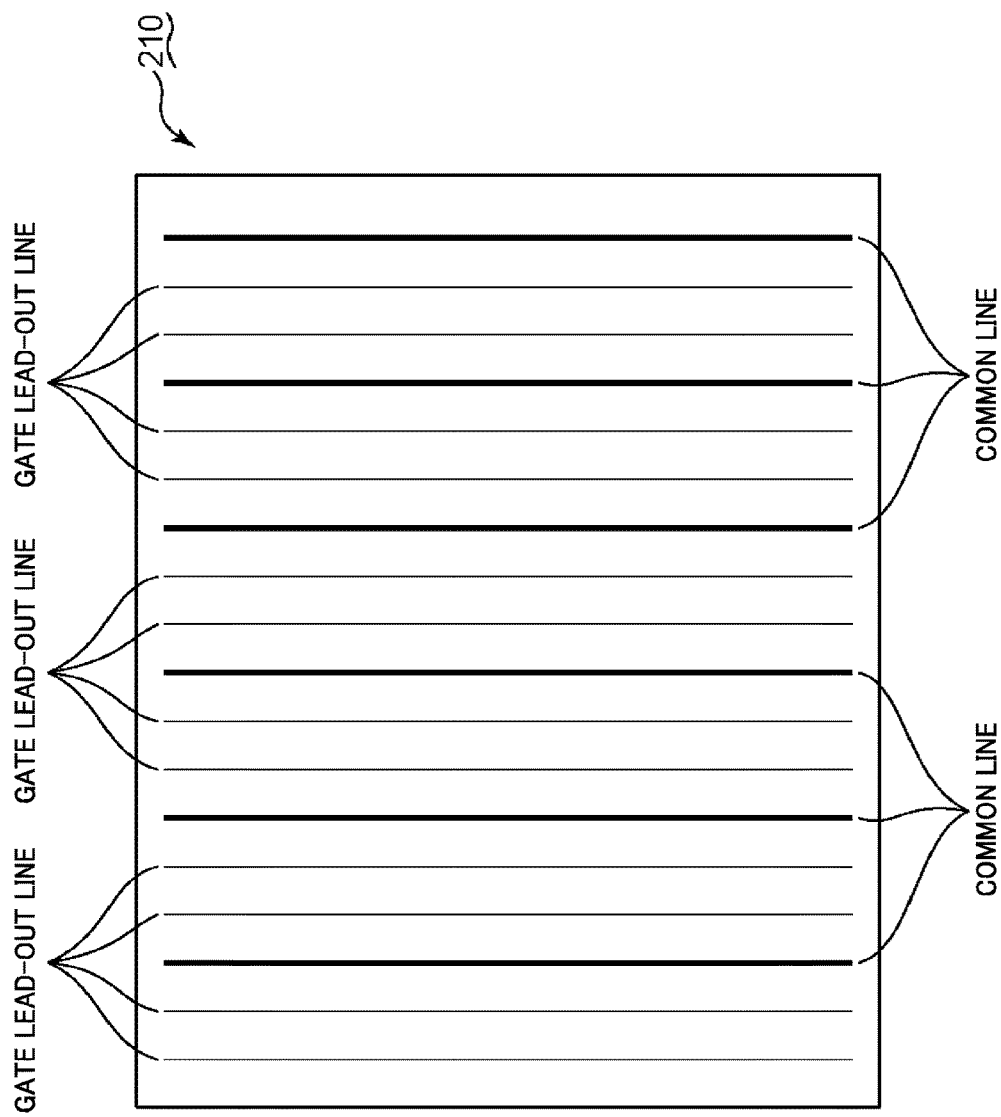
FIG. 41 is a schematic plan view of the substrate.

FIG. 41 is a schematic plan view of the substrate 210. With reference to FIG. 41, the common lines formed in the step of the forming process of the gate lead-out lines are described.

The conductive lines are formed on the substrate 210. Some lines of the conductive lines are used as the gate lead-out lines. The other lines of the conductive lines are used as the common lines.

Figure 42:
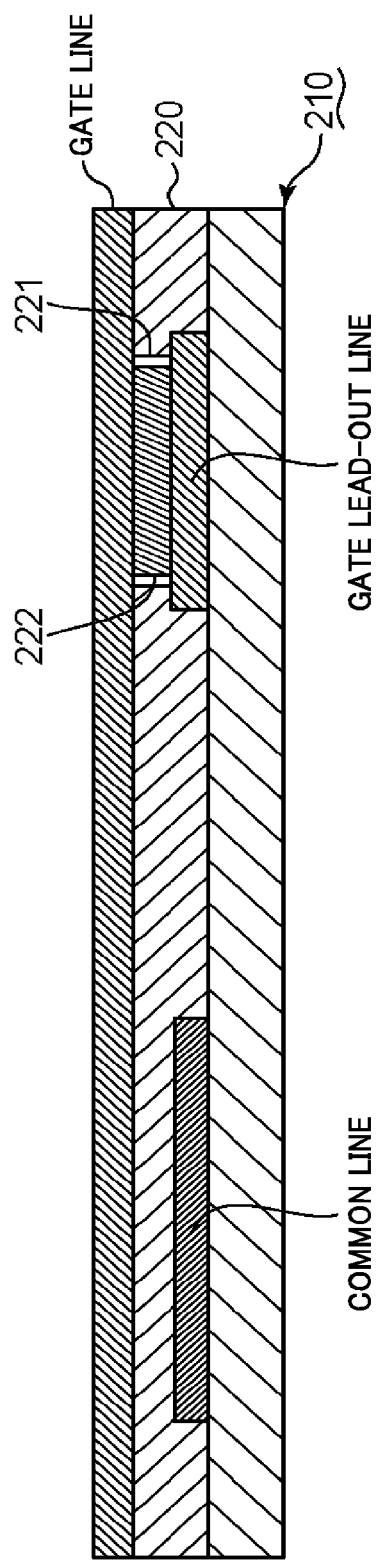
FIG. 42 is a schematic cross section of the substrate along a gate line.

FIG. 42 is a schematic cross section of the substrate 210 along a gate line. With reference to FIGS. 41 and 42, the common lines formed in a step of the forming process of the gate lead-out lines are described.

After the common lines and the gate lead-out lines are formed on substrate 210, a first insulating film 220 is laminated over the substrate 210, the common lines and the gate lead-out lines. Subsequently through-holes 221 are formed in the first insulating film 220 corresponding to the gate lead-out lines. Subsequently, the gate lines are laminated on the first insulating film 220 to overlap with the through-holes 221. As a result, connection portions 222 where the gate lead-out lines and the gate lines are electrically connected are formed.

Figure 43:
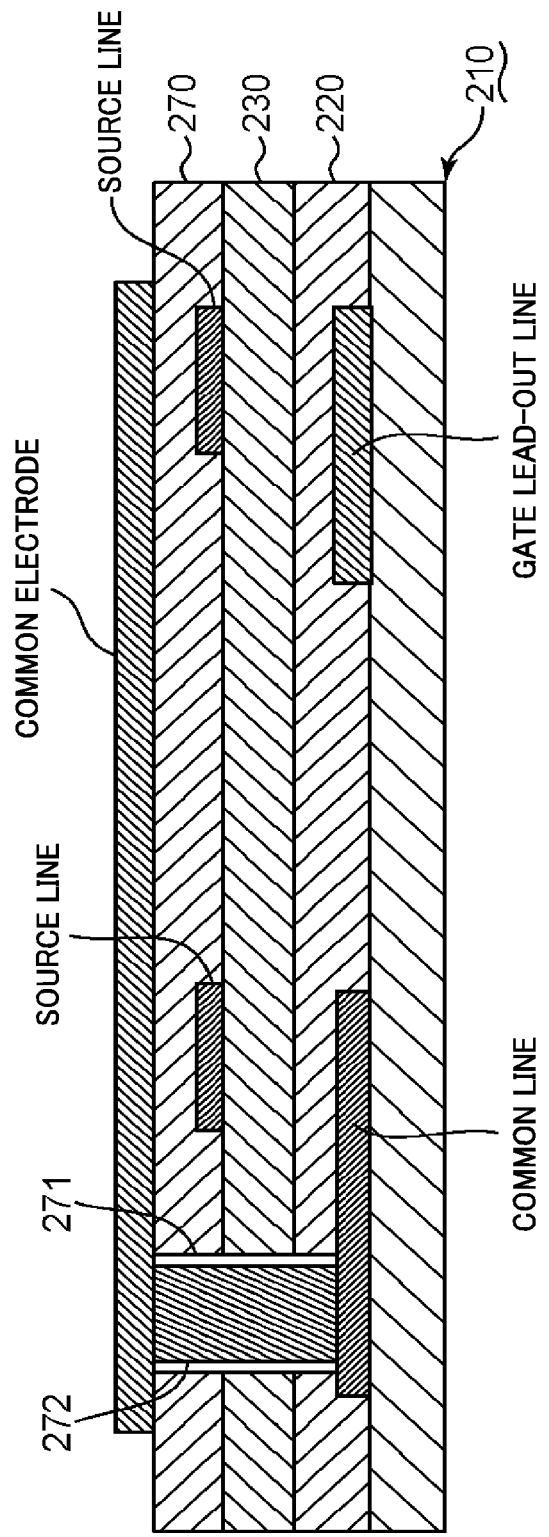
FIG. 43 is a schematic cross section of the substrate at a position which is spaced apart from the gate line.

FIG. 43 is a schematic cross section of the substrate in the position which is spaced apart from the gate line. With reference to FIG. 42 and FIG. 43, connection between a common line and a common electrode is described.

After the forming process of a gate line, a second insulating film 230 is laminated on the gate line and the first insulating film 220. Subsequently, the source line is laminated on the second insulating film 230. After laminating of the source line, a third insulating film 270 is laminated on the source line and the second insulating film 230. As a result, the source line is covered by the third insulating film 270.

After the forming process of the third insulating film 270, a through-hole 271 is formed. The through-hole 271 passes through the third insulating film 270, the second insulating film 230 and the first insulating film 220 and reaches the common line.

After the forming process of the through-holes 271, a common electrode is laminated on the third insulating film 270. The shape of the common electrode is designed to overlap the through-hole 271. As a result, conductive material used for the common electrode flows into the through-hole 271 and forms a common connecting part 272 passing through the third insulating film 270, the second insulating film 230 and the first insulating film 220. The common connecting part 272 electrically connects the common line and the common electrode. FIG. 43 shows one through-hole 271, one common connecting part 272 and one common electrode. However, a display device may have many through-holes 271, many common connecting parts 272 and many common electrodes.

Exemplary display devices described with the above various embodiments mainly include following configurations.

In one general aspect, the instant application describes a display device for displaying an image in a display area in accordance with image signals. The display device includes a plurality of gate lines extending in a first direction on the display area, a plurality of source lines extending in a second direction which is different from the first direction, a plurality of lead-out lines extending in the second direction for transmitting gate signals to the plurality of gate lines, a first insulating layer formed between the plurality of lead-out lines and the plurality of gate lines and a plurality of connecting portions each electrically connecting one of the plurality of gate lines to one of the plurality of lead-out lines. The plurality of connecting portions pass through the first insulating layer at a plurality of jointing points. The jointing points are selected among a plurality of overlapping points where the plurality of lead-out lines and the plurality of gate lines overlap in a plane area. The plane area is defined by the first direction and the second direction.

According to the foregoing configuration, the plurality of gate lines extend in a first direction on the display area, while a plurality of source lines extend in a second direction which is different from the first direction. The plurality of lead-out lines transmit gate signals to the plurality of gate lines. Because, similar to source lines, the plurality of lead-out lines extend in the second direction for transmitting gate signals to the plurality of gate lines, the number of electric elements arranged around ends of the gate lines decreases. Thus, when a display area of a display device is designed long in a first direction, an overall size of the display device can be designed small.

The first insulating film can insulate the plurality lead-out lines from the plurality of gate lines properly. Thus, gate signals are unlikely to be transmitted to the plurality of gate lines needlessly.

The plurality of jointing points are selected among a plurality of overlapping points where the plurality of lead-out lines and the plurality of gate lines overlap in the plane area defined by the first direction and the second direction. Because the plurality of connecting portions each formed in each of the plurality of jointing points passes through the first insulating layer and is connected between one of the plurality of lead-out lines and one of the plurality of gate lines, gate signals are transmitted to the plurality of gate lines via the plurality of connecting portions.

The above general aspect may include one or more of the following features. The display device may further include a second insulating layer. The first insulating layer may be laminated on the plurality of lead-out lines. The plurality of gate lines may be formed on the first insulating layer. The second insulating layer may be laminated on the plurality of gate lines. The plurality of source lines may be formed on the second insulating layer.

According to the foregoing configuration, the plurality of source lines are arranged apart from the plurality of lead-out lines. Therefore, a capacitance load for the plurality of source lines decreases.

The display device may further include a second insulating layer. The first insulating layer may be laminated on the plurality of gate lines. The plurality of lead-out lines may be formed on the first insulating layer. The second insulating layer may be laminated on the plurality of lead-out lines. The plurality of source lines may be formed on the second insulating layer.

According to the foregoing configuration, the plurality of source lines are arranged apart from the plurality of lead-out lines. Therefore, a capacitance load for the plurality of source lines decreases.

The plurality of overlapping points may include a first overlapping point and a second overlapping point. The second overlapping point neighbors to the first overlapping point in the second direction. A sum of thicknesses of the first insulting layer and the second insulting layer at the first overlapping point may be larger than a sum of the thicknesses of the first insulting layer and the second insulting layer between the first overlapping point and the second overlapping point.

According to the foregoing configuration, a region where a plurality of lead-out lines are formed is unlikely to rise excessively higher than the other regions. Thus, a display device is easy to be processed.

The display device may further include a plurality of pixel electrodes arranged in a plurality of pixel regions. The plurality of pixel regions are defined by a set of the plurality of gate lines and a set of the plurality of source lines. A common electrode counters the plurality of pixel electrodes. A plurality of common lines provide a common voltage to the common electrode. A number of the plurality of source lines may be larger than a number of the plurality of lead-out lines. The plurality of source lines may include at least one source line extending along one of the plurality of lead-out lines and at least one source line extending along one of the plurality of common lines.

According to the foregoing configuration, because a number of the plurality of source lines is larger than a number of the plurality of lead-out lines, the plurality of common lines which are arranged spaced apart from each other in the first direction are unlikely to interfere with the plurality of lead-out lines. Because the plurality of source lines may include at least one source line extending along one of the plurality of lead-out lines and at least one source line extending along one of the plurality of common lines, an excessively thick region is unlikely to occur. Thus, a display device is easy to be processed.

The display area may be equally divided into a first area, a second area and a third area arranged in the first direction. The second area may be arranged between the first area and the third area. A number of the plurality of connecting portions in the second area may be larger than a number of the plurality of connecting portions in the first area or in the third area.

According to the foregoing configuration, because a number of the plurality of connecting portions in the second area is larger than a number of the plurality of connecting portions in the first area or in the third area, gate signals are transmitted from the plurality of lead-out lines to the plurality of gate lines properly.

The display device may further include at least one assistant gate line extending in the first direction. The plurality of overlapping points may include the first overlapping point and a third overlapping point. The third overlapping point neighbors to the first overlapping point in the first direction. The plurality of gate lines may include at least one gate line electrically connecting to the at least one assistant gate line between the first overlapping point and the third overlapping point.

According to the foregoing configuration, because the plurality of gate lines include at least one gate line electrically connecting to the at least one assistant gate line between the first overlapping point and the third overlapping point, a resistance of the gate line decreases between the first overlapping point and the third overlapping point.

The plurality of connecting portions may include a first connecting portion, a second connecting portion being different from the first connecting portion, and a third connecting portion being different from the first connecting portion and the second connecting portion. A bearing angle between a first line and a second line may be other than zero or 180 degrees. The first line extends between the first connecting portion and the second connecting portion. The second line extends between the first connecting portion and the third connecting portion.

According to the foregoing configuration, because a bearing angle between a first line and a second line may be other than zero or 180 degrees, the first line extending between the first connecting portion and the second connecting portion, and the second line extending between the first connecting portion and the third connecting portion, the first connecting portion, the second connecting portion and the third connecting portion are not arranged in a line. Thus, viewers who view images displayed in the display area are unlikely to conceive potential drawbacks affected by the first connecting portion, the second connecting portion and the third connecting portion.

The display device further includes a plurality of pixel electrodes arranged in a plurality of pixel regions defined by a set of the plurality of gate lines and a set of the plurality of source lines, and a plurality of thin film transistors (TFTs) for transmitting image signals to the plurality of pixel electrodes. The plurality of pixel regions may include a first pixel region, a second pixel region neighboring to the first pixel region in the first direction, a third pixel region neighboring to the second pixel region in the second direction, and a fourth pixel region neighboring to both the first pixel region and the third pixel region. The plurality of lead-out lines may include a first lead-out line extending between the first pixel region and the second pixel region, and between the third pixel region and the fourth pixel region. The plurality of connecting portions may include a first connecting portion surrounded by the first pixel region, the second pixel region, the third pixel region and the fourth pixel region. The plurality of gate lines may include a first gate line connected to the first lead-out line at the first connecting portion, a second gate line extending along the first pixel region and the second pixel region, and a third gate line extending along the third pixel region and the fourth pixel region. The plurality of source lines may include a first source line extending along the first lead-out line, a second source line extending along the first pixel region and the fourth pixel region, and a third source line extending along the second pixel region and the third pixel region. The plurality of pixel electrodes may include a first pixel electrode arranged in the first pixel region, a second pixel electrode arranged in the second pixel region, a third pixel electrode arranged in the third pixel region, and a fourth pixel electrode arranged in the fourth pixel region. The plurality of TFTs may include a first TFT for transmitting image signals to the first pixel electrode, a second TFT for transmitting image signals to the second pixel electrode, a third TFT for transmitting image signals to the third pixel electrode, and a fourth TFT for transmitting image signals to the fourth pixel electrode. The first TFT is electrically connected to one of a first pair including the first gate line and the second source line, a second pair including the second gate line and the second source line and a third pair including the second gate line and the first source line. The second TFT is electrically connected to one of the third pair, a fourth pair including the second gate line and the third source line and a fifth pair including the first gate line and the third source line. The third TFT is electrically connected to one of the fifth pair, a sixth pair including the third gate line and the third source line and a seventh pair including the third gate line and the first source line. The fourth TFT is electrically connected to one of the first pair, the seventh pair and an eighth pair including the third gate line and the second source line.

According to the foregoing configuration, because the first to eighth pairs do not include a pair including the first source line along the first lead-out line and the first gate line connected to the first lead-out line, the first to fourth pixel electrodes are able to receive image signals with little effect caused by an output of gate signals from the first lead-out line to the first gate line.

The second TFT may be electrically connected to the fourth pair or the fifth pair, when the first TFT is electrically connected to the third pair. The third TFT may be electrically connected to the sixth pair or the seventh pair, when the second TFT is electrically connected to the fifth pair. The fourth TFT may be electrically connected to the seventh pair or the eighth pair, when the first TFT is electrically connected to the first pair. The fourth TFT may be electrically connected to the first pair or the eighth pair, when the third TFT is electrically connected to the seventh pair.

According to the foregoing configuration, because the first to fourth pixel electrodes are connected to different pairs from each other, image signals are input to the first to fourth pixel electrodes properly.

The display device may further include an adjusting portion for adjusting a resistance for source signals being emitted as image signals in the plurality of source lines from a first resistance value to a second resistance value. The second resistance may be lower than the first resistance value. The plurality of lead-out lines may include a second lead-out line which is different from the first lead-out line. The adjusting portion may set the resistance for the first source line to the first resistance value when gate signals are emitted to the first lead-out line. The adjusting portion may set the resistance for the first source line to the second resistance value when a gate signals is emitted to the second lead-out line.

According to the foregoing configuration, because the adjusting portion sets the resistance for source signals in accordance with on or off of an output of gate signals to the first lead-out line, a delay of gate signals can be reduced.

The display device may further include a source driver for emitting source signals to the plurality of source lines as image signals. Gate signals may include gate pulse signals emitted to the first lead-out line. The source driver may emit pulse signals to the first lead-out line in synchronization with the gate pulse signals emitted to the first lead-out line so as to reduce a fluctuation of a gap in voltage between the first lead-out line and the first source line.

According to the foregoing configuration, because the source driver emits pulse signals to the first lead-out line in synchronization with the gate pulse signals emitted to the first lead-out line so as to reduce a fluctuation of a gap in voltage between the first lead-out line and the first source line, a delay of gate signals output as pulse signals can be reduced.

The display device may further include a plurality of dummy lead-out lines extending in the second direction formed on a same layer as the plurality of lead-out lines. The plurality of source lines may include at least one source line extending along one of the plurality of lead-out lines and at least one source line extending along one of the dummy lead-out lines. The plurality of the dummy lines may be set to a predetermined voltage level.

According to the foregoing configuration, the dummy lead-out line can reduce unevenness of a capacitance load.

The display device may further include a dummy source line extending in the second direction on a same layer as the plurality of source lines. The dummy source line may be formed along one of the plurality of lead-out lines. The dummy source line is set to a predetermined voltage.

According to the foregoing configuration, the dummy source line can reduce unevenness of a capacitance load.

The display device may further include a third insulating layer covering the plurality of source lines, and a plurality of common connecting parts passing through the first insulating layer, the second insulating layer and the third insulating layer. The common electrode may be laminated on the third insulating layer. The plurality of common connecting parts may electrically connect the common electrode to the plurality of common lines.

According to the foregoing configuration, because the common electrode laminated on the third insulating layer is connected to common lines through a plurality of common connecting parts passing through the first insulating layer, the second insulating layer and the third insulating layer, an electrical connection between the common electrode and the plurality of common connecting parts is easily formed.

The display device may further include at least one assistance lead-out line extending in the second direction. The plurality of overlapping points may include a first overlapping point and a second overlapping point neighboring to the first overlapping point in the second direction. The plurality of lead-out lines may include at least one lead-out line connected to the at least one assistance lead-out line between the first overlapping point and the second overlapping point.

According to the foregoing configuration, because at least one lead-out line is connected to at least one assistance lead-out line between the first overlapping point and the second overlapping point, a resistance of the lead-out line between the first overlapping point and the second overlapping point can be reduced.

The display device may further include a plurality of pixel electrodes arranged in a plurality of pixel regions defined by the plurality of gate lines and the plurality of source lines and a plurality of thin film transistors (TFTs) for emitting source signals to the plurality of pixel electrodes. The plurality of TFTs may be electrically connected to the plurality of source lines at positions that are different from positions where the connecting portions are located.

According to the foregoing configuration, because the plurality of TFTs are electrically connected to the plurality of source lines at positions that are different from positions where the connecting portions are located, the plurality of pixel electrodes can receive image signals with little effect caused by an output of gate signals.

It is suitable for a display device for displaying a picture, and the principle of this embodiment is available.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

As used herein, the phrase "at least one of" preceding a series of items, with the term "and" or "or" to separate any of the items, modifies the list as a whole, rather than each member of the list (e.g., each item). The phrase "at least one of" does not require selection of at least one of each item listed; rather, the phrase allows a meaning that includes at least one of any one of the items, and/or at least one of any combination of the items, and/or at least one of each of the items. By way of example, the phrases "at least one of A, B, and C" or "at least one of A, B, or C" each refer to only A, only B, or only C; any combination of A, B, and C; and/or at least one of each of A, B, and C.

Phrases such as an aspect, the aspect, another aspect, some aspects, one or more aspects, an implementation, the implementation, another implementation, some implementations, one or more implementations, an embodiment, the embodiment, another embodiment, some embodiments, one or more embodiments, a configuration, the configuration, another configuration, some configurations, one or more configurations, the subject technology, the disclosure, the present disclosure, other variations thereof and alike are for convenience and do not imply that a disclosure relating to such phrase(s) is essential to the subject technology or that such disclosure applies to all configurations of the subject technology. A disclosure relating to such phrase(s) may apply to all configurations, or one or more configurations. A disclosure relating to such phrase(s) may provide one or more examples. A phrase such as an aspect or some aspects may refer to one or more aspects and vice versa, and this applies similarly to other foregoing phrases.

The word "exemplary" is used herein to mean "serving as an example, instance, or illustration." Any embodiment described herein as "exemplary" or as an "example" is not necessarily to be construed as preferred or advantageous over other embodiments. Furthermore, to the extent that the term "include," "have," or the like is used in the description or the claims, such term is intended to be inclusive in a manner similar to the term "comprise" as "comprise" is interpreted when employed as a transitional word in a claim.

All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. § 112(f), unless the element is expressly recited using the phrase "means for" or, in the case of a method claim, the element is recited using the phrase "step for."

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but are to be accorded the full scope consistent with the language claims, wherein reference to an element in the singular is not intended to mean "one and only one" unless specifically so stated, but rather "one or more." Unless specifically stated otherwise, the term "some" refers to one or more. Pronouns in the masculine (e.g., his) include the feminine and neuter gender (e.g., her and its) and vice versa. Headings and subheadings, if any, are used for convenience only and do not limit the subject disclosure.

What is claimed is:

1. A display device for displaying an image in a display area in accordance with image signals, the display device comprising:
   a plurality of gate lines extending in a first direction on the display area;
   a plurality of source lines extending in a second direction which is different from the first direction;
   a plurality of lead-out lines extending in the second direction and for transmitting gate signals to the plurality of gate lines; and
   a plurality of common lines extending in the second direction for providing a common voltage to a common electrode,
   wherein a number of the plurality of source lines is larger than a number of the plurality of lead-out lines, and the plurality of source lines include a first source line extending along one of the plurality of lead-out lines, and a second source line extending along one of the plurality of common lines.

2. The display device according to claim 1, further comprising a first insulating layer formed between the plurality of lead-out lines and the plurality of gate lines; and a plurality of connecting portions each electrically connecting one of the plurality of gate lines to one of the plurality of lead-out lines.

3. The display device according to claim 1, wherein each of the plurality of source lines extending along either one of the plurality of lead-out lines or one of the plurality of common lines.

4. The display device according to claim 1, wherein the plurality of common lines include a first common line, a second common line and a third common line, the first common line, the second common line and the third common line arranged adjacent to each other in this order, a number of the plurality of lead-out lines formed between the first common line and the second common line is the same as the number of the plurality of lead-out lines formed between the second common line and the third common line.

5. The display device according to claim 1, wherein the plurality of common lines and the plurality of lead-out lines are formed in the same layer.

6. The display device according to claim 5, further comprising:

a second insulating layer formed between the plurality of source lines and the plurality of common lines; and a third insulating layer formed between the plurality of source lines and the common electrode, wherein the plurality of common lines provide the common voltage to the common electrode via a through hole formed in the second insulating layer and the third insulating layer.

* * * * *